(12) United States Patent
Kagaya et al.

(10) Patent No.: US 10,116,116 B2
(45) Date of Patent: Oct. 30, 2018

(54) PRINTED CIRCUIT BOARD AND OPTICAL MODULE

(71) Applicant: Oclaro Japan, Inc., Sagamihara, Kanagawa (JP)

(72) Inventors: Osamu Kagaya, Tokyo (JP); Koyu Takahashi, Kanagawa (JP); Hiroyoshi Ishii, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 2 days.

(21) Appl. No.: 15/585,511

(22) Filed: May 3, 2017

(65) Prior Publication Data
US 2017/0331250 A1 Nov. 16, 2017

(30) Foreign Application Priority Data

May 13, 2016 (JP) ................................. 2016-096791

(51) Int. Cl.
| | |
|---|---|
| *H01S 5/022* | (2006.01) |
| *H01S 5/042* | (2006.01) |
| *H01P 3/08* | (2006.01) |
| *H05K 1/02* | (2006.01) |
| *H05K 1/11* | (2006.01) |
| *H05K 1/18* | (2006.01) |

(Continued)

(52) U.S. Cl.
CPC .......... *H01S 5/02248* (2013.01); *H01P 3/026* (2013.01); *H01P 3/081* (2013.01); *H01P 5/04* (2013.01); *H01S 5/0427* (2013.01); *H05K 1/0245* (2013.01); *H05K 1/115* (2013.01); *H05K 1/181* (2013.01); *H05K 2201/10121* (2013.01)

(58) Field of Classification Search
CPC .... H01S 5/02248; H01S 5/0427; H01P 3/026; H01P 3/081; H01P 5/04; H05K 1/0245; H05K 1/115; H05K 1/181
USPC ........................................................ 174/260
See application file for complete search history.

(56) References Cited

U.S. PATENT DOCUMENTS

| | | | |
|---|---|---|---|
| 9,112,252 B2* | 8/2015 | Kagaya | ..................... H01P 1/02 |
| 2017/0012595 A1* | 1/2017 | Chiu | .................... H03H 7/0115 |

FOREIGN PATENT DOCUMENTS

| | | |
|---|---|---|
| JP | 2004-014800 A | 1/2004 |
| JP | 2005-277028 A | 10/2005 |

(Continued)

*Primary Examiner* — Timothy Thompson
*Assistant Examiner* — Charles Pizzuto
(74) *Attorney, Agent, or Firm* — Mattingly & Malur, PC

(57) ABSTRACT

Provided are a printed circuit board configured to achieve reduction in impedance of a differential transmission line extending in a stacking direction, and an optical module. The printed circuit board includes a stacking-direction differential transmission line extending in the stacking direction, including: a differential signal via pair including a first signal via and a second signal via; and a plurality of conductor plate pairs each including a first conductor plate expanding outward from the first signal via, and a second conductor plate expanding outward from the second signal via. With respect to a perpendicular bisector of a center-of-gravity line segment connecting centers of gravity of the first and second signal vias, in each of the plurality of conductor plate pairs, centers of gravity of contours of the first and second conductor plates are located on inner sides of the centers of gravity.

12 Claims, 47 Drawing Sheets

(51) Int. Cl.
*H01P 3/02* (2006.01)
*H01P 5/04* (2006.01)

(56) References Cited

FOREIGN PATENT DOCUMENTS

| | | |
|---|---|---|
| JP | 2009-212400 A | 9/2009 |
| JP | 2015-056719 A | 3/2015 |

* cited by examiner

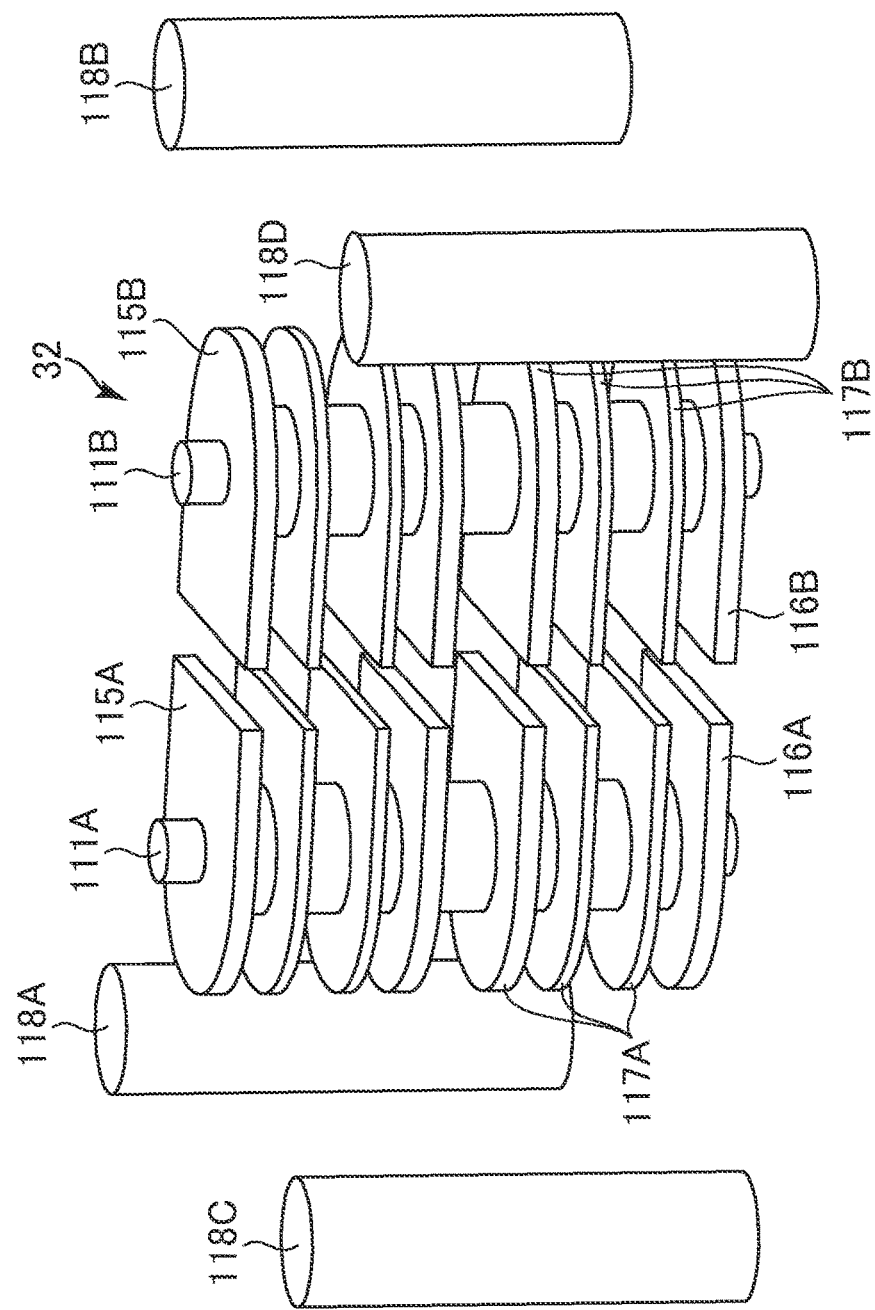

PRINTED CIRCUIT BOARD AND OPTICAL MODULE

CROSS-REFERENCE TO RELATED APPLICATION

The present application claims priority from Japanese application JP 2016-096791, filed on May 13, 2016, the content of which is hereby incorporated by reference into this application.

BACKGROUND OF THE INVENTION

1. Field of the Invention

The present invention relates to a printed circuit board and an optical module, and more particularly, to suppression of the differential impedance of a differential transmission line arranged on a printed circuit board.

2. Description of the Related Art

A transmission line is formed on a printed circuit board, and electric signals (e.g., serial data signals) are transmitted with the use of the transmission line. Examples of the transmission line include a micro strip line. When a differential transmission line is achieved with a micro strip line, the micro strip line includes a ground conductor layer and a pair of strip conductor layers arranged via a dielectric layer. The micro strip line can be formed on the surface of a printed circuit board. In a case of a printed circuit board having a multi-layer structure in which a plurality of wiring layers are formed via respective dielectric layers, a micro strip line can be formed on each of the upper surface and the lower surface of the printed circuit board. In order to reduce the size of a device on which a printed circuit board is mounted, it is required for electric parts to be mounted on the printed circuit board with high density. Accordingly, there has been an increased demand for a structure in which a micro strip line is formed, as a differential transmission line, on each of the upper surface and the lower surface of a printed circuit board having a multi-layer structure, and the micro strip lines extend in the printed circuit board in a stacking direction for connection.

The structure in which the micro strip lines formed on the upper surface and the lower surface of the printed circuit board are connected to each other includes a differential via structure and a plurality of ground vias surrounding the differential via structure. In the differential via structure, a pair of via holes electrically connects a pair of strip conductors on the upper surface side and a pair of strip conductors on the lower surface side. Each of the ground vias is a via hole and electrically connects a ground conductor layer on the upper surface side and a ground conductor layer on the lower surface side to each other. Differential via structures are disclosed in, for example, JP 2005-277028 A, JP 2004-14800 A, JP 2015-56719 A, and JP 2009-212400 A.

A differential via structure on a printed circuit board is disclosed in each of JP 2005-277028 A and JP 2004-014800 A. In JP 2005-277028 A, there is described a technology for making the impedance of a differential via portion close to the differential impedance of a differential transmission line, that is, setting the impedance of the differential via portion to 100Ω or from 90Ω to 117Ω through adjustment of a capacitance value between an inner layer land and an inner layer ground plane. In JP 2004-14800 A, there is described a technology for increasing the impedance of a differential via by increasing a via interval.

In each of JP 2015-056719 A and JP 2009-212400 A, there is disclosed a differential via structure that has excellent high frequency characteristics, and is provided on a multi-layer ceramic substrate. Consideration is made using an electromagnetic field analysis tool as more precise structural analysis means. With the use of a manufacturing technology for a multi-layer ceramic substrate, a differential via structure that is further reduced in size relative to a printed circuit board can be manufactured. In JP 2015-56719 A, a quasi co-axial transmission line is formed by arranging differential vias with a diameter of 0.1 mm that have no inner layer land at a pitch of from 0.205 mm to 0.4 mm, and concentrically surrounding the differential vias with ground vias. There is described a technology for making the differential impedance of a differential transmission line close to 100Ω by setting the impedance of a differential via portion to from 100Ω to 145Ω through adjustment of a pitch value. It is shown that satisfactory differential transmission characteristics are obtained within a frequency range up to a frequency of 30 GHz with this structure. In JP 2009-212400 A, a quasi co-axial transmission line is formed by arranging differential vias with a diameter of from 0.1 mm to 0.13 mm that have no inner layer land at a pitch of from 0.7 mm to 1.0 mm, and surrounding the differential vias with eight or ten ground vias. The differential impedance of a differential transmission line is 100Ω, and it is shown that satisfactory differential reflection characteristics and differential transmission characteristics are obtained within a frequency range up to a frequency of 40 GHz with this structure.

SUMMARY OF THE INVENTION

In the above-mentioned prior arts, there is presented the differential via structure in which the differential impedance of the differential transmission line, which is formed on each of the upper surface and the lower surface of the printed circuit board, is 100Ω, and the differential transmission lines are connected to each other. That is, the technology for making the differential impedance in the differential via structure close to 100Ω is described. However, the above-mentioned prior arts have no particular description about differential transmission lines having a differential impedance that is lower than 100Ω, which are sometimes desired.

The inventors of the present invention have been studying a differential via structure for reducing the differential impedance. The combined inductance per unit length of a differential via structure can be approximately expressed by 2L–M (Expression 1). In Expression 1, L represents the self inductance per unit length of each of a pair of differential vias, and M represents the mutual inductance per unit length of the pair of differential vias. In order to reduce the differential impedance, it is desired to reduce L and increase M. In order to reduce the self inductance, it would be better that the via diameter of the differential via be increased. In order to increase the mutual inductance, it would be better that a center-to-center distance of the pair of differential vias be reduced.

However, when the via diameter of the differential via is increased in order to reduce the self inductance, it is difficult to reduce the center-to-center distance of the pair of differential vias due to increase in via diameter. That is, the reduction in self inductance and the increase in mutual inductance cannot be achieved at the same time, which leads to a difficulty in reduction in differential impedance.

The present invention has been made in view of the problem described above, and has an object to provide a printed circuit board configured to achieve reduction in impedance of a differential transmission line extending in the printed circuit board in a stacking direction, and an optical module.

(1) In order to solve the above-mentioned problem, a printed circuit board according to one embodiment of the present invention includes a stacking-direction differential transmission line extending in a stacking direction. The stacking-direction differential transmission line may include: a differential signal via pair including a first signal via and a second signal via both extending in the stacking direction; and a plurality of conductor plate pairs each including a first conductor plate expanding outward from a rim of the first signal via in a board plane direction, and a second conductor plate expanding outward from a rim of the second signal via in the board plane direction, the second conductor plate being located in the same layer as the first conductor plate and separated from the first conductor plate. The plurality of conductor plate pairs are arranged along the stacking direction and separated from each other. With respect to a perpendicular bisector of a center-of-gravity line segment connecting a center of gravity of the first signal via and a center of gravity of the second signal via, in each of the plurality of conductor plate pairs, a center of gravity of a contour of the first conductor plate is located on an inner side of the center of gravity of the first signal via, and a center of gravity of a contour of the second conductor plate is located on an inner side of the center of gravity of the second signal via.

(2) In the printed circuit board according to Item (1), in each of the plurality of conductor plate pairs, a width of the contour of the first conductor plate with respect to the center-of-gravity line segment may be kept constant or increased along the center-of-gravity line segment from an outer side to an inner side, and a width of the contour of the second conductor plate with respect to the center-of-gravity line segment may be kept constant or increased along the center-of-gravity line segment from an outer side to an inner side.

(3) In the printed circuit board according to Item (1) or (2), in each of the plurality of conductor plate pairs, the first conductor plate and the second conductor plate may be opposed to each other across the perpendicular bisector, and an opposed portion of the contour of the first conductor plate and an opposed portion of the contour of the second conductor plate may extend along the perpendicular bisector.

(4) In the printed circuit board according to any one of Items (1) to (3), in each of the plurality of conductor plate pairs, the contour of the first conductor plate and the contour of the second conductor plate may be line-symmetric with respect to the center-of-gravity line segment.

(5) In the printed circuit board according to any one of Items (1) to (4), in each of the plurality of conductor plate pairs, the contour of the first conductor plate and the contour of the second conductor plate may be line-symmetric to each other with respect to the perpendicular bisector.

(6) The printed circuit board according to any one of Items (1) to (5) may further include: a first differential transmission line, which is arranged on an upper surface side of the printed circuit board, and is electrically connected to the stacking-direction differential transmission line; and a second differential transmission line, which is arranged on a lower surface side of the printed circuit board, and is electrically connected to the stacking-direction differential transmission line. The first differential transmission line may include: a first strip conductor pair, which is arranged in a first layer, and is in contact with and connected to the differential signal via pair; and a first ground conductor layer, which is arranged in a second layer that is located under the first layer in the stacking direction, and has a first through hole surrounding the differential signal via pair. The second differential transmission line may include: a second ground conductor layer, which is arranged in a third layer that is located under the second layer in the stacking direction, and has a second through hole surrounding the differential signal via pair; and a second strip conductor pair, which is arranged in a fourth layer that is located under the third layer in the stacking direction, and is in contact with and connected to the differential signal via pair. The plurality of conductor plate pairs may include a first conductor plate pair and a second conductor plate pair. The first conductor plate pair may be arranged in the second layer and on an inner side of the first through hole, while being separated from the first ground conductor layer. The second conductor plate pair may be arranged in the third layer and on an inner side of the second through hole, while being separated from the first ground conductor layer.

(7) In the printed circuit board according to Item (6), the plurality of conductor plate pairs may further include one or more interlayer conductor plate pairs arranged between the second layer and the third layer.

(8) In the printed circuit board according to Item (6) or (7), each conductor of the first strip conductor pair may include an open stub portion.

(9) In the printed circuit board according to Item (6) or (7), the first strip conductor pair may encompass the first conductor plate pair in plan view.

(10) The printed circuit board according to any one of Items (6) to (9) may further include a plurality of ground vias, which are arranged so as to surround the differential signal via pair, and are electrically connected to the first ground conductor layer and the second ground conductor layer.

(11) An optical module according to one embodiment of the present invention may include: the printed circuit board of any one of Items (6) to (10); a driver IC, which is arranged on an upper surface of the printed circuit board, and includes a driver differential terminal; and a light-emitting element, which is electrically connected to a differential terminal arranged on a lower surface of the printed circuit board, and is configured to convert an electric signal into an optical signal. The first differential transmission line may be electrically connected to the driver differential terminal of the driver IC. The second differential transmission line may be electrically connected to the differential terminal.

(12) In the optical module according to Item (11), the light-emitting element may be a directly-modulated semiconductor laser.

According to the present invention, there are provided the printed circuit board configured to achieve reduction in impedance of the differential transmission line extending in the printed circuit board in the stacking direction, and the optical module.

BRIEF DESCRIPTION OF THE DRAWINGS

FIG. 2 is a schematic perspective view for illustrating part of the structure of a printed circuit board according to the first embodiment of the present invention.

DETAILED DESCRIPTION OF THE INVENTION

Figure 1:
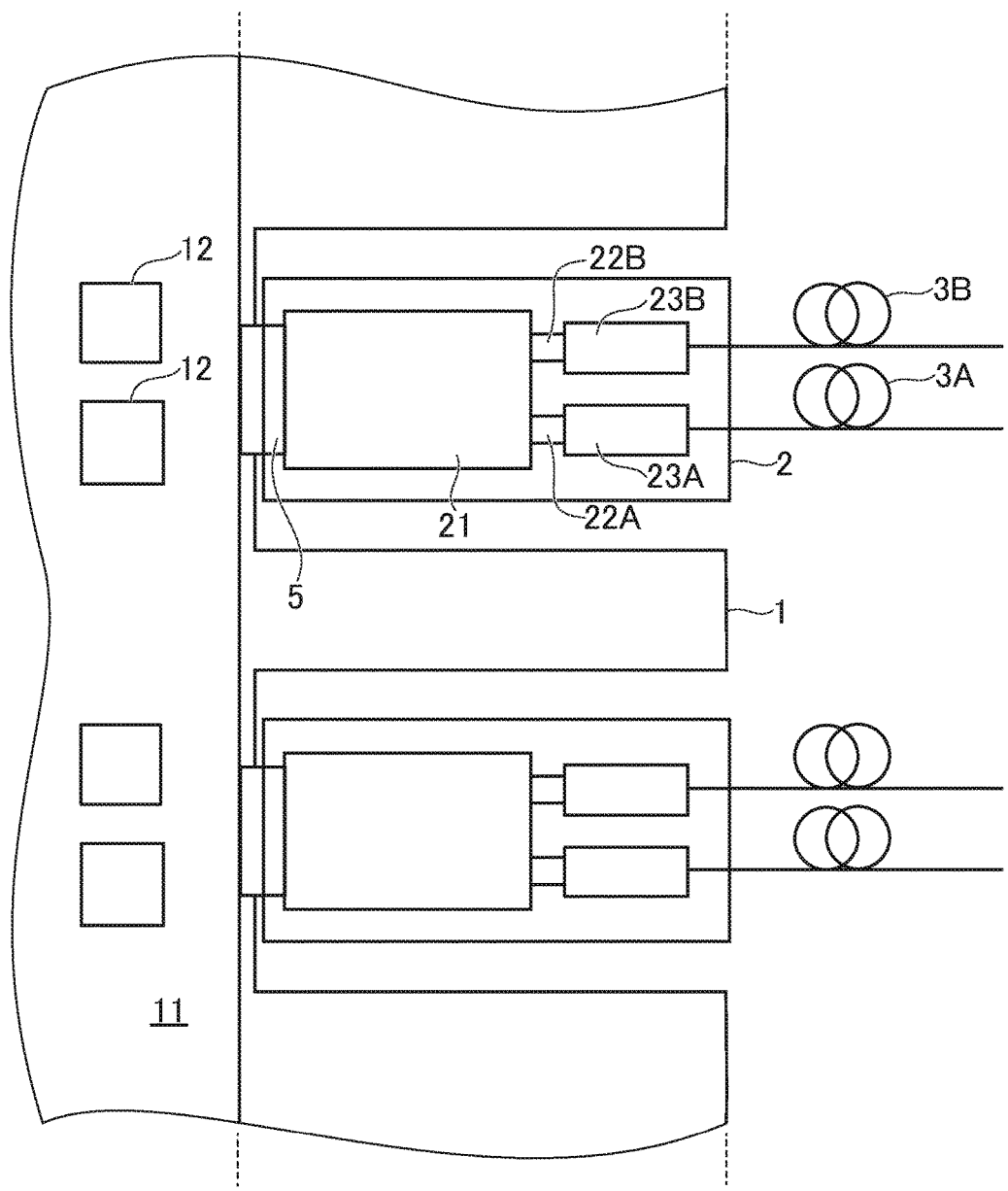
FIG. 1 is a schematic view for illustrating the configurations of a transmission device and an optical module according to a first embodiment of the present invention.

Embodiments of the present invention are specifically described in detail in the following with reference to the drawings. Note that, throughout the figures for illustrating the embodiments, members having the same functions are denoted by the same reference symbols, and repetitive description thereof is omitted. Note that, the drawings referred to in the following are only for illustrating the embodiments by way of examples, and the sizes in the drawings do not always match with the scale in the embodiments.

First Embodiment

FIG. 1 is a schematic view for illustrating the configurations of a transmission device 1 and an optical module 2 according to a first embodiment of the present invention. The transmission device 1 includes a printed circuit board 11. Further, the optical module 2 includes a printed circuit board 21. One or both of those printed circuit boards 11 and 21 correspond to a printed circuit board according to the first embodiment.

The transmission device 1 further includes ICs 12. The transmission device 1 is, for example, a router or a switch having large capacity. The transmission device 1 has, for example, the function of a switch, and is installed in a base station or the like. The transmission device 1 obtains reception data (reception electric signal) by the optical module 2, and determines the destination and type of data to be transmitted, with the use of the IC 12 and the like. Then, the transmission device 1 generates transmission data (transmission electric signal), and transmits the data to a corresponding optical module 2 via the printed circuit board 11.

The optical module 2 is a transceiver that has a function of the optical transmitting and a function of the optical receiving. The optical module 2 includes an optical transmitter unit 23A configured to convert an electric signal into an optical signal, and transmit the optical signal to an optical fiber 3A, and an optical receiver unit 23B configured to receive an optical signal via an optical fiber 3B, and convert the received optical signal into an electric signal. The printed circuit board 21 is connected to the optical transmitter unit 23A and the optical receiver unit 23B via flexible printed circuits 22A and 22B, respectively. An electric signal is transmitted from the printed circuit board 21 to the optical transmitter unit 23A via the flexible printed circuit 22A, and an electric signal is transmitted from the optical receiver unit 23B to the printed circuit board 21 via the flexible printed circuit 22B. The optical module 2 and the transmission device 1 are connected to each other via an electrical connector 5. An optical element is an element configured to convert one of an optical signal and an electric signal into the other. An optical element configured to convert an electric signal into an optical signal is a light-emitting element, and an optical element configured to convert an optical signal into an electric signal is a light-receiving element. The optical transmitter unit 23A includes one or a plurality of (here, four) light-emitting elements, and the optical receiver unit 23B includes one or a plurality of (here, four) light-receiving elements.

A transmission system according to the first embodiment includes two or more transmission devices 1, two or more optical modules 2, and one or more optical fibers 3. The one or more optical modules 2 are connected to each of the transmission devices 1. The optical modules 2 connected to the respective two transmission devices 1 are connected to each other by the optical fiber 3 (e.g., optical fiber 3A). Transmission data generated by one of the transmission devices 1 is converted into an optical signal by the optical module 2 connected thereto, and the optical module 2 transmits the optical signal to the optical fiber 3. The optical signal transmitted through the optical fiber 3 is received by the optical module 2 connected to the other of the transmission devices 1, and the optical module 2 converts the optical signal into an electric signal, and transmits the electric signal to the other of the transmission devices 1 as reception data.

The transmission device 1 and the optical module 2 according to the first embodiment are compatible with high-speed optical fiber transmission of a bit rate of 100 Gbit/s class, and fulfill the requirements of the spread of the broadband network and increased broadband speed in recent years. Further, the optical module 2 according to the first embodiment is an optical transceiver (optical transceiver module) fulfilling the requirements of reduction in size and cost. The Ethernet (trademark) standards of the multi source agreement (MSA) standards are currently initiative standards, and the optical module 2 according to the first embodiment is compliant with the QSFP28 MSA standard and the CFP4 MSA standard, for example. In such standards, reduction in volume of a case and number of parts has progressed. Further, a transmission system in such standards is a wavelength division multiplexing transmission system of four wavelengths. The optical transmitter unit 23A includes four light-emitting elements (e.g., semiconductor lasers) corresponding to the respective wavelengths. On the printed circuit board 21 included in the optical module 2, differential transmission lines for four transmission channels and four reception channels are arranged. The specifications of an electric signal of serial data are based on OIF CEI-28G, and the bit rate of an electric signal that is transmitted through each of the channels is any one of 25 Gbit/s to 28 Gbit/s. The four semiconductor lasers are driven by modulation by a driver circuit for each of the channels.

As the semiconductor laser, a directly-modulated distributed feedback laser diode (DFB-LD) is preferably used from the viewpoints of reduction in cost and long-distance fiber transmission characteristics. However, modulation drive current is relatively large. Accordingly, reduction in voltage and power consumption is achieved by setting the termination resistance of the driver circuit to a value less than 50Ω, which is a general impedance value. Under the current circumstances, as driver ICs for directly-modulated DFB-LDs, ICs with special specifications that include a driver circuit having a termination resistance of 25Ω are normally used. Thus, a differential transmission line connecting a driver output terminal and a semiconductor laser to each other is required to have a differential impedance of 50Ω, that is, special specifications as well.

In addition, a series resistance component during operation of the DFB-LD is about 10Ω, which is very small, and hence a differential signal output from the driver IC cannot be sufficiently absorbed by (terminated at) the DFB-LD. As a result, a relatively large number of signal components are reflected by the DFB-LD to be absorbed by the termination resistance of the driver circuit via the differential transmission line. When an impedance mismatch point is present on the midpoint of a differential transmission line, multiple reflections occur between the DFB-LD and the impedance mismatch point, resulting in significant degradation of the quality of an optical modulated signal. Thus, it is desired that the differential transmission line have a low impedance (50Ω), and a reflection amount be small. The following knowledge is obtained according to the study of the inventors of the present invention. Sufficiently satisfactory quality of an optical modulated signal output from the DFB-LD can be maintained when differential reflection coefficients SDD11 and SDD22 of the differential transmission line are set to −20 dB or less within a required frequency range. The frequency range corresponds to the bit rate of an electric signal. For example, in a case of a bit rate of 28 Gbit/s, the upper limit of the frequency range is preferably set to 28 GHz. The lower limit of the frequency range is preferably set to zero or several tens kHz, although the value changes depending on whether or not a DC-blocking capacitor is required.

A printed circuit board 31 according to the first embodiment includes a stacking-direction differential transmission line 32 extending in a stacking direction, a first differential transmission line 33 (not shown) that is arranged on the upper surface side of the board and electrically connected to the stacking-direction differential transmission line 32, and a second differential transmission line 34 (not shown) that is arranged on the lower surface side of the board and electrically connected to the stacking-direction differential transmission line 32. Here, the first differential transmission line 33 and the second differential transmission line 34 are micro strip lines. The main feature of the differential transmission line arranged in the printed circuit board 31 according to the first embodiment is the structure of the stacking-direction differential transmission line 32. The differential impedance of the stacking-direction differential transmission line 32 can be set to 50Ω. The upper surface and the lower surface of the printed circuit board 31 are the two surfaces of a printed circuit board, and one of the two surfaces is referred to as the upper surface and the other is referred to as the lower surface as a matter of convenience. In this case, a direction from the lower surface to the upper surface is an upward direction in the stacking direction. Needless to say, the one surface may be referred to as the lower surface and the other surface may be referred to as the upper surface in a reverse manner. In this case, the upward direction in the stacking direction is defined in a reverse manner as well.

FIG. 2 is a schematic perspective view for illustrating part of the structure of the printed circuit board 31 according to the first embodiment. In FIG. 2, the structure of the stacking-direction differential transmission line 32 is schematically illustrated. The stacking-direction differential transmission line 32 includes a differential signal via pair 101 (not shown), a plurality of conductor plate pairs 102 (not shown), and a plurality of ground vias 103 (not shown). The differential signal via pair 101 includes a first signal via 111A and a second signal via 111B both extending in the stacking direction. Both of the first signal via 111A and the second signal via 111B are via holes having an inner wall subjected to metal plating, and a circular shape in section. Each of the plurality of conductor plate pairs 102 includes a first conductor plate and a second conductor plate. The first conductor plate and the second conductor plate are arranged in the same layer while being separated from each other. The first conductor plate expands outward from the rim of the first signal via 111A in a board plane direction, and the second conductor plate expands outward from the rim of the second signal via 111B in the board plane direction. The plurality of conductor plate pairs 102 include a first conductor plate pair 115 (first conductor plate 115A and second conductor plate 115B), a second conductor plate pair 116 (first conductor plate 116A and second conductor plate 116B), and one or more interlayer conductor plate pairs 117 (here, six pairs of first conductor plates 117A and second conductor plates 117B). As illustrated in FIG. 2, the plurality of conductor plate pairs 102 are arranged along the stacking direction while being separated from each other. The plurality of ground vias 103 include four ground vias 118A, 118B, 118C, and 118D. Each of the plurality of ground vias 103 is a via hole similar to the differential signal via pair 101. The plurality of ground vias 103 are arranged so as to surround the differential signal via pair 101 and the plurality of conductor plate pairs 102.

Figure 3A:
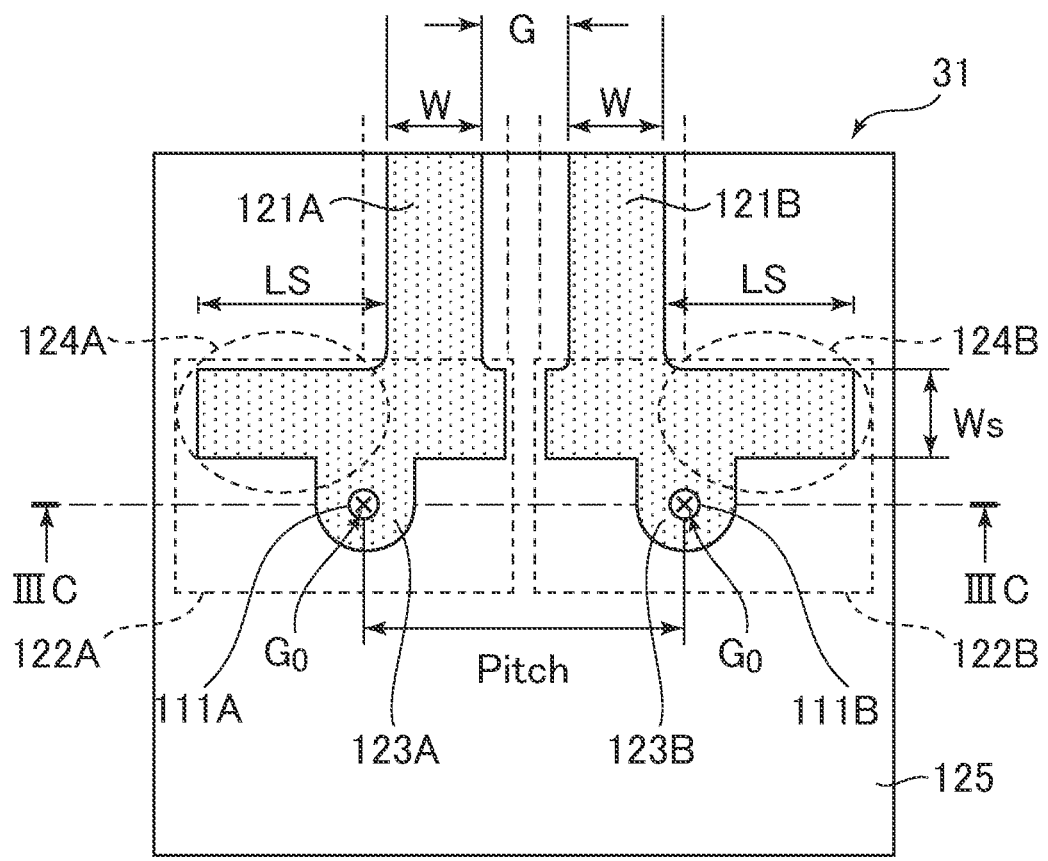
FIG. 3A is a schematic plan view for illustrating part of the structure of the printed circuit board according to the first embodiment of the present invention.
Figure 3B:
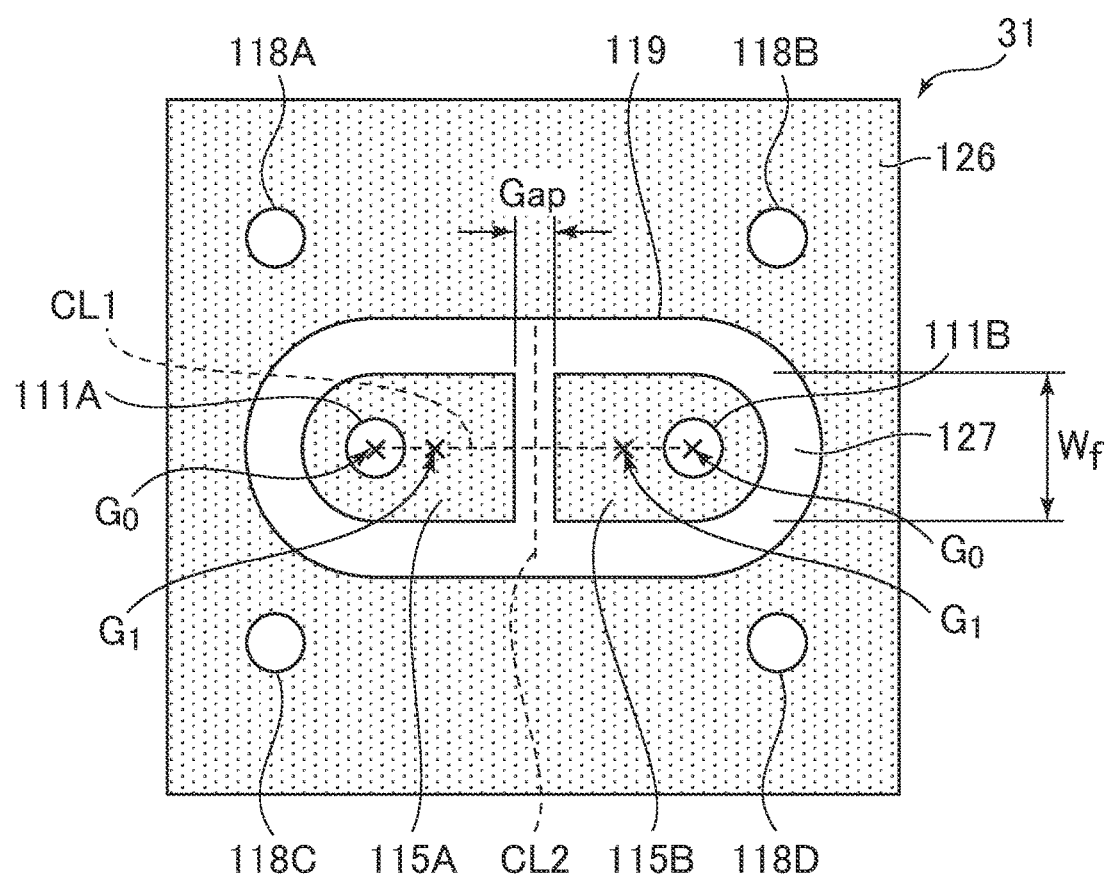
FIG. 3B is a schematic plan view for illustrating part of the structure of the printed circuit board according to the first embodiment of the present invention.
Figure 3C:
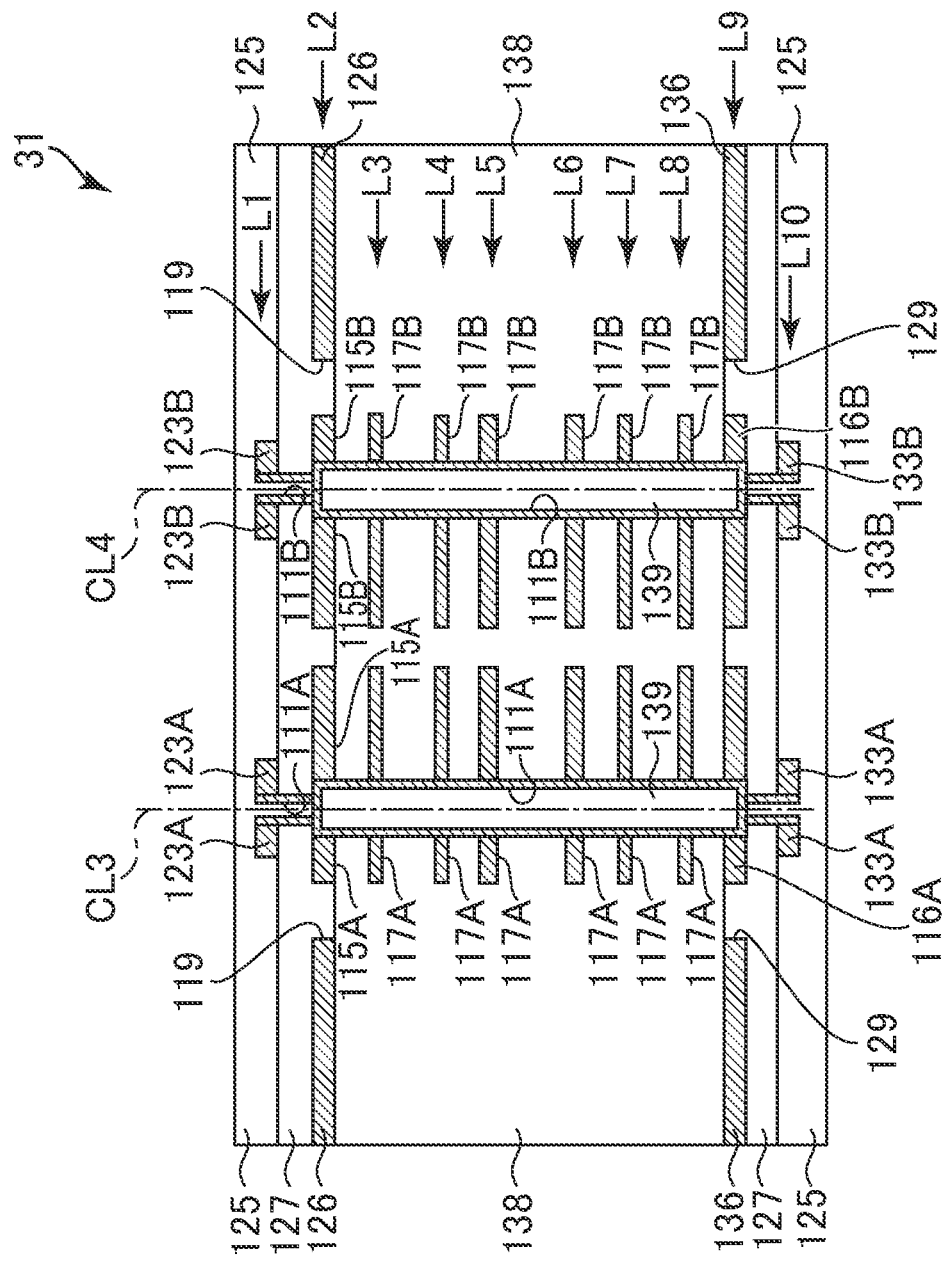
FIG. 3C is a schematic cross-sectional view for illustrating part of the printed circuit board according to the first embodiment of the present invention.

FIG. 3A and FIG. 3B are schematic plan views for illustrating part of the structure of the printed circuit board 31 according to the first embodiment. FIG. 3C is a schematic cross-sectional view for illustrating part of the printed circuit board 31 according to the first embodiment. FIG. 3C is an illustration of a cross section taken along the line IIIC-IIIC of FIG. 3A. The printed circuit board 31 according to the first embodiment is a printed circuit board having a multi-layer structure in which a plurality of wiring layers (here, ten layers) are formed via respective dielectric layers. In FIG. 3C, the ten wiring layers are expressed as L1, L2, ..., L10 in order from the upper surface side of the printed circuit board 31 to the lower surface side thereof (that is, from the upper side to the lower side in the stacking direction).

The first differential transmission line 33 is a micro strip line. The first differential transmission line 33 includes a first strip conductor pair 104 (not shown) that is in contact with and connected to the differential signal via pair 101, and a first ground conductor layer 126 (see FIG. 3B) having a first through hole 119 that surrounds the differential signal via pair 101. The first strip conductor pair 104 is arranged in a first layer (here, layer L1) that is a wiring layer located on the upper surface side. As illustrated in FIG. 3A, the first strip conductor pair 104 is a pair of conductors, and one of the pair of conductors includes a strip conductor 121A and a connection portion 122A, and the other includes a strip conductor 121B and a connection portion 122B. The first ground conductor layer 126 is arranged in a second layer (layer L2) located under the first layer (layer L1) in the stacking direction. A solder resist layer 125 is arranged so as to cover the first strip conductor pair 104 (layer L1), and a dielectric layer 127 is arranged between the first strip conductor pair 104 (layer L1) and the first ground conductor layer 126 (layer L2). Although the solder resist layer 125 is arranged on the upper surface of the printed circuit board 31, in terms of where the first differential transmission line 33 is formed in the plurality of wiring layers of the multi-layer structure, the first differential transmission line 33 may be regarded as being formed on the upper surface of the printed circuit board 31.

The second differential transmission line 34 is a micro strip line. The second differential transmission line 34 includes a second strip conductor pair 105 (not shown) that is in contact with and connected to the differential signal via pair 101, and a second ground conductor layer 136 having a second through hole 129 that surrounds the differential signal via pair 101. The second strip conductor pair 105 is a pair of conductors, and one of the pair of conductors includes a strip conductor 131A (not shown) and a connection portion 132A (not shown), and the other includes a strip conductor 131B (not shown) and a connection portion 132B (not shown). The second ground conductor layer 136 is arranged in a third layer (layer L9) located under the second layer (layer L2) in the stacking direction. The second strip conductor pair 105 is arranged in a fourth layer (layer L10) located under the third layer (layer L9) in the stacking direction. The solder resist layer 125 is arranged under the second strip conductor pair 105 (layer L10), and the dielectric layer 127 is arranged between the second strip conductor pair 105 (layer L10) and the second ground conductor layer 136 (layer L9). Similarly to the first differential transmission line 33, the second differential transmission line 34 may be regarded as being formed on the lower surface of the printed circuit board 31.

In FIG. 3A, the wiring pattern of the first layer (layer L1) is illustrated. The strip conductor 121A and the connection portion 122A are arranged so as to be in contact with each other, thereby forming a pair of conductors. In a similar manner, the strip conductor 121B and the connection portion 122B are arranged so as to be in contact with each other, thereby forming a pair of conductors. The strip conductors 121A and 121B each having a strip conductor width W are separated from each other so that a distance between the inner edges of the strip conductors 121A and 121B may be a strip conductor gap G. The strip conductors 121A and 121B linearly extend in parallel to each other on the outer sides of the connection portions 122A and 122B (upward in FIG. 3A), while maintaining the strip conductor width W and being separated from each other by the strip conductor gap G. Here, the strip conductor width W is 0.30 mm, and the strip conductor gap G is 0.20 mm. The thickness of a portion of the solder resist layer 125 that is located on the upper surface of the first strip conductor pair 104 (a distance from the upper surface of the first strip conductor pair 104 to outside air) is 40 μm, and a dielectric having a dielectric constant of 4.4 is used. An interlayer distance between the first layer (layer L1) and the second layer (layer L2) (the thickness of a portion of the dielectric layer 127 that is located between the lower surface of the first strip conductor pair 104 and the upper surface of the first ground conductor layer 126) is 65 μm. The dielectric layer 127 is a dielectric having a dielectric constant of 3.5. With this configuration, the differential impedance of the first differential transmission line 33 is substantially 50Ω. The strip conductors 121A and 121B linearly extend in a vertical direction of FIG. 3A. Needless to say, the strip conductors 121A and 121B may be, for example, bent outward in FIG. 3A depending on a circuit design including mounting electric parts on the upper surface of the printed circuit board 31. The same is true for the second differential transmission line 34.

The connection portions 122A and 122B electrically connect the strip conductors 121A and 121B and the first signal via 111A and the second signal via 111B (differential signal via pair 101) to each other, respectively. The connection portion 122A includes a land portion 123A for connection with the first signal via 111A, and a first open stub portion 124A. The connection portion 122B includes a land portion 123B for connection with the second signal via 111B, and a first open stub portion 124B. The connection portions 122A and 122B include the first open stub portions 124A and 124B expanding on the outer sides of the strip conductors 121A and 121B, which extend in parallel to each other, respectively, and the land portions 123A and 123B. The land portions 123A and 123B are entirely in contact with and electrically connected to the rims of the first signal via 111A and the second signal via 111B, respectively.

As described above, each of the first signal via 111A and the second signal via 111B has the circular shape in section, and the diameter of the circular shape is 0.1 mm. Thus, in plan view, the center of the circular shape of the first signal via 111A matches a center of gravity $G_0$ of the first signal via 111A, and the center of the circular shape of the second signal via 111B matches a center of gravity $G_0$ of the second signal via 111B. The first signal via 111A and the second signal via 111B are via holes that are hollow cylinders of a thin film formed by metal plating. A center-to-center distance Pitch (a distance between centers of gravity) between the first signal via 111A and the second signal via 111B is 1.0 mm. The land portions 123A and 123B have shapes that expand outward from the rims of the first signal via 111A and the second signal via 111B, respectively, on a board plane surface. The contours of the land portions 123A and 123B partly have an arc (the lower side in FIG. 3A). Further, the first ground conductor layer 126 has the first through hole 119, and the first open stub portions 124A and 124B, which function as an open stub circuit, are arranged in order to prevent an unnecessary impedance rise. The first open stub portions 124A and 124B extend on the outer side of the extending directions of the strip conductors 121A and 121B, and the extending directions of the first open stub portions 124A and 124B are vertical to the extending directions of the strip conductors 121A and 121B. An open stub conductor width Ws and an open stub conductor length LS of the first open stub portions 124A and 124B can be obtained by electromagnetic field analysis simulation, for example. In the first embodiment, the open stub conductor width Ws is 0.25 mm, and the open stub conductor length LS is 0.605 mm.

In FIG. 3B, the wiring pattern of the second layer (layer L2) is illustrated. The first ground conductor layer 126 has the first through hole 119. The first ground conductor layer 126 is, in plan view, a planar layer that widely expands except for the first through hole 119. However, in order to form the first differential transmission line 33, it would be better that a region in which the first ground conductor layer 126 is arranged at least may include, in plan view, a region opposed to the first strip conductor pair 104 (except for the first through hole 119) and a region expanding on the both outer sides from that region. Here, centerlines CL1 and CL2 are defined. In plan view, a line segment connecting the center of the first signal via 111A and the center of the second signal via 111B to each other is defined as the centerline CL1. The centerline CL1 matches a center-of-gravity line segment connecting the center of gravity $G_0$ of the first signal via 111A and the center of gravity $G_0$ of the second signal via 111B to each other. Further, the perpendicular bisector of the center-of-gravity line segment is defined as the centerline CL2.

The first conductor plate pair 115 (first conductor plate 115A and second conductor plate 115B) is arranged in the same layer (layer L2) as the first ground conductor layer 126, and on the inner side of the first through hole 119, while being separated from the first ground conductor layer 126. The dielectric layer 127 is arranged in a region on the inner side of the first through hole 119 in which the first conductor plate pair 115 is not arranged. The first conductor plate pair 115 (first conductor plate 115A and second conductor plate 115B) are electrically separated from the first ground conductor layer 126. Further, the first conductor plate 115A and the second conductor plate 115B are electrically separated from each other. The first through hole 119 is an opening portion called an anti-pad. The shape of the first through hole 119 is a shape obtained by connecting two semicircles and a rectangle connecting the two semicircles to each other. The two semicircles have a diameter of 0.8 mm and expand outward (on both sides of the centerline CL1) with the center of the first signal via 111A and the center of the second signal via 111B being respective centers. The width direction of the rectangle is the direction of the centerline CL2, and the width is 0.8 mm, which is the diameter of the semicircle. The length direction of the rectangle is the direction of the centerline CL1, and the length is the center-to-center distance Pitch, and is 1.0 mm here. A gap between the contour of the first through hole 119 and the contour of the first conductor plate pair 115 (conductor plates 115A and 115B) is 0.175 mm. However, the contours of the conductor plates 115A and 115B here exclude portions opposed to each other (opposed portions extending in the direction of the centerline CL2, which are illustrated in FIG. 3B).

As illustrated in FIG. 3C, of the plurality of conductor plate pairs 102, the first conductor plate pair 115 (first conductor plate 115A and second conductor plate 115B) is arranged in the second layer (layer L2), the second conductor plate pair 116 (first conductor plate 116A and second conductor plate 116B) is arranged in the third layer (layer L9), and the one or more interlayer conductor plate pairs 117 (six pairs of first conductor plates 117A and second conductor plates 117B) are arranged in the respective layers of a plurality of wiring layers (here, layer L3 to layer L8) located between the second layer and the third layer. The plurality of conductor plate pairs 102 desirably have the same shape in plan view, and the plurality of conductor plate pairs 102 according to the first embodiment have the same shape in plan view.

Here, centerlines CL3 and CL4 are defined. A straight line passing through the center of the first signal via 111A in the plurality of wiring layers is defined as the centerline CL3. In a similar manner, a straight line passing through the center of the second signal via 111B in the plurality of wiring layers is defined as the centerline CL4. In the following, the shape of the first conductor plate pair 115 (first conductor plate 115A and second conductor plate 115B) is described. The shapes of other conductor plate pairs are similar to that of the first conductor plate pair 115.

The first conductor plate 115A is small piece wiring having a fin shape that expands outward from the rim of the first signal via 111A in the board plane direction. The second conductor plate 115B is small piece wiring having a fin shape that expands outward from the rim of the second signal via 111B in the board plane direction. The contour of each of the first conductor plate 115A and the second conductor plate 115B has a shape obtained by dividing, by a gap Gap of 0.1 mm with the centerline CL2 being a centerline, a shape obtained by connecting two semicircles and a rectangle connecting the two semicircles to each other. The two semicircles expand outward with the center of the first signal via 111A and the center of the second signal via 111B being respective centers (on both sides of the centerline CL1), and have a diameter of 0.45 mm. Similarly to the first through hole 119, the width direction of the rectangle is the direction of the centerline CL2, and the width is 0.45 mm, which is the diameter of the semicircle. The length direction of the rectangle is the direction of the centerline CL1, and the length is 1.0 mm, which is the center-to-center distance Pitch. That is, the contour of the first conductor plate 115A has a shape obtained by connecting a semicircle having a diameter of 0.45 mm, and a square having a length of 0.45 mm and a width of 0.45 mm. The contour of the second conductor plate 115B has a shape that is line-symmetric to the contour of the first conductor plate 115A with respect to the centerline CL2.

A center of gravity $G_1$ of each of the contour of the first conductor plate 115A and the contour of the second conductor plate 115B is illustrated in FIG. 3B. The first signal via 111A (second signal via 111B) is completely included inside the contour of the first conductor plate 115A (second conductor plate 115B). That is, the first conductor plate 115A (second conductor plate 115B) is formed so as to expand outward in all directions (360°) from the rim of the first signal via 111A (second signal via 111B) in the board plane direction (the plane direction of the layer L2). As a result, the first conductor plate 115A (second conductor plate 115B) extends inward, that is, toward the centerline CL2 by a larger amount than the first signal via 111A (second signal via 111B), and hence the gap Gap is smaller than the minimum distance (Pitch-D) between the first signal via 111A and the second signal via 111B. Both of the first signal via 111A and the second signal via 111B have a diameter D of 0.2 mm in the second layer (layer L2).

In order to improve the characteristics of the differential transmission line, both of the contour of the first conductor plate 115A and the contour of the second conductor plate 115B are desirably line-symmetric with respect to the center-of-gravity line segment (centerline CL1), but may be substantially line-symmetric. In this case, the center of gravity of each of the contour of the first conductor plate 115A and the contour of the second conductor plate 115B is located on the centerline CL1. Further, in order to improve the characteristics of the differential transmission line, the contour of the first conductor plate 115A and the contour of the second conductor plate 115B are desirably line-symmetric to each other with respect to the perpendicular bisector (centerline CL2), but may be substantially line-symmetric to each other.

The second strip conductor pair 105 and the second ground conductor layer 136 included in the second differential transmission line 34 match the first strip conductor pair 104 and the first ground conductor layer 126 that are moved and rotated by 180° around the centerline CL1 on the board plane surface. The centerline CL1 passes through the midpoint of the stacking-direction differential transmission line 32 in the stacking direction. Here, the midpoint of the stacking-direction differential transmission line 32 in the stacking direction refers to the centerline CL1 on a plane surface bisecting an interlayer portion between the first layer and the fourth layer (or a plane surface bisecting an interlayer portion between the second layer and the third layer).

The shape of the second ground conductor layer 136 arranged in the third layer (here, layer L9) is the same as the shape of the first ground conductor layer 126 arranged in the second layer (here, layer L2), which is illustrated in FIG. 3B. The shape of the second through hole 129 is the same as the shape of the first through hole 119, which is illustrated in FIG. 3B. Further, as described above, the shapes of the first conductor plate 116A and the second conductor plate 116B of the second conductor plate pair 116 that are arranged in the same layer (here, layer L9) are the same as the shapes of the first conductor plate 115A and the second conductor plate 115B of the first conductor plate pair 115.

The plurality of ground vias 103 are in contact with and electrically connected to each of the first ground conductor layer 126 and the second ground conductor layer 136. As described above, the plurality of ground vias 103 are arranged so as to surround the differential signal via pair 101 and the plurality of conductor plate pairs 102. The plurality of ground vias 103 according to the first embodiment are the four ground vias 118A, 118B, 118C, and 118D having centers at the respective corners of the rectangle. A distance between the ground via and the signal via is desirably as small as possible under design rules of a board manufacturing process to be applied. The rectangle has a width (a side along the centerline CL2) of 1.23 mm, and a length (a side along the centerline CL1) of 1.525 mm.

The shape of the second strip conductor pair 105 arranged in the fourth layer (here, layer L10) is line-symmetric to the shape of the first strip conductor pair 104 arranged in the first layer (here, layer L1), which is illustrated in FIG. 3A, with respect to the line IIIC-IIIC. The line IIIC-IIIC passes through the center of the first signal via 111A and the center of the second signal via 111B. The shape of the strip conductor 131A and the shape of the connection portion 132A included in the second strip conductor pair 105 correspond to the shape of the strip conductor 121A and the shape of the connection portion 122A illustrated in FIG. 3A, respectively. In a similar manner, the shapes of the strip conductor 131B and the connection portion 132B included in the second strip conductor pair 105 correspond to the shapes of the strip conductor 121B and the connection portion 122B illustrated in FIG. 3A, respectively. The connection portions 132A and 132B include land portions 133A and 133B (both not shown), and second open stub portions 134A and 134B (both not shown), respectively. The shape of the land portion 133A (133B) and the shape of the second open stub portion 134A (134B) correspond to the shape of the land portion 123A (123B) and the shape of the first open stub portion 124A (124B) illustrated in FIG. 3A, respectively. Thus, the first differential transmission line 33 and the second differential transmission line 34 linearly extend, in plan view, in the vertical direction of FIG. 3A and FIG. 3B.

The one or more interlayer conductor plate pairs 117 (here, the six pairs of the first conductor plates 117A and the second conductor plates 117B) are arranged between the second layer (layer L2) and the third layer (layer L9) (layer L3 to layer L8). The contour of the first conductor plate 117A and the contour of the second conductor plate 117B of each of the one or more interlayer conductor plate pairs 117 match, in plan view, the contour of the first conductor plate 115A and the contour of the second conductor plate 115B of the first conductor plate pair 115, respectively.

The feature of the printed circuit board 31 according to the first embodiment is the structure of the stacking-direction differential transmission line 32. In each of the plurality of conductor plate pairs 102, with respect to the perpendicular bisector (centerline CL2) of the center-of-gravity line segment, the center of gravity $G_1$ of the contour of the first conductor plate is located on the inner side of the center of gravity $G_0$ of the first signal via 111A, and the center of gravity $G_1$ of the contour of the second conductor plate is located on the inner side of the center of gravity $G_0$ of the second signal via 111B. Each of the plurality of conductor plate pairs 102 has the above-mentioned configuration, and hence the differential impedance of the stacking-direction differential transmission line 32 can be reduced compared to a case where the stacking-direction differential transmission line 32 only includes the differential signal via pair 101 (first signal via 111A and second signal via 111B).

In each of the plurality of conductor plate pairs 102, the width of the contour (a length along the centerline CL2) of the first conductor plate with respect to the center-of-gravity line segment (centerline CL1) is desirably constant or increased along the center-of-gravity line segment (centerline CL1) from the outer side to the inner side. In a similar manner, the width of the contour of the second conductor plate is desirably constant or increased along the center-of-gravity line segment from the outer side to the inner side. In other words, a change amount of the width of the contour of the first conductor plate (second conductor plate) from the outer side to the inner side is zero or more. In the first embodiment, the width of the contour of the first conductor plate (second conductor plate) is zero at the start and gradually increased (monotonically increased) from the outer side to the inner side in the semicircle portion, and is constant (fixed) in the rectangle portion. Each of the plurality of conductor plate pairs 102 has the above-mentioned contour, and hence, although the first conductor plate and the second conductor plate are arranged in the limited regions, the center of gravity $G_1$ of the contour of the first conductor plate and the center of gravity $G_1$ of the contour of the second conductor plate can be easily located on the inner sides of the center of gravity $G_0$ of the first signal via 111A and the center of gravity $G_0$ of the second signal via 111B, respectively. Further, a distance between the center of gravity $G_1$ and the center of gravity $G_0$ can be easily increased.

In each of the plurality of conductor plate pairs 102, it is further desired that the first conductor plate and the second conductor plate be opposed to each other across the perpendicular bisector (centerline CL2), and the opposed portions of the contour of the first conductor plate and the contour of the second conductor plate extend along the perpendicular bisector (centerline CL2). As described above, in the first embodiment, in the first conductor plate pair 115, the first conductor plate 115A has a square (or a rectangle) in its contour, and the second conductor plate 115B has a square (or a rectangle) in its contour. The side of the square of the first conductor plate 115A that faces the centerline CL2 is opposed to, across the centerline CL2, the side of the square of the second conductor plate 115B that faces the centerline CL2. The two sides linearly extend in parallel to each other with the gap Gap along the perpendicular bisector (centerline CL2). Each of the plurality of conductor plate pairs 102 has the above-mentioned shape, and hence, although the first conductor plate and the second conductor plate are arranged in the limited regions, the center of gravity $G_1$ of the contour of the first conductor plate and the center of gravity $G_1$ of the contour of the second conductor plate can be located at positions closer to the centerline CL2. Here, a length $W_f$ of the straight portions of the contour of the first conductor plate 115A and the contour of the second conductor plate 115B that are opposed to each other is 0.45 mm.

In the first embodiment, the contour of the first conductor plate and the contour of the second conductor plate of each of the plurality of conductor plate pairs 102 are desirably highly symmetric. Both of the center of gravity $G_1$ of the contour of the first conductor plate and the center of gravity $G_1$ of the contour of the second conductor plate are desirably located on the centerline CL1. However, the present invention is not limited to this. The center of gravity $G_1$ of the contour of the first conductor plate and the center of gravity $G_1$ of the contour of the second conductor plate may not be located on the centerline CL1 as long as being located on the inner side of the center of gravity $G_0$ of the first signal via 111A (second signal via 111B) at a position along the centerline CL1 with the centerline CL1 being a coordinate axis.

Now, a method of manufacturing the printed circuit board 31 according to the first embodiment is described by referring mainly to the schematic cross-sectional view of FIG. 3C. As described above, the printed circuit board 31 is a printed circuit board having a multi-layer structure (here, ten layers), and the printed circuit board 31 can be produced by a build-up process, for example. First, the wiring layers (conductor layers) of the second layer (here, layer L2) to the third layer (here, layer L9) are sequentially patterned and stacked while a dielectric layer 138 is sandwiched between the second layer and the third layer, thereby forming a wafer shape. Then, the resultant is cured. Copper foil is used for each of the ten wiring layers, but the present invention is not limited to the copper foil. Other metal materials or materials other than metal may be used as long as the materials are suitable for the wiring layers. The dielectric layer 138 is formed using a material (glass-cloth epoxy resin) including a glass fabric base material and epoxy resin. Here, the dielectric constant of the material is 3.5. The expression "arranged in the same layer" as used herein means belonging to the same wiring layer of the plurality of wiring layers of the multi-layer structure. Through pattering of the wiring layers, for example, the first ground conductor layer 126, the first conductor plate 115A, and the second conductor plate 115B are arranged in the same layer, namely, the second layer (layer L2).

Secondly, circular drill holes having a diameter D of 0.2 mm are formed vertically by a drill at positions at which the differential signal via pair 101 (first signal via 111A and second signal via 111B), and the plurality of ground vias 103 (four ground vias 118A, 118B, 118C, and 118D) are formed. Then, copper plating is performed on the side surfaces of the drill holes to form via holes. A resin 139 is encapsulated in those six cylindrical vias made of copper, and the upper and lower ends of the via holes for the differential signal via pair 101 are covered by copper plating. Here, the via holes are formed by copper plating, but the present invention is not limited to copper plating, and may employ plating of other metal.

Thirdly, the dielectric layers 127 are formed on the outer sides of the second layer (layer L2) and the third layer (layer L9) (the upper side and the lower side of FIG. 3C), and the first layer (layer L1) and the fourth layer (layer L10) are formed across the dielectric layers 127. Regions of the second layer (layer L2) and the third layer (layer L9) in which the wiring layers are not formed are filled with the dielectric layers 127. The dielectric layers 127 are formed using a material (glass-cloth epoxy resin) including a glass fabric base material and epoxy resin. Here, the dielectric constant of the material is 3.5, and the thickness of each of the dielectric layers 127 is 65 µm. Circular (minute) laser holes having a diameter of 0.1 mm are formed vertically by laser at positions at which the differential signal via pair 101 (first signal via 111A and second signal via 111B) is formed. Then, copper plating is performed on the side surfaces of the laser holes to form via holes. That is, laser vias are formed. With the laser vias, in the differential signal via pair 101, interlayer connection between the first layer (layer L1) and the second layer (layer L2), and interlayer connection between the fourth layer (layer L10) and the third layer (layer L9) are made. The first signal via 111A and the second signal via 111B according to the first embodiment are the vias (the diameter D of the holes is 0.2 mm) formed by the drill from the layer L2 to the layer L9, and are the laser vias (the diameter of the holes is 0.1 mm) from the layer L1 to the layer L2 and from the layer L9 to the layer L10. Further, a portion between the via formed by the drill and the laser via is covered by copper plating.

The thickness of the printed circuit board 31 is preferably about 1 mm. The thickness of the conductor (wiring) of each of the plurality of wiring layers (layer L1 to layer L10) is preferably from 18 µm to 37 µm although the value depends on a board manufacturing process to be applied. A solder resist is applied on each of the upper surface side and the lower surface side to form a film, thereby forming the solder resist layer 125 in order to protect the circuit pattern. The solder resist layer 125 is preferably formed using a thermosetting epoxy resin ink, and the thickness of (film of) the solder resist layer 125 is preferably from 30 µm to 50 µm. Through the manufacturing process described above, the printed circuit board 31 according to the first embodiment is produced.

Figure 4A:
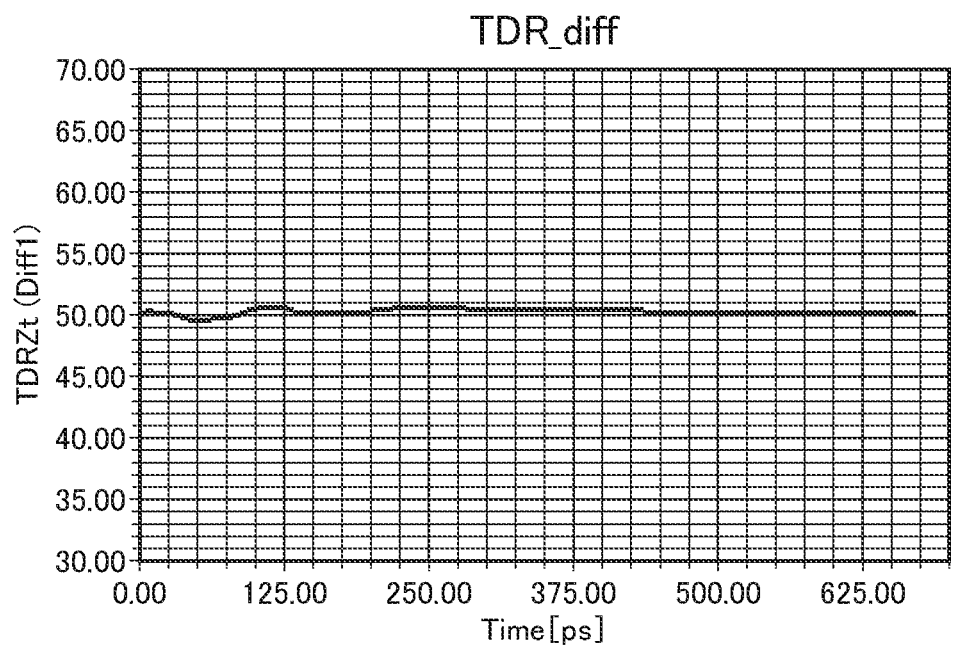
FIG. 4A is a graph for showing the characteristics of a differential transmission line included in the printed circuit board according to the first embodiment of the present invention.
Figure 4B:
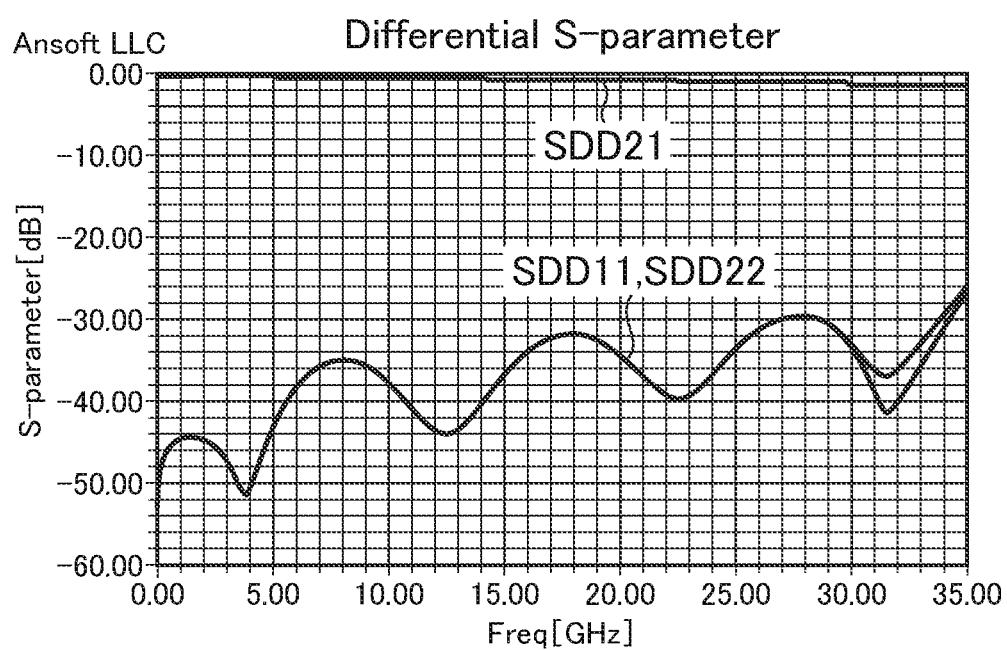
FIG. 4B is a graph for showing the characteristics of the differential transmission line included in the printed circuit board according to the first embodiment of the present invention.

FIG. 4A and FIG. 4B are graphs for showing the characteristics of the differential transmission line included in the printed circuit board 31 according to the first embodiment. FIG. 4A is a graph of an impedance profile in a differential mode that is obtained by time domain reflectometry (TDR) using three-dimensional electromagnetic field analysis. It is shown that, while the differential impedance of each of the first differential transmission line 33 and the second differential transmission line 34, which are arranged on the upper surface and the lower surface of the printed circuit board 31, respectively, is 50Ω, the differential transmission line according to the first embodiment has, despite including the stacking-direction differential transmission line 32, almost no fluctuation in impedance due to the stacking-direction differential transmission line 32.

FIG. 4B is a graph for showing the frequency characteristics of differential reflection characteristics and differential transmission characteristics that are obtained by S-parameter analysis. In a wide frequency range of from 0 Hz to 35 GHz, the differential reflection coefficients SDD11 and SDD22 indicate values of −20 dB or less, and sufficient characteristics can be obtained. In addition, in a frequency range of from 0 Hz to 26.5 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. As a result, in the differential transmission line according to the first embodiment, even the differential impedance of the stacking-direction differential transmission line 32 can be set to a value close to 50Ω.

Figure 5A:
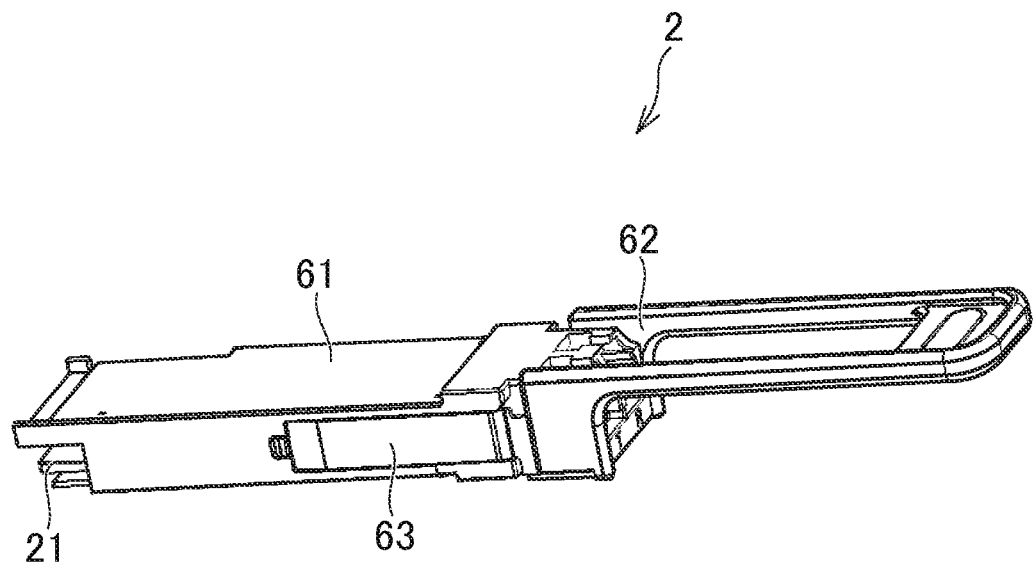
FIG. 5A is a schematic perspective view for illustrating the configuration of the optical module according to the first embodiment of the present invention.
Figure 5B:
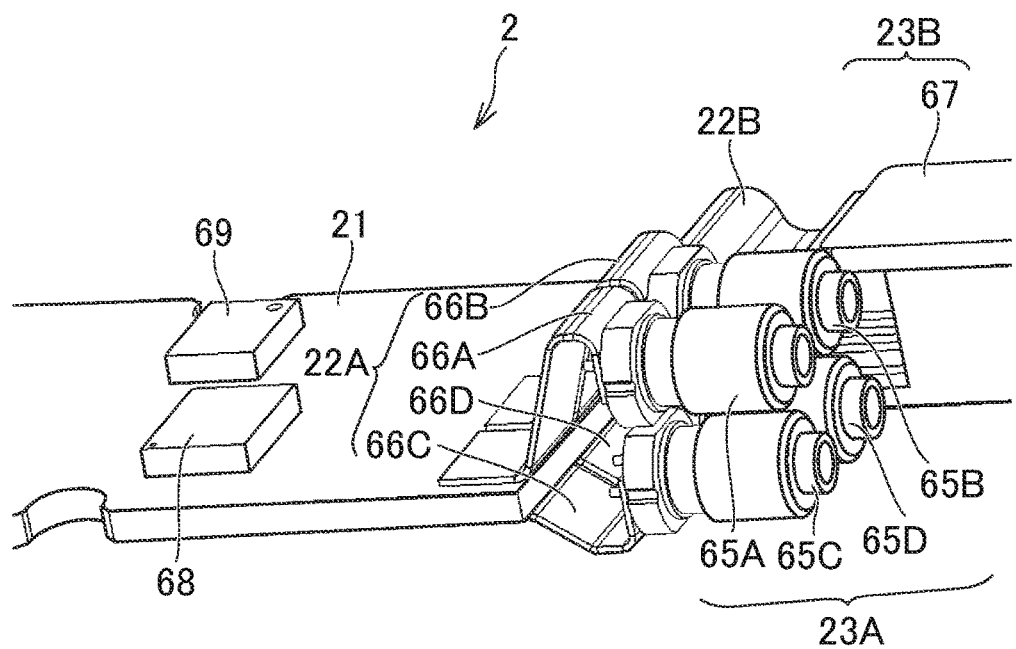
FIG. 5B is a schematic perspective view for illustrating the configuration of the optical module according to the first embodiment of the present invention.

FIG. 5A and FIG. 5B are schematic perspective views for illustrating the configuration of the optical module 2 according to the first embodiment. FIG. 5A is an appearance diagram of the optical module 2, and FIG. 5B is an illustration of main components mounted in the optical module 2. As described above, the optical module 2 is the optical transceiver having a bit rate of 100 Gbit/s class. Here, the optical module 2 is compliant with the QSFP28 MSA standard. As illustrated in FIG. 5A, the optical module 2 includes a case 61, a latch 62, a pull-tab 63, and the printed circuit board 21. The printed circuit board 21 includes the printed circuit board 31 according to the first embodiment. The contour of the optical module 2 is formed by those main components. The case 61 is formed by molding including die casting using metal, for example, zinc. The latch 62 is formed by sheet metal working using metal, for example, stainless steel. The pull-tab 63 is formed by injection molding using thermoplastic elastomer. The above-mentioned components are preferably formed by the respective methods in view of reduction in cost.

Next, with reference to FIG. 5B, the main components mounted in the case 61 of the optical module 2 are described. As illustrated in FIG. 1, the optical module 2 includes the printed circuit board 21, the flexible printed circuits 22A and 22B, the optical transmitter unit 23A, and the optical receiver unit 23B. The optical transmitter unit 23A includes four TO-CAN type TOSAs 65A, 65B, 65C, and 65D corresponding to the respective wavelengths. The flexible printed circuit 22A includes four sub-flexible printed circuits 66A, 66B, 66C, and 66D. The diameter size of each of the TO-CAN type TOSAs is 3.8 mm here. One semiconductor laser is mounted on each of the TO-CAN type TOSAs. Here, a directly-modulated DFB-LD is used as the semiconductor laser. The four TO-CAN type TOSAs are arranged in two lines, namely, an upper line and a lower line, and the upper two TO-CAN type TOSAs 65A and 65B are connected to the upper surface (an upper-side surface in FIG. 5B) of the printed circuit board 21 via the sub-flexible printed circuits 66A and 66B, respectively. The lower two TO-CAN type TOSAs 65C and 65D are connected to the lower surface (a surface opposite to the upper surface) of the printed circuit board 21 via the sub-flexible printed circuits 66C and 66D, respectively. With this configuration, the main components can be mounted in the internal space of the case 61 that is compliant with the QSFP28 MSA standard.

As illustrated in FIG. 5B, the two ICs 68 and 69 are mounted on the upper surface of the printed circuit board 21. The IC 68 is a driver IC in which transmission-side CDR circuits for four channels and driver circuits for the four channels are integrated. Of driver output terminals (driver differential terminals) for the four channels of the IC 68, the driver output terminals for the two channels are connected to respective one ends of the differential transmission lines for the two channels arranged on the upper surface of the printed circuit board 21. The other ends of the differential transmission lines for the two channels are connected to respective one ends of the sub-flexible printed circuits 66A and 66B. The other ends of the sub-flexible printed circuits 66A and 66B are connected to respective signal input terminals of the upper two TO-CAN type TOSAs 65A and 65B. Thus, output signals output from the driver output terminals for the two channels of the IC 68 propagate through the differential transmission lines for the two channels and the respective sub-flexible printed circuits 66A and 66B, and are input to the respective signal input terminals of the upper two TO-CAN type TOSAs 65A and 65B. The characteristic impedance of the differential transmission lines for the two channels in the differential mode desirably falls within a range of from 40Ω to 60Ω, and is more desirably 50Ω.

Of the driver output terminals for the four channels of the IC 68, the driver output terminals for the other two channels are connected to respective one ends of the differential transmission lines for the two channels according to the first embodiment. The differential transmission line according to the first embodiment includes, as described above, the first differential transmission line 33, the stacking-direction differential transmission line 32, and the second differential transmission line 34. Specifically, one end of the differential transmission line according to the first embodiment (the end of the first differential transmission line 33) is arranged on the upper surface of the printed circuit board 21. The other end of the differential transmission line according to the first embodiment (the end of the second differential transmission line 34) is arranged on the lower surface and connected to respective one ends of the sub-flexible printed circuits 66C and 66D, via the connection terminals (differential terminals) arranged on the lower surface of the printed circuit board 21. The other ends of the sub-flexible printed circuits 66C and 66D are connected to respective signal input terminals of the lower two TO-CAN type TOSAs 65C and 65D. Thus, output signals output from the driver output terminals for the other two channels of the IC 68 propagate through the differential transmission lines for the two channels (the differential transmission lines for the other two channels) according to the first embodiment and the respective sub-flexible printed circuits 66C and 66D, and are input to the respective signal input terminals of the lower two TO-CAN type TOSAs 65C and 65D. The optical transmitter unit 23A of the optical module 2 further includes an optical multiplexer (not shown) connected to the output side of each of the four TO-CAN type TOSAs 65A, 65B, 65C, and 65D. The optical multiplexer multiplexes optical modulated signals output from the four TO-CAN types TOSAs 65A, 65B, 65C, and 65D, and outputs a wavelength multiplex optical modulated signal to the optical fiber 3A connected to the optical module 2. The characteristic impedance of the differential transmission lines for the two channels according to the first embodiment in the differential mode also desirably falls within a range of from 40Ω to 60Ω, and is more desirably 50Ω. The optical module 2 has the configuration described above on the light transmission side so that the sufficiently satisfactory quality of optical modulated signals output from the DFB-LDs built in the lower two TO-CAN type TOSAs 65C and 65D can be maintained.

The optical module 2 according to the first embodiment includes the transmission driver IC (IC 68), which is arranged on the upper surface of the printed circuit board 21 and has the driver differential terminals (driver output terminals), and the optical transmitter unit 23A of the optical module 2 includes the plurality of directly-modulated semiconductor lasers (in particular, directly-modulated DFB-LDs). At least one of the plurality of directly-modulated semiconductor lasers is electrically connected, via the flexible printed circuit 22A and the like, to the differential terminal arranged on the lower surface of the printed circuit board 21. The first differential transmission line 33 is electrically connected to the driver differential terminal of the transmission driver IC, and the second differential transmission line 34 is electrically connected to the differential terminal arranged on the lower surface of the printed circuit board 21. With this, the transmission driver IC and the directly-modulated semiconductor laser are electrically connected to each other via the differential transmission line according to the first embodiment. In the first embodiment, the directly-modulated semiconductor laser is a directly-modulated DFB-LD, but the present invention is not limited thereto. The directly-modulated semiconductor laser may be other types of semiconductor lasers. Further, the light-emitting element is not limited to a directly-modulated semiconductor laser, and may be other types of semiconductor lasers or other types of light-emitting elements.

The optical receiver unit 23B of the optical module 2 includes a 4-channel ROSA 67 having the four light-receiving elements built therein. Here, the light-receiving element is a photo diode (PD). The 4-channel ROSA 67 is connected to one end of the flexible printed circuit 22B. The other end of the flexible printed circuit 22B is connected to one end of each of the differential transmission lines for the four channels arranged on the upper surface of the printed circuit board 31. The other ends of the differential transmission lines for the four channels are connected to CDR signal input terminals for the four channels of the IC 69. The IC 68 is an IC that includes integrated reception-side CDR circuits for the four channels, and is arranged on the upper surface of the printed circuit board 31. Output signals from the 4-channel ROSA 67 are input to the respective CDR signal input terminals of the IC 69 via the differential lines for the four channels arranged on the flexible printed board 22B, and the differential transmission lines for the four channels arranged on the upper surface of the printed circuit board 31. The characteristic impedance of the differential transmission lines for the four channels in the differential mode is set to 100Ω in general.

Most of optical modules (optical transceivers), which are currently achieved, are designed as follows to cope with reduction in volume of a case. In order to reduce the mounting area of the optical module, the optical module includes a transmission system including one 4-channel TOSA in which four semiconductor lasers and an optical system including an optical multiplexer are integrated, and one driver IC in which four driver circuits and four CDR circuits are integrated. The 4-channel TOSA requires, as a package, a hermetic package including metal and multilayer ceramic, and is thus relatively expensive, resulting in a difficulty in reduction in price of optical modules. Meanwhile, reduction in price of optical modules of the 10 Gbit/s class compliant with the SFP+MSA standard and the XFP MSA standard has been progressed, with the result that most of products in a mature phase use a TO-CAN structure as a package, that is, employ low-price TOSAs having one semiconductor laser mounted thereon. It is strongly desired to apply TO-CAN type TOSAs, which are capable of being reduced in price, also to optical modules in the 100 Gbit/s class in view of reduction in cost of the optical modules.

In the optical module 2 according to the first embodiment, as illustrated in FIG. 5B, the four TO-CAN type TOSAs are arranged in the two lines, namely, the upper line and the lower line. With this arrangement, the components can be mounted in the case 61 compliant with the QSFP28 MSA standard. As described above, half of the differential transmission lines connecting the respective output terminals of the IC 68 and the four TO-CAN type TOSAs 65A, 65B, 65C, and 65D to each other include the stacking-direction differential transmission line extending in the stacking direction. There can be provided a structure in which the differential transmission lines, which have a low impedance of a differential impedance of from 40Ω to 60Ω, desirably 50Ω, are connected while a very small reflection amount of signals is achieved so that the sufficiently satisfactory quality of optical modulated output may be maintained. Thus, an optical module suitable for reduction in cost and size and increase in density can be achieved. The printed circuit board 31 according to the first embodiment is therefore preferred.

Further, in the QSFP28 MSA standard, an optical module has a specification in which, as external connection terminals, terminals for two transmission channels and two reception channels are arranged on the upper surface of a printed circuit board, and terminals for two transmission channels and two reception channels are arranged on the lower surface of the printed circuit board. An IC in which four CDR circuits for four channels are integrated is desirably used in order to cope with high density arrangement in a printed circuit board. In this case, half of differential transmission lines connecting input terminals and external connection terminals of transmission ICs (CDR circuits) to each other, and differential transmission lines connecting output terminals and external connection terminals of reception ICs (CDR circuits) to each other include a stacking-direction differential transmission line extending in a stacking direction. The printed circuit board 31 according to the first embodiment is therefore preferred.

In the printed circuit board 31 according to the first embodiment, the plurality of ground vias 103 (four ground vias 118A, 118B, 118C, and 118D) are arranged so as to surround the differential signal via pair 101. Hence, the generation of unnecessary electromagnetic waves due to the differential signal via pair 101 can be suppressed to a sufficiently low level, leading to suppression of crosstalk between the plurality of channels having the signal vias. As a result, when a plurality of channels having signal vias are arranged on a printed circuit board, according to the printed circuit board 31 of the first embodiment, degradation of the quality of a driver output signal due to crosstalk between the channels can be suppressed, and the sufficiently satisfactory quality of an optical modulated signal output from the optical transmitter unit 23A can be maintained. In particular, the printed circuit board 31 according to the first embodiment provides a marked effect when using a DFB-LD as the light-emitting element.

The printed circuit board 31 according to the first embodiment is produced by a technology of producing a printed circuit board having a multi-layer structure, which has been widely diffused and is excellent in terms of cost and mass productivity. The first conductor plate and the second conductor plate of each of the plurality of conductor plate pairs 102 have the shape that expands outward from the rim of the differential signal via pair 101. Thus, the holes can be formed by the drill in a high yield also in views of the outer diameter and precision of the drill. The differential signal via pair 101 from the layer 2 to the layer 9 is formed by the drill, which achieves reduction in complication, time, and cost of the production process.

In the first embodiment, the materials of the dielectric layers 127 and 138 have the dielectric constant of 3.5 and include a glass fabric base material and epoxy resin, but the present invention is not limited thereto and the value of the dielectric constant is not limited to the above-mentioned value. For example, FR4 or FR5 that is representative and relatively inexpensive and has a dielectric constant of from 4.0 to 4.8 may be used as the material. Further, in order to reduce loss at a high frequency, a material that includes a glass fabric base material and polytetrafluoroethylene (PTFE) and has a dielectric constant of from 2.0 to 2.3 may be used.

In the printed circuit board 31 according to the first embodiment, the plurality of conductor plate pairs 102 have the same shape (wiring pattern shape). In terms of facilitating designing, the plurality of conductor plate pairs 102 desirably have the same shape to reduce the number of design parameters. However, the plurality of conductor plate pairs 102 may not be limited to the ones having the same shape. As long as the first conductor plate and the second conductor plate of each of the plurality of conductor plate pairs 102 satisfy the above-mentioned conditions, the plurality of conductor plate pairs 102 may have different shapes between the layers.

The inventors of the present invention have examined the mechanism of the stacking-direction differential transmission line 32 of the printed circuit board 31 according to the first embodiment. The mechanism is described below. First, an effective shape of an optimal differential via structure for reducing impedance is considered. The optimal differential via structure has a certain cross-sectional shape and an infinite length. In the optimal differential via structure, a differential via is a pair of conductor posts. However, when a signal that is transmitted through a differential transmission line has a frequency component within a range of from 10 GHz to 25 GHz, a thickness that an electromagnetic wave penetrates (skin depth) is sufficiently smaller than the thickness of a via hole in general. Thus, the conductor post and the via hole have substantially no characteristic difference.

Figure 20A:
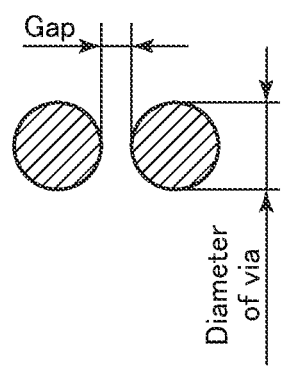
FIG. 20A is a cross-sectional view of a differential via structure according to Comparative Example 1.
Figure 20B:
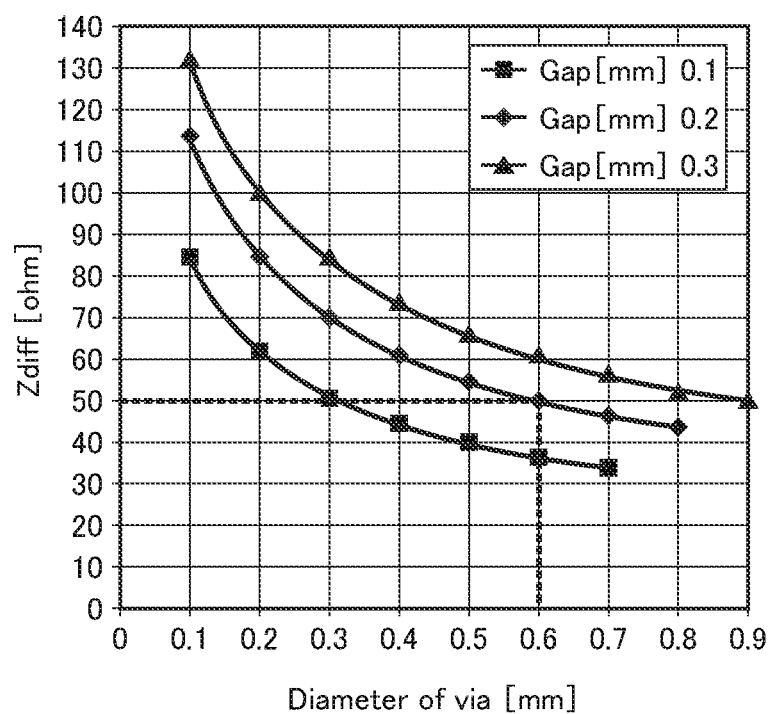
FIG. 20B is a graph for showing the characteristic impedance of the differential via structure according to Comparative Example 1.

FIG. 20A is a cross-sectional view of a differential via structure according to Comparative Example 1, and FIG. 20B is a graph for showing a characteristic impedance $Z_{diff}$ of the differential via structure according to Comparative Example 1. The differential via structure according to Comparative Example 1 has a circular shape in section, and the circles of two vias have the same diameter $D_v$ (diameter of via). The minimum distance between the two vias is a gap Gap. In FIG. 20B, calculation results of the characteristic impedance $Z_{diff}$ of the differential via structure according to Comparative Example 1 in the differential mode are shown. The characteristic impedances $Z_{diff}$ with different diameters $D_v$ when the gap Gap is 0.1 mm, 0.2 mm, or 0.3 mm are shown. The differential via structure according to Comparative Example 1 corresponds to general drill vias. Here, the following are assumed. The via is an optimal metal (good conductor), the via is surrounded by a dielectric having a dielectric constant 3.5, and no ground conductor is located around the via. The value of the characteristic impedance $Z_{diff}$ is calculated with an electromagnetic analysis tool.

In order to reduce the characteristic impedance $Z_{diff}$ of the differential via structure according to Comparative Example 1, as shown in FIG. 20B, it is conceivable to take a method of reducing the gap Gap between the vias, or a method of increasing the diameter $D_v$ of the two vias. A characteristic impedance $Z_{diff}$ of 50Ω may be achieved with, for example, a gap Gap of 0.2 mm and a diameter $D_v$ of the via of 0.6 mm. However, it is understood that in order to increase the diameter $D_v$ of the via to 0.6 mm, a relatively large area is required, resulting in a difficulty in high density. If the gap Gap between the vias can further be reduced, according to calculations, the characteristic impedance $Z_{diff}$ of 50Ω can be obtained with a smaller diameter $D_v$ of the via. However, in the production process of printed circuit boards, a material including a glass fabric base material and epoxy resin, which is filled into a gap, is easily broken by drill processing. Thus, further reduction in gap Gap is not realistic, and very difficult to achieve. Further, the gradients of the curves shown in FIG. 20B are gentle, and hence a change amount of the characteristic impedance $Z_{diff}$ due to increase in diameter $D_v$ of the via is small. In order to achieve an impedance less than 50Ω, for example, a characteristic impedance $Z_{diff}$ of 40Ω, the diameter $D_v$ of the via is required to be 0.9 mm or more. It is therefore difficult to achieve low impedance in the differential via structure according to Comparative Example 1.

Figure 21A:
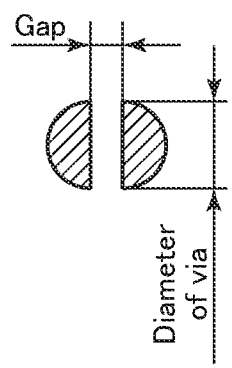
FIG. 21A is a cross-sectional view of a differential via structure according to Comparative Example 2.
Figure 21B:
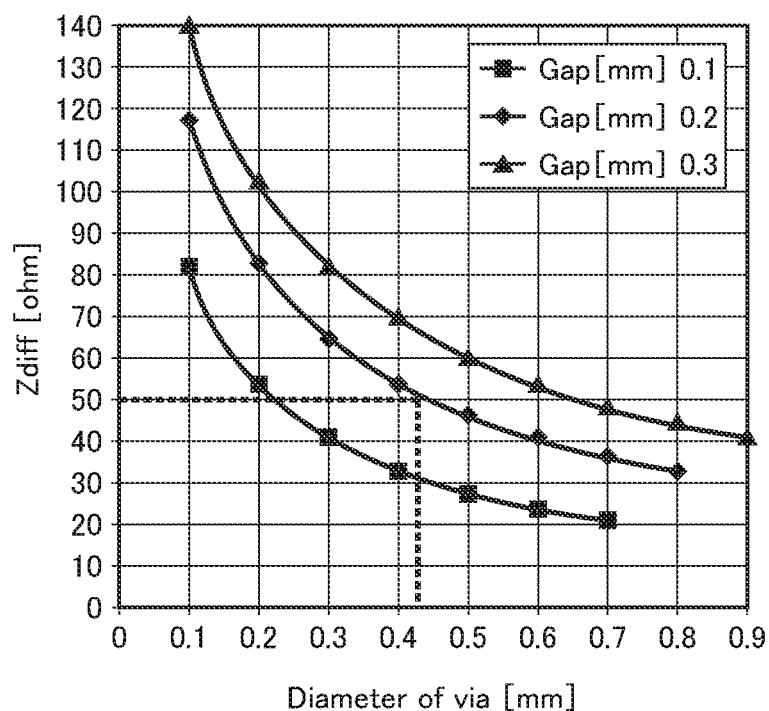
FIG. 21B is a graph for showing the characteristic impedance of the differential via structure according to Comparative Example 2.

FIG. 21A is a cross-sectional view of a differential via structure according to Comparative Example 2, and FIG. 21B is a graph for showing the characteristic impedance $Z_{diff}$ of the differential via structure according to Comparative Example 2. Whether it is possible to achieve low impedance by devising the cross-sectional shape of the differential via structure is considered. Based on consideration of conceptual directions indicated by the Biot-Savart law, one of the following is required. (1) A conductor cross section (average radius) is increased to reduce a self inductance. (2) A distance between the geometrical centers of gravity of conductor cross sections is reduced to increase a mutual inductance. It is understood that, in accordance with the rule (2), portions where two vias are opposed to each other are advantageously straight lines extending in parallel to each other. As illustrated in FIG. 21A, in the differential via structure according to Comparative Example 2, the cross section of a via is a semicircular shape. Two vias are opposed to each other in the diameter portions of the semicircles. In FIG. 21B, calculation results of the characteristic impedance $Z_{diff}$ of the differential via structure according to Comparative Example 2 in the differential mode are shown. The characteristic impedances $Z_{diff}$ with different diameters $D_v$ when the gap Gap is 0.1 mm, 0.2 mm, or 0.3 mm are shown.

A characteristic impedance $Z_{diff}$ of 50Ω may be achieved with, for example, a gap Gap of 0.2 mm and a diameter $D_s$ (diameter of via) of the semicircle of the via of 0.42 mm. The whole size of the differential via structure according to Comparative Example 2 can be reduced compared to Comparative Example 1. Further, the gradients of the curves shown in FIG. 21B are larger than the gradients of the curves shown in FIG. 20B, and a change amount of the characteristic impedance $Z_{diff}$ due to increase in diameter $D_s$ of the semicircle of the via is increased. For example, a characteristic impedance $Z_{diff}$ of 40Ω may be achieved with the diameter $D_s$ of the semicircle of the via increased to 0.6 mm. In this way, the portions that are opposed to each other are the straight lines extending in parallel to each other, which is advantageous for reduction in size of the differential via structure, and increase in mounting density.

In regard to the differential via structure according to Comparative Example 1 illustrated in FIG. 20A, as parallel lines, an approximate expression for obtaining characteristic impedance is widely known. However, when the structure of Comparative Example 1 that is suitable for low impedance is obtained, in the region shown in FIG. 20B, the structure has a size with which the assumption by the approximate expression is not satisfied. Thus, attention needs to be paid to a large error when the approximate expression is used. It is suitable to calculate characteristic impedance using an electromagnetic field analysis tool.

Based on the consideration made on the differential via structures according to Comparative Example 1 and Comparative Example 2, the structural differences of the cross-sectional shapes are compared to each other on a stacking-direction differential transmission line connecting a first differential transmission line (upper surface side) and a second differential transmission line (lower surface side) to each other on an actual printed circuit board. The comparison results are now described. Similarly to the printed circuit board 31 according to the first embodiment, the first differential transmission line is arranged in a first layer and a second layer, and the second differential transmission line is arranged in a third layer and a fourth layer. The first differential transmission line includes a first strip conductor pair (first layer), and a first ground conductor layer (second layer) having a first through hole 219. In a similar manner, the second differential transmission line includes a second strip conductor pair (fourth layer), and a second ground conductor layer (third layer) having a second through hole. The differential impedance of each of the first differential transmission line and the second differential transmission line is 50Ω.

Figure 22A:
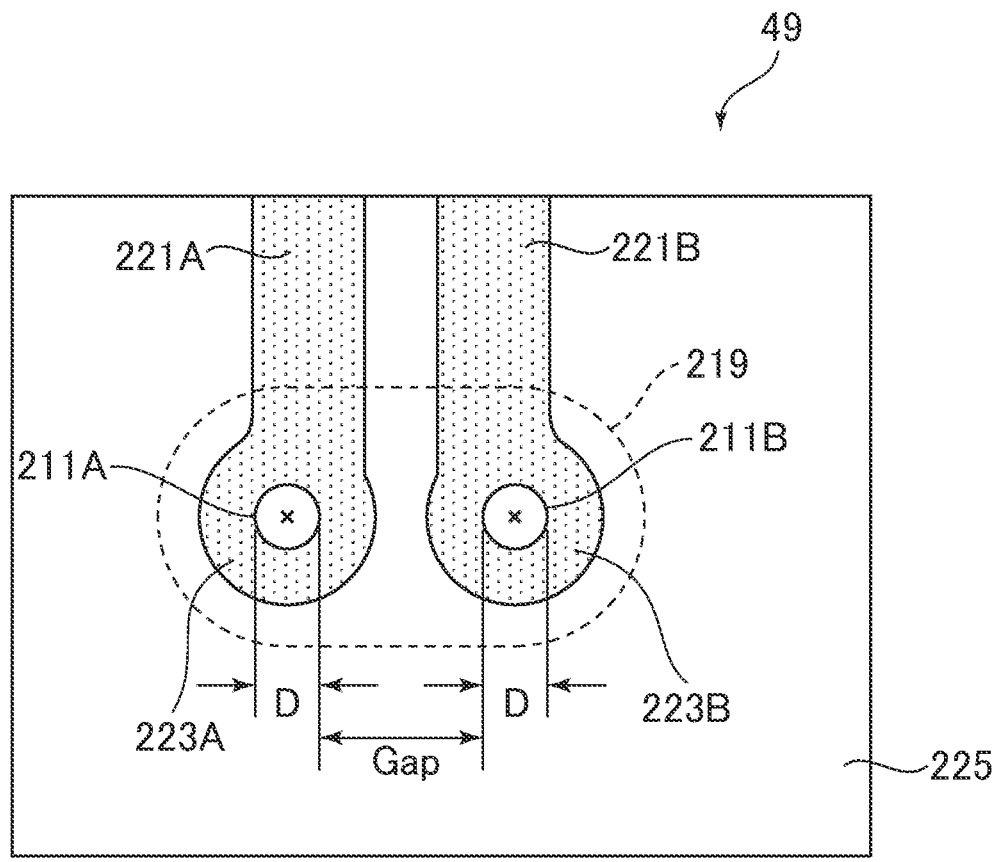
FIG. 22A is a schematic plan view for illustrating part of the structure of the printed circuit board according to Comparative Example 1.
Figure 22B:
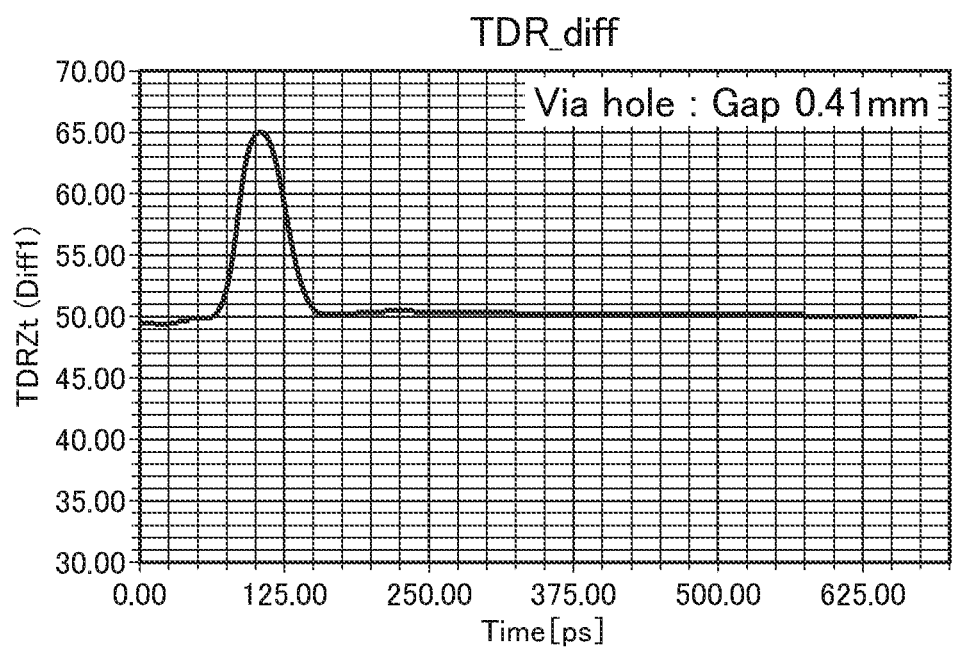
FIG. 22B is a graph for showing the characteristics of a differential transmission line included in the printed circuit board according to Comparative Example 1.
Figure 22C:
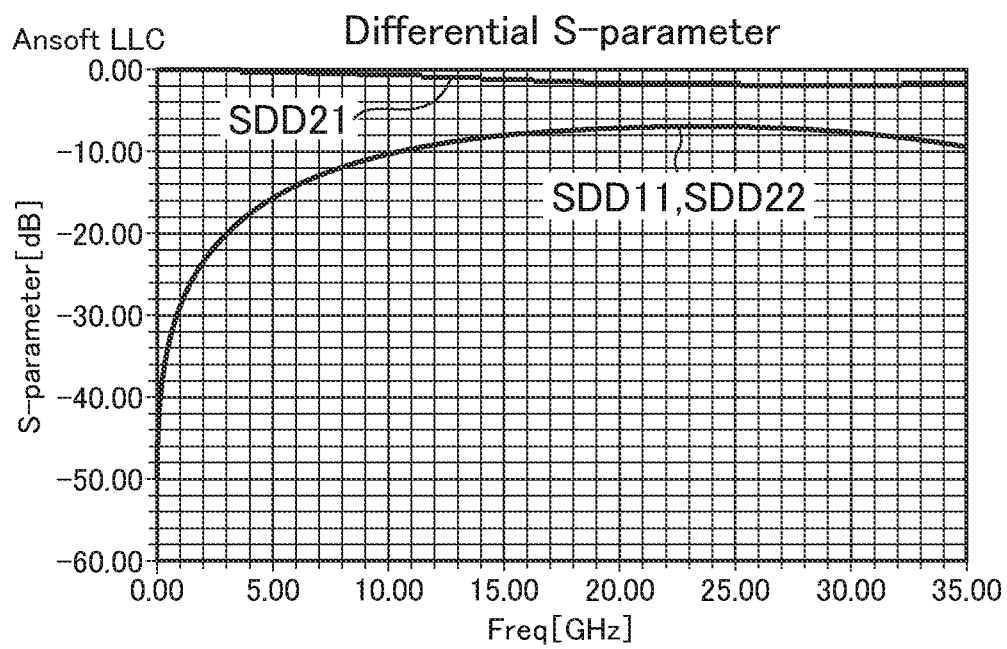
FIG. 22C is a graph for showing the characteristics of the differential transmission line included in the printed circuit board according to Comparative Example 1.

FIG. 22A is a schematic plan view for illustrating part of the structure of a printed circuit board 49 according to Comparative Example 1. FIG. 22B and FIG. 22C are graphs for showing the characteristics of a differential transmission line included in the printed circuit board 49 according to Comparative Example 1. A stacking-direction differential transmission line includes a differential signal via pair (first signal via 211A and second signal via 211B), and four ground vias. The first signal via 211A and the second signal via 211B are general vias formed by the drill. The two vias have a circular shape having a diameter $D_v$ of 0.20 mm in section. The gap Gap of the differential signal via pair is the minimum distance based on manufacturing rules generally used among printed circuit board manufacturers, and the gap Gap is 0.41 mm. The first strip conductor pair includes strip conductors 221A and 221B and land portions 223A and 223B connected to the differential signal via pair. A solder resist layer 225 is arranged so as to cover the first strip conductor pair.

FIG. 22B is a graph of an impedance profile in the differential mode that is obtained by TDR using three-dimensional electromagnetic field analysis. It is shown that, while the differential impedance of each of the first differential transmission line and the second differential transmission line arranged on the upper surface and the lower surface of the printed circuit board 49 is 50Ω, the impedance greatly fluctuates due to the arrangement of the stacking-direction differential transmission line, and the impedance is high. FIG. 22C is a graph for showing the frequency characteristics of differential reflection characteristics and differential transmission characteristics that are obtained by S-parameter analysis. The differential reflection coefficients SDD11 and SDD22 indicate values of −20 dB or less in a frequency range of from 0 Hz to 3 GHz, which is quite narrow range, with the result that sufficient characteristics cannot be obtained. The value of the differential reflection coefficients SDD11 and SDD22 is deteriorated to −10 dB or more at a frequency of 11 GHz or more. Even when the diameter $D_v$ of the circle of the via was increased, only the area of the differential signal via pair was increased, and the impedance was not sufficiently reduced.

Figure 23A:
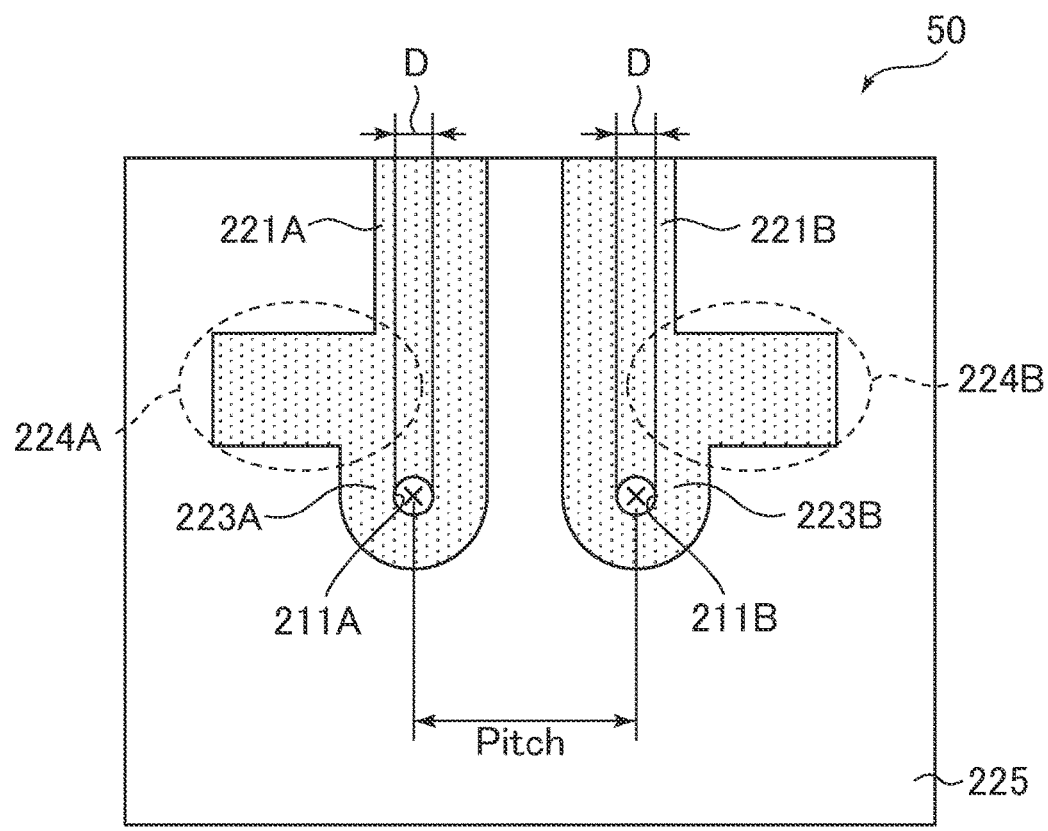
FIG. 23A is a schematic plan view for illustrating part of the structure of the printed circuit board according to Comparative Example 2.
Figure 23B:
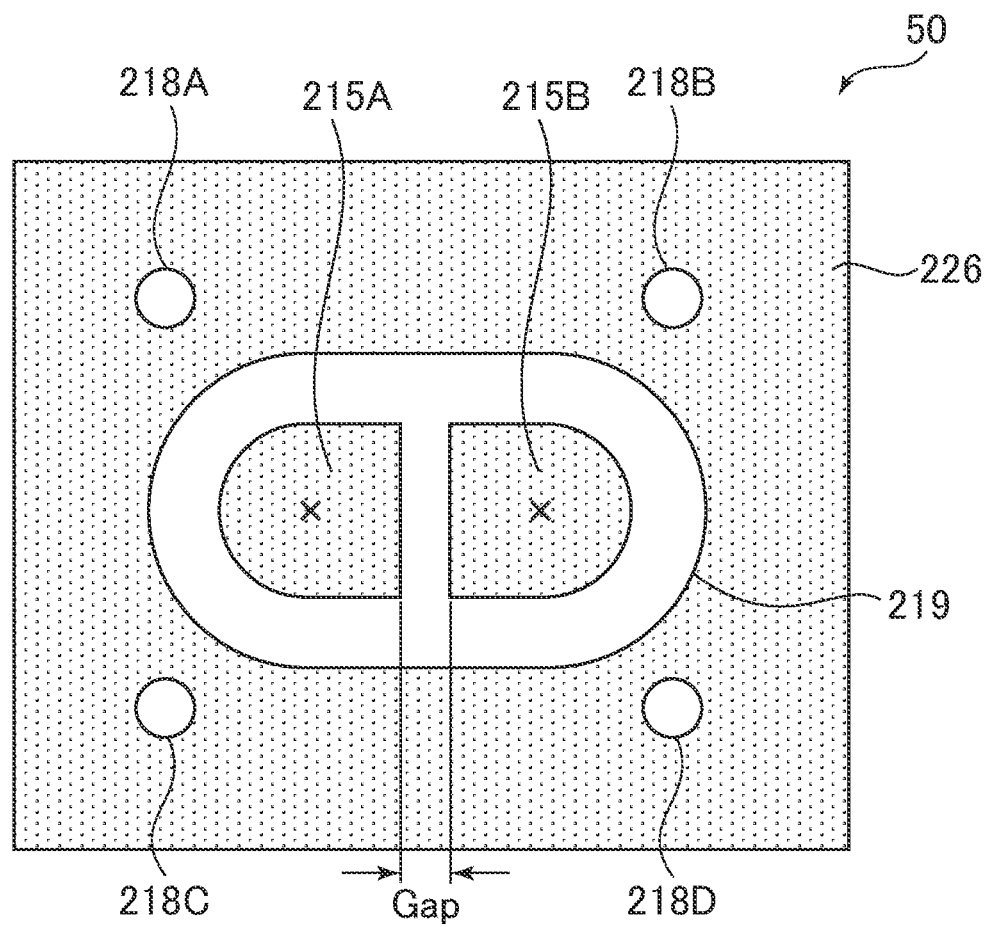
FIG. 23B is a schematic plan view for illustrating part of the structure of the printed circuit board according to Comparative Example 2.
Figure 23C:
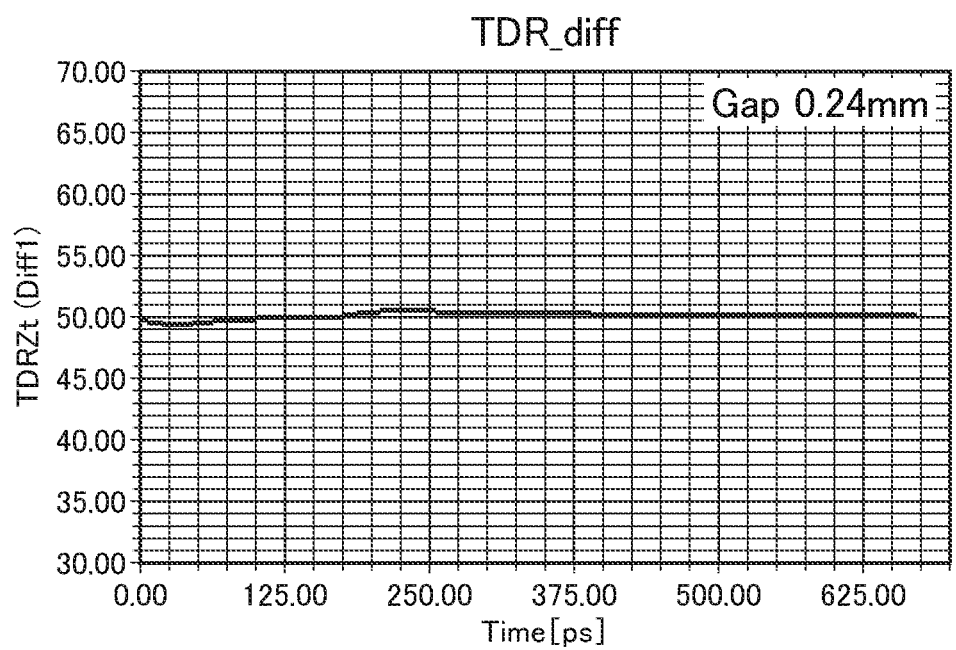
FIG. 23C is a graph for showing the characteristics of a differential transmission line included in the printed circuit board according to Comparative Example 2.
Figure 23D:
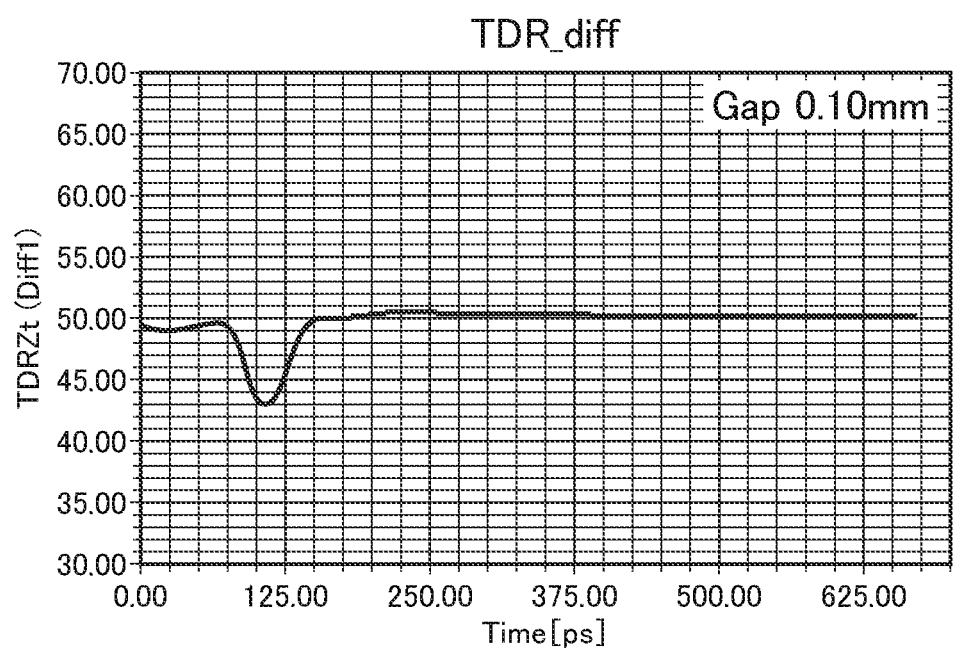
FIG. 23D is a graph for showing the characteristics of the differential transmission line included in the printed circuit board according to Comparative Example 2.

FIG. 23A and FIG. 23B are schematic plan views for illustrating part of the structure of a printed circuit board 50 according to Comparative Example 2. FIG. 23C and FIG. 23D are graphs for showing the characteristics of a differential transmission line included in the printed circuit board 50 according to Comparative Example 2. A stacking-direction differential transmission line includes a differential signal via pair and four ground vias 218A, 218B, 218C, and 218D. Unlike Comparative Example 1, in the differential signal via pair, a pair of conductor posts (conductor posts 215A and 215B) is arranged between a second layer and a third layer, and a first signal via 211A and a second signal via 211B are arranged between a first layer and the second layer. The first signal via 211A and the second signal via 211B have a diameter D of 0.1 mm. The same is true between the third layer and a fourth layer. The cross-sectional shape of the pair of conductor posts is the same as the shapes of the plurality of conductor plate pairs 102 according to the first embodiment. As illustrated in FIG. 23B, the shape of each of the conductor posts 215A and 215B of the pair of conductor posts is a shape obtained by dividing, by the gap Gap, a shape obtained by connecting two semicircles and a rectangle connecting the two semicircles to each other. The two semicircles extend outward (both sides in the lateral direction of FIG. 23B) about centers away from each other by 0.61 mm, and have a diameter of 0.45 mm. The first strip conductor pair includes the strip conductors 221A and 221B, the land portions 223A and 223B connected to the differential signal via pair, and first open stub portions 224A and 224B.

FIG. 23C and FIG. 23D are graphs for showing the characteristics of the differential transmission line included in the printed circuit board 50 according to Comparative Example 2. Both of FIG. 23C and FIG. 23D are graphs of impedance profiles in the differential mode that are obtained by TDR using three-dimensional electromagnetic field analysis. In FIG. 23C and FIG. 23D, a case where the gap Gap is set to 0.24 mm, and a case where the gap Gap is set to 0.10 mm are shown, respectively. As shown in FIG. 23C, when the gap Gap is 0.24 mm, the impedance hardly fluctuates due to the differential transmission line including the stacking-direction differential transmission line, and satisfactory characteristics are obtained. Further, as shown in FIG. 23D, when the gap Gap is reduced to 0.10 mm, the impedance of the stacking-direction differential transmission line can be reduced to a value less than 50Ω. The differential signal via including the conductor posts having the above-mentioned cross-sectional shape is advantageous for reduction in size of the stacking-direction differential transmission line, and increase in mounting density. However, a technology for applying the above-mentioned structure to a printed circuit board has not existed. It requires time and investment to realize such a technology, and the prospect of reduction in manufacturing cost remains uncertain.

The inventors of the present invention have combined, based on the consideration, the stacking-direction differential transmission line according to Comparative Example 1 and the stacking-direction differential transmission line according to Comparative Example 2, to thereby arrive at the differential signal via pair 101 and the plurality of conductor plate pairs 102 of the stacking-direction differential transmission line 32 according to the first embodiment. It has been found that the differential impedance is matched with 50Ω by cancelling the high impedance characteristics shown in FIG. 22B and the low impedance characteristics shown in FIG. 23D each other. As described above, the plurality of conductor plate pairs 102 are formed by the technology of producing a printed circuit board having a multi-layer structure, which has been widely diffused and is excellent in terms of cost and mass productivity, and the differential signal via pair 101 (the portions thereof from the layer L2 to the layer L9) is formed by the drill.

The contour of the first conductor plate and the contour of the second conductor plate of each of the plurality of conductor plate pairs 102 are located on the outer sides of the rim of the first signal via 111A and the rim of the second signal via 111B. The contribution of each of the first conductor plate and the second conductor plate to a self inductance L is small. A mutual inductance M is approximately determined by a distance between the centers of gravity. The center of gravity of the first conductor plate and the center of gravity of the second conductor plate are located on the inner sides of the center of gravity $G_0$ of the first signal via 111A and the center of gravity $G_0$ of the second signal via 111B, respectively, with respect to the centerline CL2. Thus, the mutual inductance M is increased due to the plurality of conductor plate pairs 102. As a result, compared to a case where the plurality of conductor plate pairs 102 are not arranged, in the stacking-direction differential transmission line 32 according to the first embodiment, the combined inductance 2L−M expressed in Expression 1 is reduced, and hence the differential impedance can be reduced. Further, the differential impedance can be reduced by reducing the gap Gap between the portions of the first conductor plate and the second conductor plate that are opposed to each other across the centerline CL2 to increase the length $W_f$ of the opposed portions.

The shape of the first conductor plate and the shape of the second conductor plate of each of the plurality of conductor plate pairs 102 are a region between the rim of the first signal via 111A and the contour of the first conductor plate, and a region between the rim of the second signal via 111B and the contour of the second conductor plate, respectively. Strictly speaking, the center of gravity of the first conductor plate and the center of gravity of the second conductor plate, which approximately determine the mutual inductance M, differ from the center of gravity $G_1$ of the contour of the first conductor plate and the center of gravity $G_1$ of the contour of the second conductor plate, respectively. However, when the center of gravity $G_1$ of the contour of the first conductor plate and the center of gravity $G_1$ of the contour of the second conductor plate are located on the inner sides of the center of gravity $G_0$ of the first signal via 111A and the center of gravity $G_0$ of the second signal via 111B, respectively, with respect to the centerline CL2, the center of gravity of the first conductor plate and the center of gravity of the second conductor plate are always located on the inner sides of the center of gravity $G_0$ of the first signal via 111A and the center of gravity $G_0$ of the second signal via 111B, respectively, with respect to the centerline CL2. Further, in such a case, the area of the region of the first conductor plate that is located on the inner side of a straight line that passes through the center of gravity $G_0$ of the first signal via 111A and extends in parallel to the centerline CL2 is larger than the area of the region of the first conductor plate that is located on the outer side of the straight line. The area of the region of the second conductor plate that is located on the inner side of a straight line that passes through the center of gravity $G_0$ of the second signal via 111B and extends in parallel to the centerline CL2 is larger than the area of the region of the second conductor plate that is located on the outer side of the straight line.

Second Embodiment

Figure 6A:
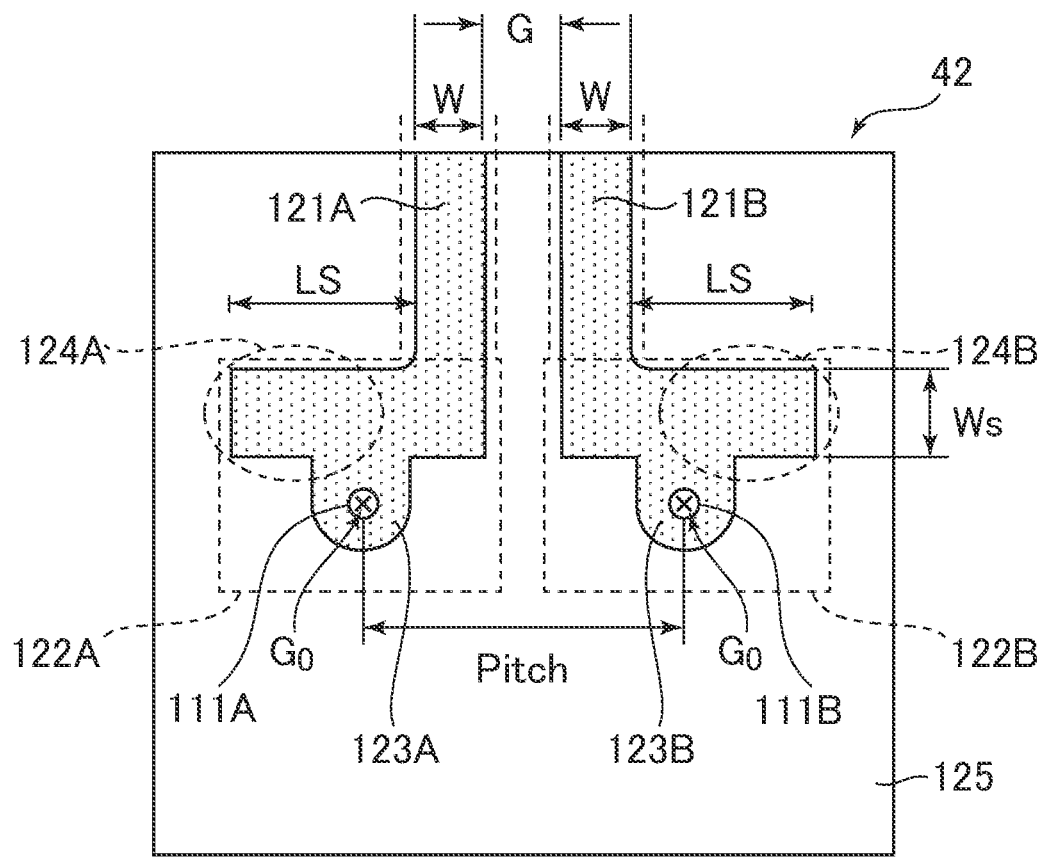
FIG. 6A is a schematic plan view for illustrating part of the structure of a printed circuit board according to a second embodiment of the present invention.
Figure 6B:
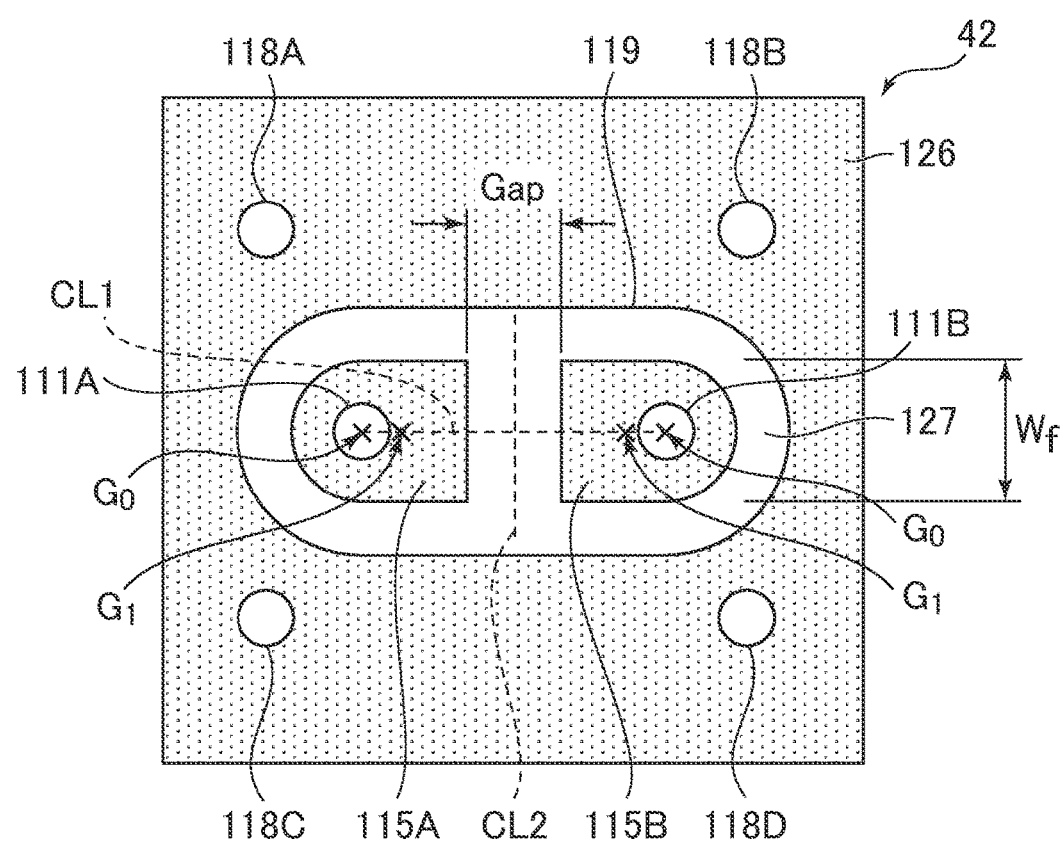
FIG. 6B is a schematic plan view for illustrating part of the structure of the printed circuit board according to the second embodiment of the present invention.

FIG. 6A and FIG. 6B are schematic plan views for illustrating part of the structure of a printed circuit board 42 according to a second embodiment of the present invention. The printed circuit board 42 according to the second embodiment has the same structure as that of the printed circuit board 31 according to the first embodiment except that the shapes and dimensions of a differential transmission line included in the printed circuit board 42 according to the second embodiment differ from those of the first embodiment. The optical module 2 according to the second embodiment includes the printed circuit board 42 as the printed circuit board 21. A desired differential impedance can be obtained by increasing or reducing the gap Gap illustrated in FIG. 6B. Here, it is described that connection having satisfactory characteristics is achieved with at least a differential transmission line having a differential impedance value within a range of from 50Ω to 60Ω. The differential impedance of the differential transmission line according to the second embodiment is 60Ω.

FIG. 6A corresponds to FIG. 3A, and is an illustration of the wiring pattern of the first layer (layer L1). FIG. 6B corresponds to FIG. 3B, and is an illustration of the wiring pattern of the second layer (layer L2). The strip conductor width W is set to 0.218 mm, and the strip conductor gap G is set to 0.20 mm so that the differential impedance of each of the first differential transmission line 33 and the second differential transmission line 34 may be 60Ω. The open stub conductor width Ws is 0.25 mm, and the open stub conductor length LS is 0.587 mm. The differential impedance of the stacking-direction differential transmission line 32 can be set to 60Ω by increasing the gap Gap to 0.24 mm.

Figure 7A:
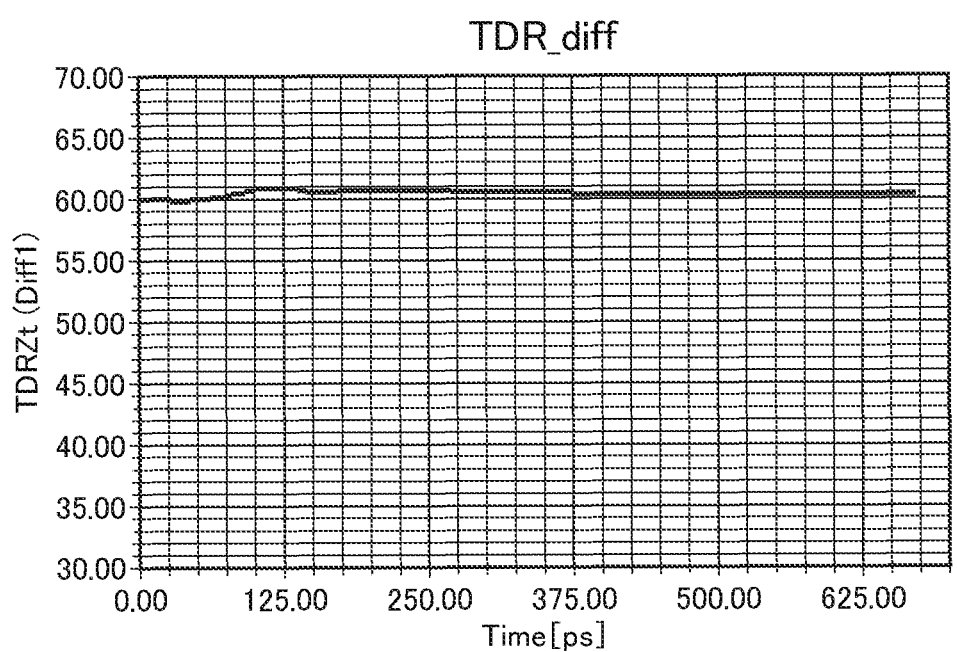
FIG. 7A is a graph for showing the characteristics of a differential transmission line included in the printed circuit board according to the second embodiment of the present invention.
Figure 7B:
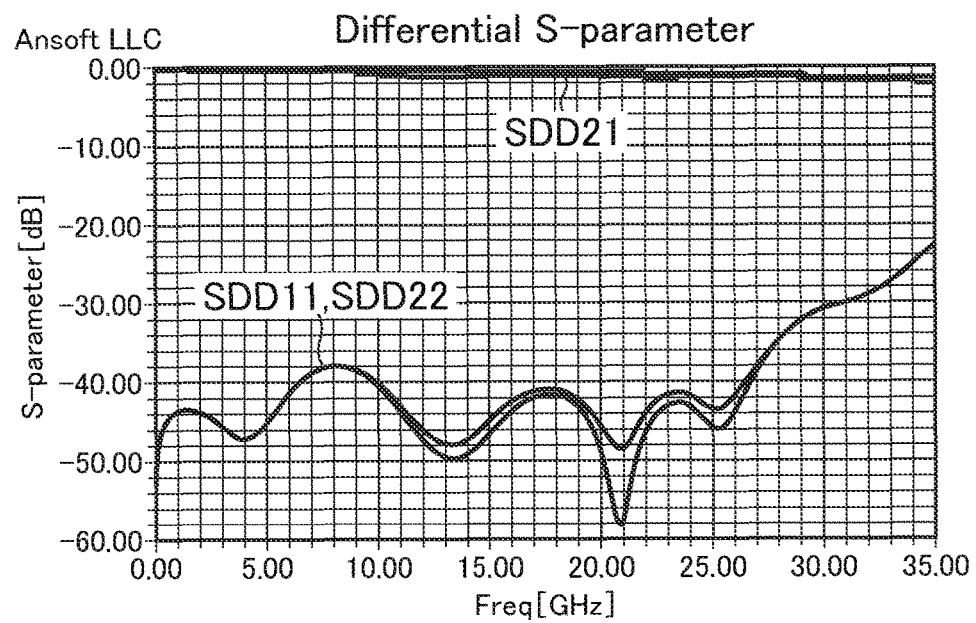
FIG. 7B is a graph for showing the characteristics of the differential transmission line included in the printed circuit board according to the second embodiment of the present invention.

FIG. 7A and FIG. 7B are graphs for showing the characteristics of the differential transmission line included in the printed circuit board 42 according to the second embodiment. FIG. 7A is a graph of an impedance profile in the differential mode that is obtained by TDR using three-dimensional electromagnetic field analysis. It is shown that, while the differential impedance of each of the first differential transmission line 33 and the second differential transmission line 34, which are arranged on the upper surface and the lower surface of the printed circuit board 42, respectively, is 60Ω, the differential transmission line according to the second embodiment has, despite including the stacking-direction differential transmission line 32, almost no fluctuation in impedance due to the stacking-direction differential transmission line 32.

FIG. 7B is a graph for showing the frequency characteristics of differential reflection characteristics and differential transmission characteristics that are obtained by S-parameter analysis. In a wide frequency range of from 0 Hz to 35 GHz, the differential reflection coefficients SDD11 and SDD22 indicate values of −20 dB or less, and sufficient characteristics can be obtained. In addition, in a frequency range of from 0 Hz to 31 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. As a result, in the differential transmission line according to the second embodiment, even the differential impedance of the stacking-direction differential transmission line 32 can be set to a value close to 60Ω.

In the printed circuit board 42 according to the second embodiment, the gap Gap is increased to 0.24 mm, and hence the center of gravity $G_1$ of the first conductor plate and the center of gravity $G_1$ of the second conductor plate of each of the plurality of conductor plate pairs 102 are moved outward (on both of the left and right sides of FIG. 6B) with respect to the centerline CL2, compared to the first embodiment. It is conceivable that the differential impedance is increased to 60Ω because the mutual inductance M due to the plurality of conductor plate pairs 102 is reduced, and the combined inductance 2L−M expressed by Expression 1 is increased.

The printed circuit board 42 according to the second embodiment is preferred because of the following reason. When a differential transmission line connecting a driver output terminal of a driver circuit whose termination resistance is 30Ω and a light-emitting element to each other is included, the sufficiently satisfactory quality of an optical modulated signal can be maintained. In particular, a marked effect is provided for a case where a DFB-LD is used as the light-emitting element. In the second embodiment, the differential impedance value of the differential transmission line is set to 60Ω, but the present invention is not limited thereto. The impedance value of the stacking-direction differential transmission line can be changed at least within a range of from 50Ω to 60Ω by adjusting the value of the gap Gap within a range of from 0.10 mm to 0.24 mm.

Third Embodiment

Figure 8A:
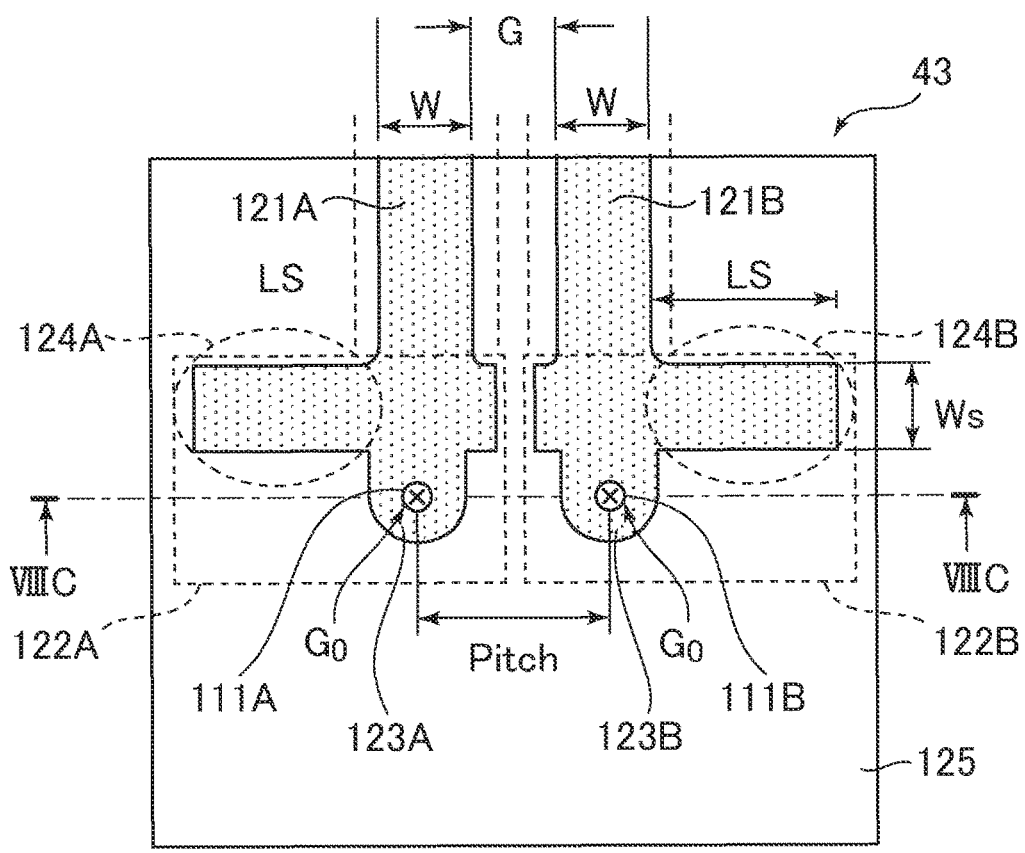
FIG. 8A is a schematic plan view for illustrating part of the structure of a printed circuit board according to a third embodiment of the present invention.
Figure 8B:
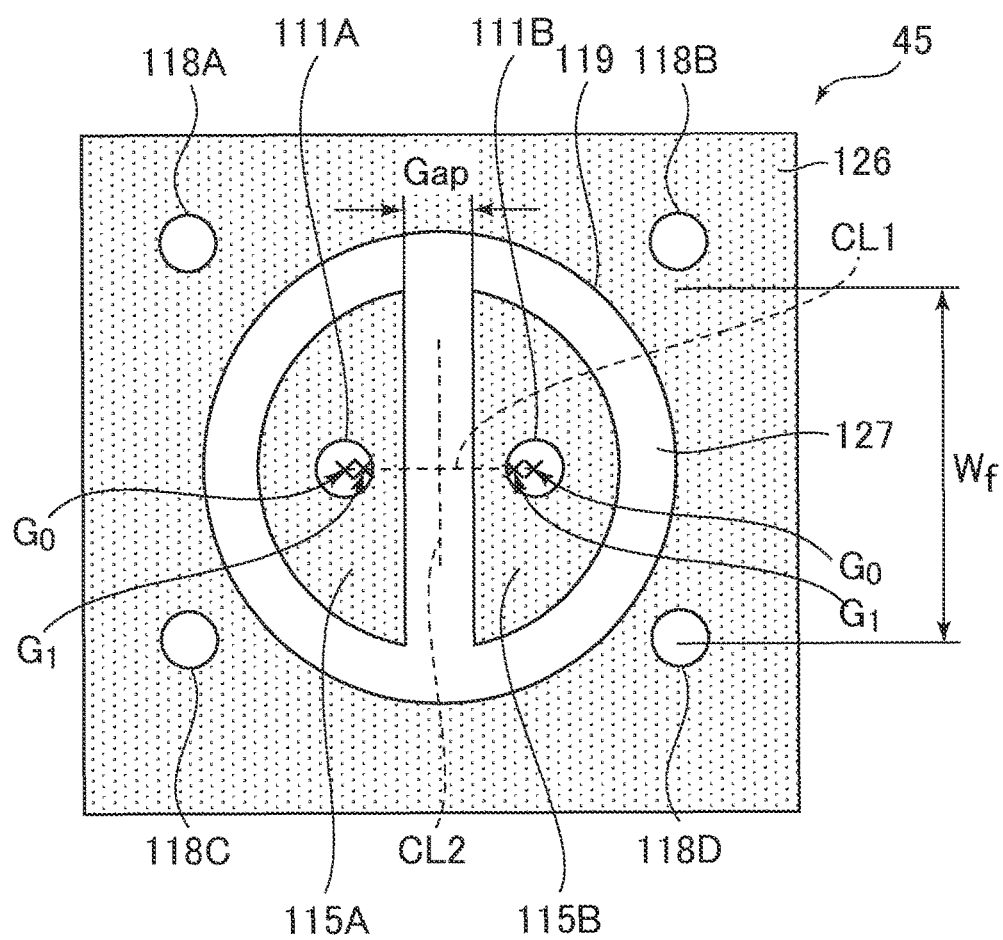
FIG. 8B is a schematic plan view for illustrating part of the structure of the printed circuit board according to the third embodiment of the present invention.
Figure 8C:
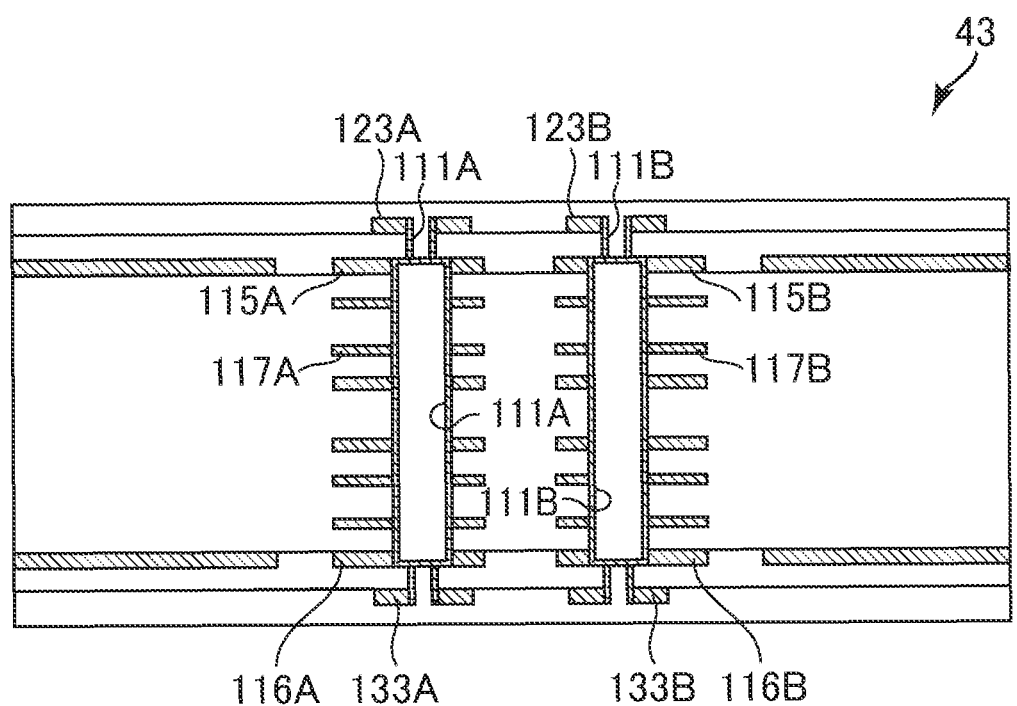
FIG. 8C is a schematic cross-sectional view for illustrating part of the printed circuit board according to the third embodiment of the present invention.

FIG. 8A and FIG. 8B are schematic plan views for illustrating part of the structure of a printed circuit board 43 according to a third embodiment of the present invention. FIG. 8C is a schematic cross-sectional view for illustrating part of the printed circuit board 43 according to the third embodiment. FIG. 8C is an illustration of a cross section taken along the line VIIIC-VIIIC of FIG. 8A. The printed circuit board 43 according to the third embodiment has the same structure as that of the printed circuit board 31 according to the first embodiment except for the following points. The shape of each of the plurality of conductor plate pairs 102 of a differential transmission line included in the printed circuit board 43 according to the third embodiment differs from that of the first embodiment. Correspondingly, the shapes of the first strip conductor pair 104, the second strip conductor pair 105, the first through hole 119, and the second through hole 129 differ from those of the first embodiment. The optical module 2 according to the third embodiment includes the printed circuit board 43 as the printed circuit board 21. The differential impedance of the differential transmission line according to the third embodiment is 50Ω.

FIG. 8A corresponds to FIG. 3A, and is an illustration of the wiring pattern of the first layer (layer L1). FIG. 8B corresponds to FIG. 3B, and is an illustration of the wiring pattern of the second layer (layer L2). FIG. 8C corresponds to FIG. 3C, and is an illustration of the cross-sectional structure. As illustrated in FIG. 8B, the contour of each of the first conductor plate 115A and the second conductor plate 115B has a shape obtained by dividing, by a gap Gap of 0.22 mm, a circular shape having a diameter of 1.06 mm with the centerline CL2 being a centerline. Similarly to the first embodiment, the diameter D of each of the first signal via 111A and the second signal via 111B in the second layer (layer L2) is 0.2 mm. Further, as described later, the center-to-center distance Pitch between the first signal via 111A and the second signal via 111B is 0.61 mm, and the gap Gap is smaller than the minimum distance (Pitch-D) between the first signal via 111A and the second signal via 111B.

In each of the plurality of conductor plate pairs 102, with respect to the centerline CL2, the center of gravity $G_1$ of the contour of the first conductor plate is located on the inner side of the center of gravity $G_0$ of the first signal via 111A, and the center of gravity $G_1$ of the contour of the second conductor plate is located on the inner side of the center of gravity $G_0$ of the second signal via 111B. The width of the contour of the first conductor plate (second conductor plate) is zero at the start and gradually increased (monotonically increased) from the outer side to the inner side. The first conductor plate and the second conductor plate are opposed to each other across the centerline CL2, and the opposed portions of the contour of the first conductor plate and the contour of the second conductor plate linearly extend along the perpendicular bisector (centerline CL2). The length $W_f$ of the straight portions of the first conductor plate 115A and the second conductor plate 115B that are opposed to each other is 1.037 mm. In the third embodiment, although the length $W_f$ is greatly increased to 1.037 mm and the gap Gap is increased to 0.22 mm compared to the first embodiment, the differential impedance can be set to 50Ω.

The shape of the first through hole 119 is a circular shape having a diameter of 1.41 mm and a center being the intersection between the centerline CL1 and the centerline CL2. A gap between the contour of the first through hole 119 and the contour of the first conductor plate pair 115 (conductor plates 115A and 115B) is set to 0.175 mm.

As illustrated in FIG. 8A, the center-to-center distance Pitch between the first signal via 111A and the second signal via 111B is 0.61 mm, which differs from that of the first embodiment. Correspondingly, the arrangement of the land portions 123A and 123B differs from that of the first embodiment. The remaining configuration of the first differential transmission line 33 is the same as that of the first embodiment. Specifically, the strip conductor width W of the strip conductors 121A and 121B is 0.30 mm, and the strip conductor gap G is 0.20 mm. The open stub conductor width Ws of the first open stub portions 124A and 124B is 0.25 mm, and the open stub conductor length LS thereof is 0.605 mm. The dielectric layer 127 and the solder resist layer 125 are also the same as those of the first embodiment. The diameter of each of the first signal via 111A and the second signal via 111B in the first layer (layer L1) is 0.1 mm. The same is true for the second differential transmission line 34, and the differential impedance of each of the first differential transmission line 33 and the second differential transmission line 34 is 50Ω.

The differential transmission line included in the printed circuit board 43 according to the third embodiment is described above. A method of manufacturing the printed circuit board 43 according to the third embodiment is the same as the method of manufacturing the printed circuit board 31 according to the first embodiment except for the above-mentioned difference in dimensions.

Figure 9A:
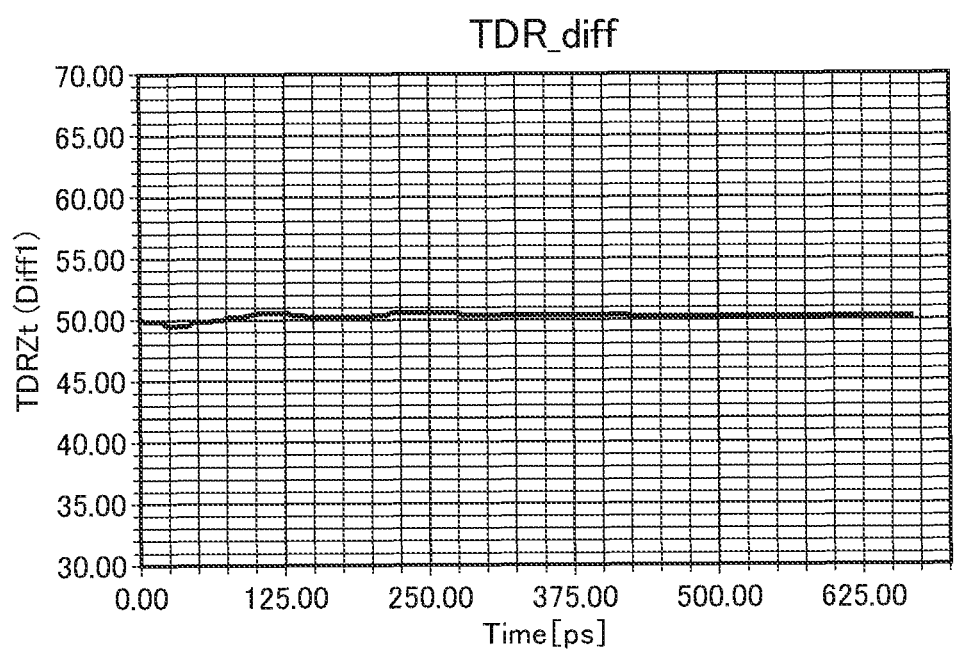
FIG. 9A is a graph for showing the characteristics of a differential transmission line included in the printed circuit board according to the third embodiment of the present invention.
Figure 9B:
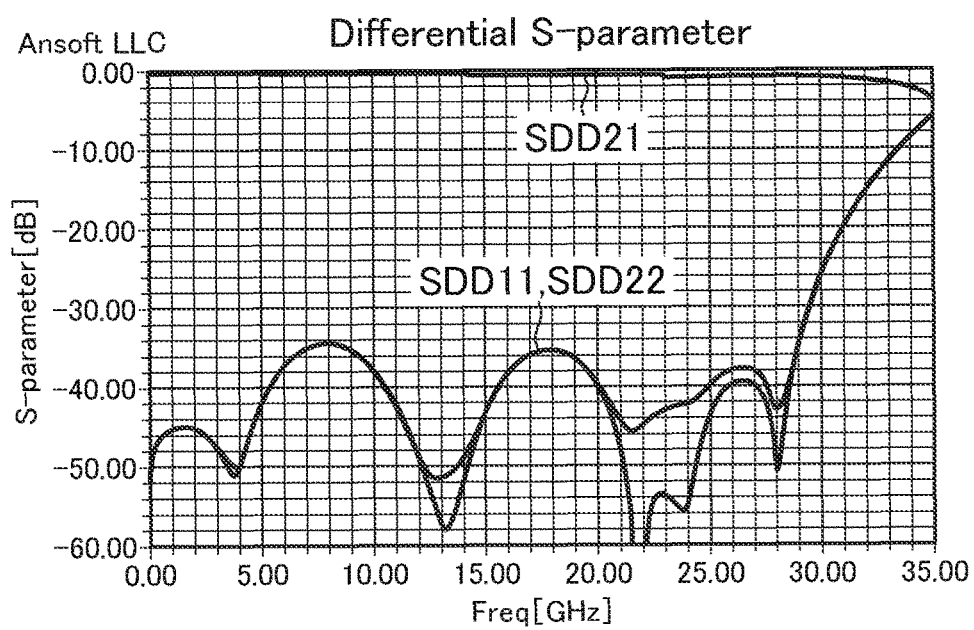
FIG. 9B is a graph for showing the characteristics of the differential transmission line included in the printed circuit board according to the third embodiment of the present invention.

FIG. 9A and FIG. 9B are graphs for showing the characteristics of the differential transmission line included in the printed circuit board 43 according to the third embodiment. FIG. 9A is a graph of an impedance profile in the differential mode that is obtained by TDR using three-dimensional electromagnetic field analysis. It is shown that, similarly to the first embodiment, while the differential impedance of each of the first differential transmission line 33 and the second differential transmission line 34 is 50Ω, the differential transmission line according to the third embodiment has, despite including the stacking-direction differential transmission line 32, almost no fluctuation in impedance due to the stacking-direction differential transmission line 32.

FIG. 9B is a graph for showing the frequency characteristics of differential reflection characteristics and differential transmission characteristics that are obtained by S-parameter analysis. In a wide frequency range of from 0 Hz to 32 GHz, the differential reflection coefficients SDD11 and SDD22 indicate values of −20 dB or less, and sufficient characteristics can be obtained. In addition, in a frequency range of from 0 Hz to 29.4 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. The printed circuit board 43 according to the third embodiment therefore provides a remarkable effect similarly to the first embodiment.

Fourth Embodiment

Figure 10A:
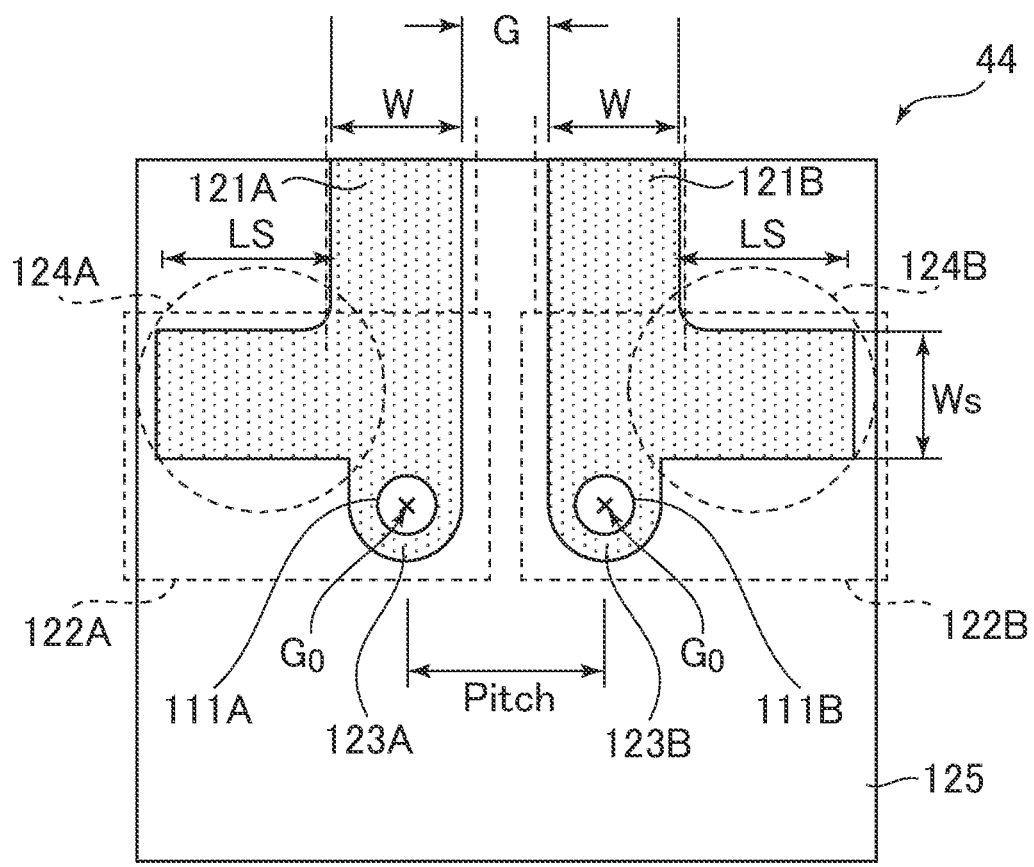
FIG. 10A is a schematic plan view for illustrating part of the structure of a printed circuit board according to a fourth embodiment of the present invention.
Figure 10B:
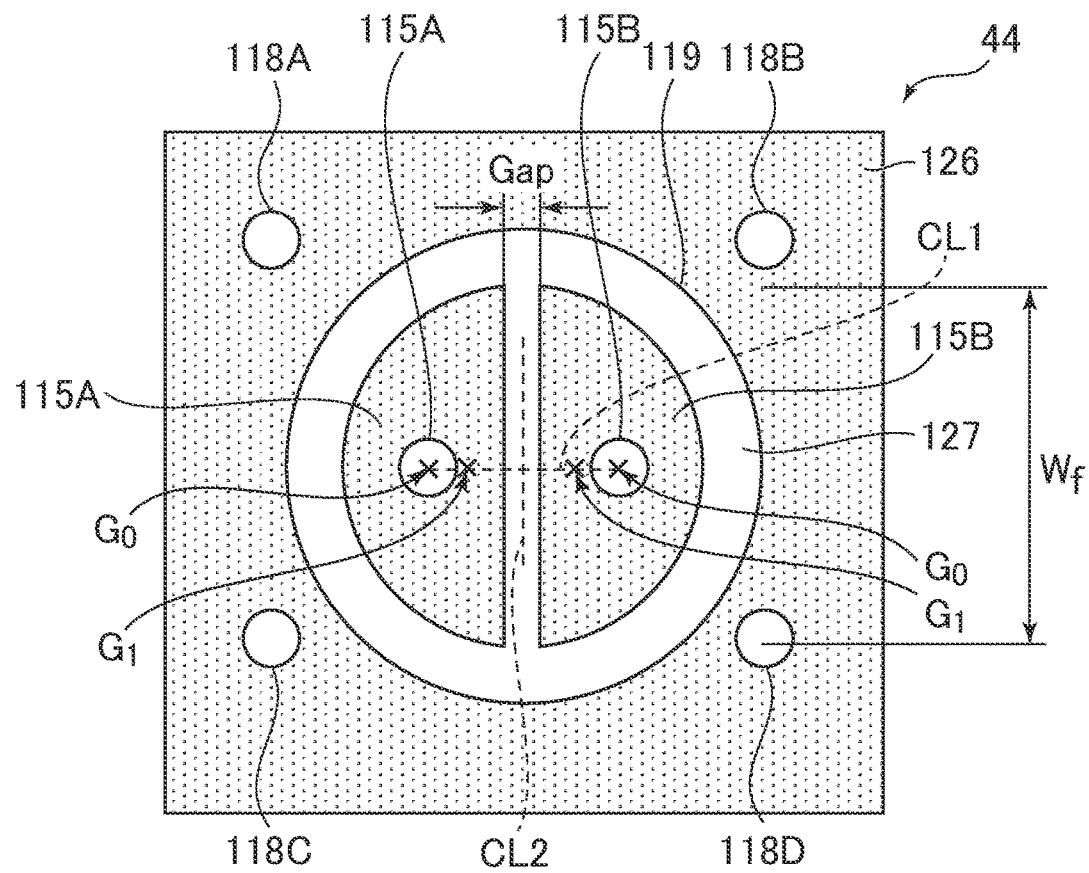
FIG. 10B is a schematic plan view for illustrating part of the structure of the printed circuit board according to the fourth embodiment of the present invention.

FIG. 10A and FIG. 10B are schematic plan views for illustrating part of the structure of a printed circuit board 44 according to a fourth embodiment of the present invention. The printed circuit board 44 according to the fourth embodiment has the same structure as that of the printed circuit board 43 according to the third embodiment except that the dimensions of a differential transmission line included in the printed circuit board 44 according to the fourth embodiment differ from those of the third embodiment. The optical module 2 according to the fourth embodiment includes the printed circuit board 44 as the printed circuit board 21. A desired differential impedance can be obtained by increasing or reducing the gap Gap illustrated in FIG. 10B. Here, it is described that connection having satisfactory characteristics is achieved with at least a differential transmission line having a differential impedance value within a range of from 40Ω to 50Ω. The differential impedance of the differential transmission line according to the fourth embodiment is 40Ω.

FIG. 10A corresponds to FIG. 8A, and is an illustration of the wiring pattern of the first layer (layer L1). FIG. 10B corresponds to FIG. 8B, and is an illustration of the wiring pattern of the second layer (layer L2). The strip conductor width W is set to 0.415 mm, and the strip conductor gap G is set to 0.20 mm so that the differential impedance of each of the first differential transmission line 33 and the second differential transmission line 34 may be 40Ω. The open stub conductor width Ws is 0.365 mm, and the open stub conductor length LS is 0.59 mm. The gap Gap is reduced to 0.12 mm. Further, with the reduced gap Gap, the degree of freedom in design of the land portions 123A and 123B of the first strip conductor pair 104 is increased and a wide region can be secured. The same is true for the land portions 133A and 133B of the second strip conductor pair 105 of the second differential transmission line 34. As a result, the vias can be formed throughout from the first layer (layer L1) to the fourth layer (layer L10) by the drill. Further, the diameter of the differential signal via pair 101 (first signal via 111A and second signal via 11B) arranged between the first layer (layer L1) and the second layer (layer L2), and the third layer (layer L9) and the fourth layer (layer L10) can be increased. Thus, the differential impedance of the stacking-direction differential transmission line 32 can be set to 40Ω.

A method of manufacturing the printed circuit board 44 according to the fourth embodiment differs from that of the first embodiment in the following points. However, except for that, the method of manufacturing the printed circuit board 44 according to the fourth embodiment is the same as the method of manufacturing the printed circuit board 31 according to the first embodiment. After the wiring layers of the second layer (layer L2) to the third layer (layer L9) are formed, only the plurality of ground vias 103 are formed. Then, after the first layer (layer L1) and the fourth layer (layer L10) are formed across the dielectric layers 127, from the first layer (layer L1) to the fourth layer (layer L10), circular holes having a diameter D of 0.2 mm are formed vertically by the drill at positions at which the differential signal via pair 101 (first signal via 111A and second signal via 111B) is formed. Copper plating is performed on the side surfaces of the holes to form via holes.

Figure 11A:
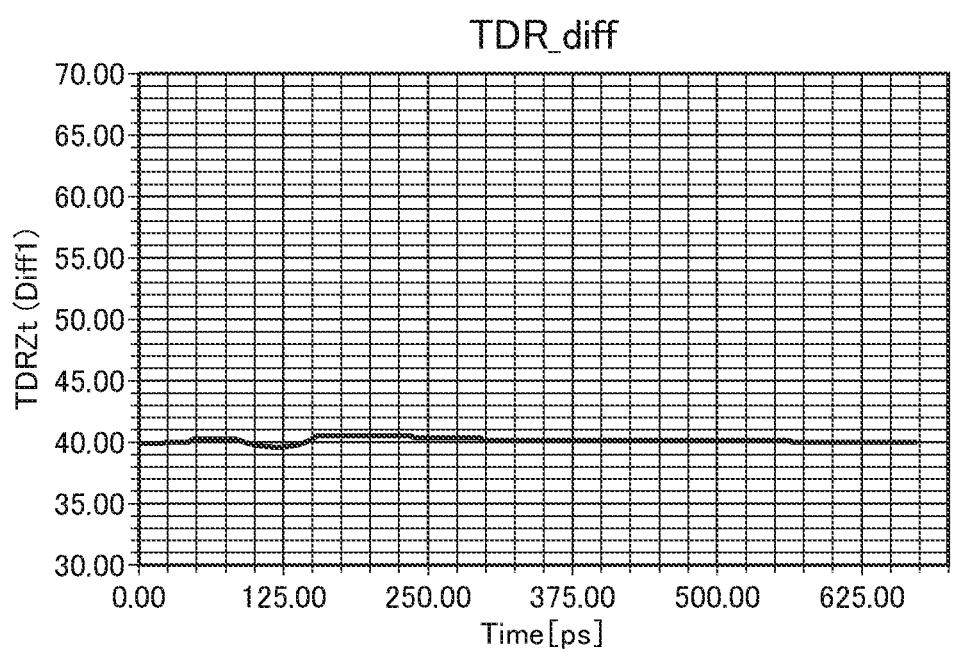
FIG. 11A is a graph for showing the characteristics of a differential transmission line included in the printed circuit board according to the fourth embodiment of the present invention.
Figure 11B:
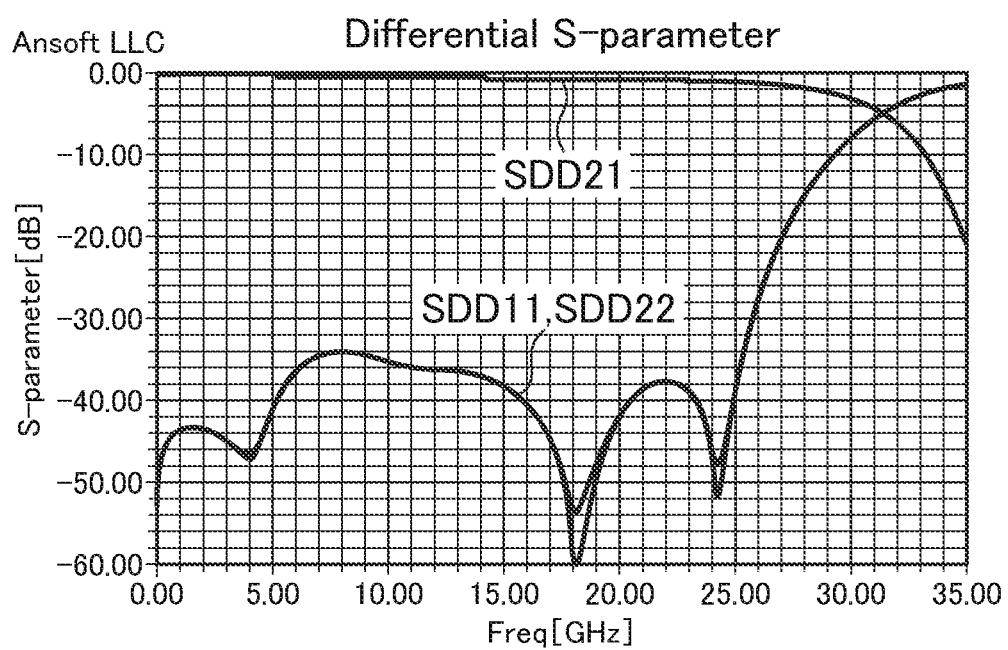
FIG. 11B is a graph for showing the characteristics of the differential transmission line included in the printed circuit board according to the fourth embodiment of the present invention.

FIG. 11A and FIG. 11B are graphs for showing the characteristics of the differential transmission line included in the printed circuit board 44 according to the fourth embodiment. FIG. 11A is a graph of an impedance profile in the differential mode that is obtained by TDR using three-dimensional electromagnetic field analysis. It is shown that, while the differential impedance of each of the first differential transmission line 33 and the second differential transmission line 34 is 40Ω, the differential transmission line according to the fourth embodiment has, despite including the stacking-direction differential transmission line 32, almost no fluctuation in impedance due to the stacking-direction differential transmission line 32.

FIG. 11B is a graph for showing the frequency characteristics of differential reflection characteristics and differential transmission characteristics that are obtained by S-parameter analysis. In a wide frequency range of from 0 Hz to 27.4 GHz, the differential reflection coefficients SDD11 and SDD22 indicate values of −20 dB or less, and sufficient characteristics can be obtained. In addition, in a frequency range of from 0 Hz to 25.8 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. As a result, in the differential transmission line according to the fourth embodiment, even the differential impedance of the stacking-direction differential transmission line 32 can be set to a value close to 40Ω.

In the printed circuit board 44 according to the fourth embodiment, the gap Gap is reduced to 0.12 mm, and hence the center of gravity $G_1$ of the first conductor plate and the center of gravity $G_1$ of the second conductor plate of each of the plurality of conductor plate pairs 102 are moved inward (toward the center of FIG. 10B) with respect to the centerline CL2, compared to the first embodiment. The mutual inductance M due to the plurality of conductor plate pairs 102 is increased. Further, the self inductance L due to the differential signal via pair 101 is reduced with the increased diameter of the differential signal via pair 101 (first signal via 111A and second signal via 111B) arranged between the first layer (layer L1) and the second layer (layer L2), and the third layer (layer L9) and the fourth layer (layer L10). It is conceivable that the differential impedance is reduced to 40Ω because the combined inductance 2L−M expressed by Expression 1 is reduced.

The printed circuit board 44 according to the fourth embodiment is preferred because of the following reason. When a differential transmission line connecting a driver output terminal of a driver circuit whose termination resistance is 20Ω and a light-emitting element to each other is included, the sufficiently satisfactory quality of an optical modulated signal can be maintained. In particular, a marked effect is provided for a case where a DFB-LD is used as the light-emitting element. In the fourth embodiment, the differential impedance value of the differential transmission line is set to 40Ω, but the present invention is not limited thereto. The impedance value of the stacking-direction differential transmission line can be changed at least within a range of from 40Ω to 50Ω by adjusting the value of the gap Gap within a range of from 0.12 mm to 0.22 mm.

Fifth Embodiment

In the first to fourth embodiments, the plurality of conductor plate pairs 102 include the six interlayer conductor plate pairs 117 (layer L3 to layer L8) in addition to the first conductor plate pair 115 arranged in the second layer (layer L2) and the second conductor plate pair 116 arranged in the third layer (layer L9). However, the number of the interlayer conductor plate pairs 117 is not limited to six, and it would be that the plurality of conductor plate pairs 102 include at least one interlayer conductor plate pair 117. A printed circuit board 45 according to a fifth embodiment of the present invention includes, in addition to the first conductor plate pair 115 and the second conductor plate pair 116, one interlayer conductor plate pair 117, and correspondingly, the shape of each of the plurality of conductor plate pairs 102 and the shape of the differential signal via pair 101 differ from those of the third embodiment. However, except for that, the printed circuit board 45 according to the fifth embodiment has the same structure as that of the printed circuit board 43 according to the third embodiment. The optical module 2 according to the fifth embodiment includes the printed circuit board 45 as the printed circuit board 21. The differential impedance of the differential transmission line according to the fifth embodiment is 50Ω.

Figure 12A:
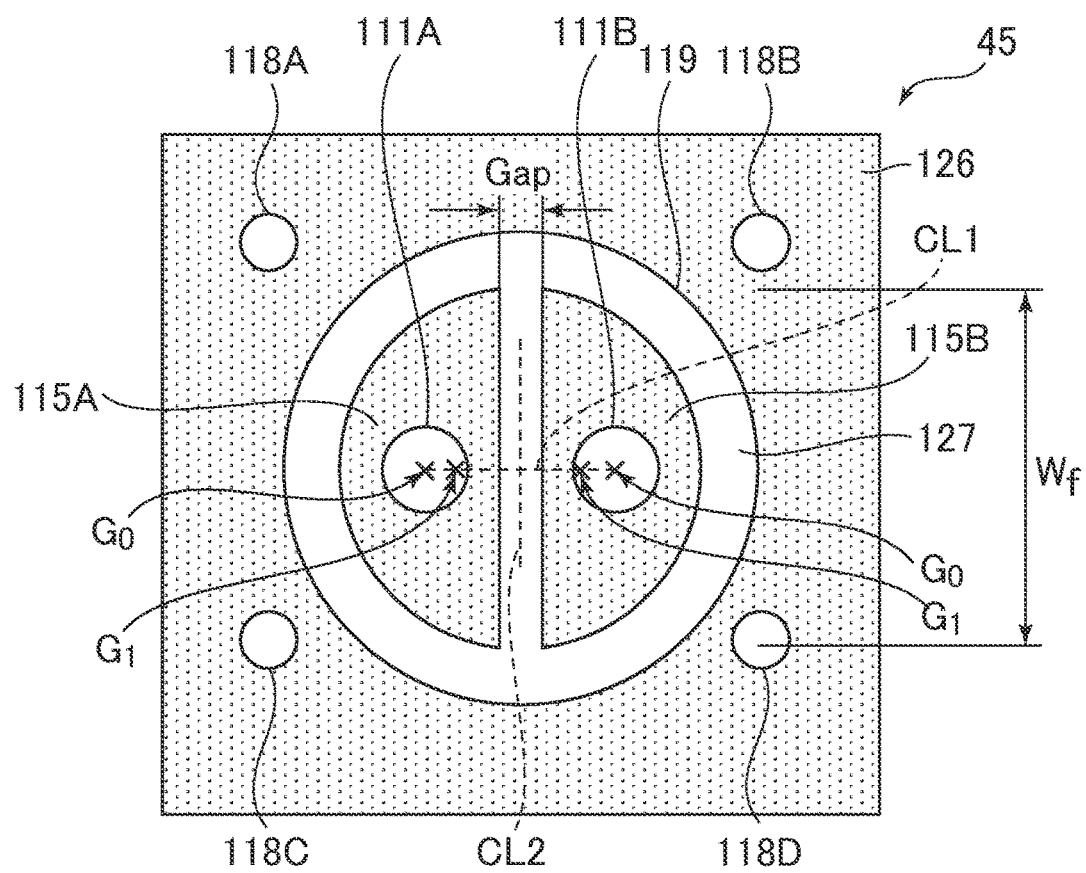
FIG. 12A is a schematic plan view for illustrating part of the structure of a printed circuit board according to a fifth embodiment of the present invention.
Figure 12B:
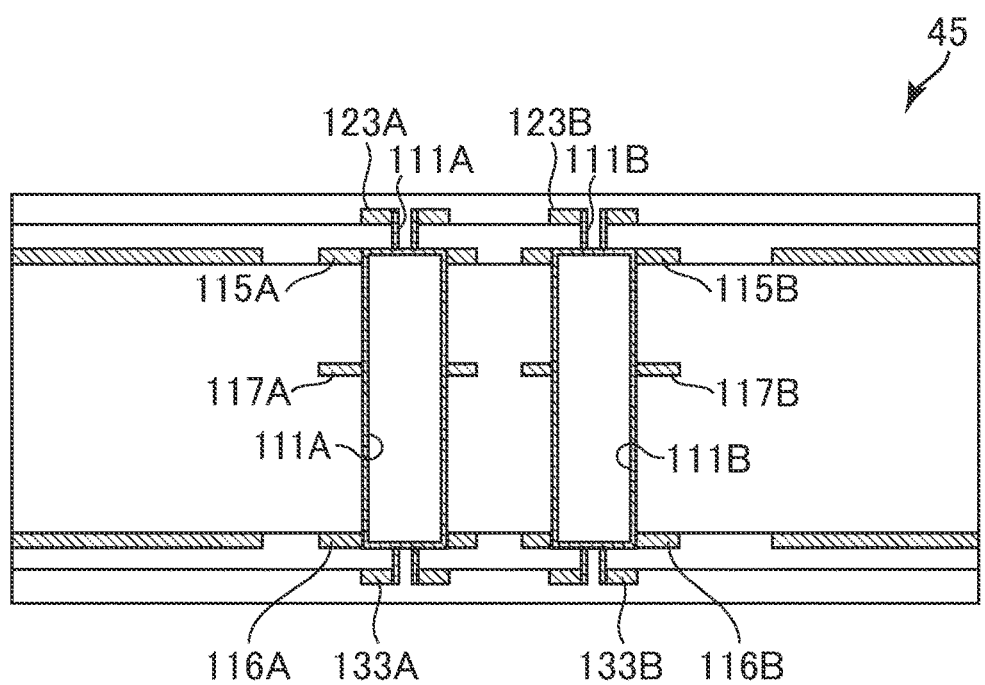
FIG. 12B is a schematic cross-sectional view for illustrating part of the structure of the printed circuit board according to the fifth embodiment of the present invention.

FIG. 12A is a schematic plan view for illustrating part of the structure of the printed circuit board 45 according to the fifth embodiment. FIG. 12B is a schematic cross-sectional view for illustrating part of the printed circuit board 45 according to the fifth embodiment. The wiring pattern of the first layer is identical to that of FIG. 8A, and thus omitted. FIG. 12A corresponds to FIG. 8B, and is an illustration of the wiring pattern of the second layer. FIG. 12B is an illustration of a cross section taken along the line VIIIC-VIIIC of FIG. 8A. FIG. 12B corresponds to FIG. 8C, and is an illustration of the cross-sectional structure.

As illustrated in FIG. 12A, similarly to the third embodiment, the contour of each of the first conductor plate 115A and the second conductor plate 115B has a shape obtained by dividing a circular shape having a diameter of 1.06 mm, but the gap Gap is set to 0.14 mm. Further, the diameter D of the first signal via 111A and the second signal via 111B from the second layer to the third layer is set to 0.30 mm. As illustrated in FIG. 12B, the plurality of conductor plate pairs 102 are the first conductor plate pair 115 (first conductor plate 115A and second conductor plate 115B) arranged in the second layer, the second conductor plate pair 116 (first conductor plate 116A and second conductor plate 116B) arranged in the third layer, and one interlayer conductor plate pair 117 (first conductor plate 117A and second conductor plate 117B) arranged between the second layer and the third layer. The differential impedance of each of the first differential transmission line 33 and the second differential transmission line 34 is 50Ω, and the shapes of the first strip conductor pair 104 and the second strip conductor pair 105 are the same as those of the third embodiment as described above.

Figure 13A:
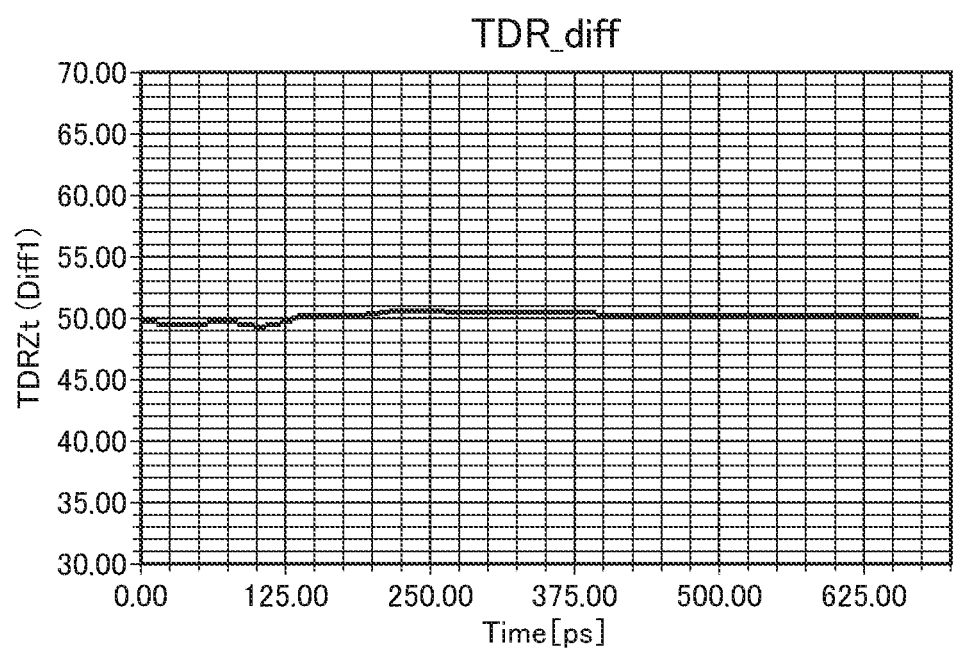
FIG. 13A is a graph for showing the characteristics of a differential transmission line included in the printed circuit board according to the fifth embodiment of the present invention.
Figure 13B:
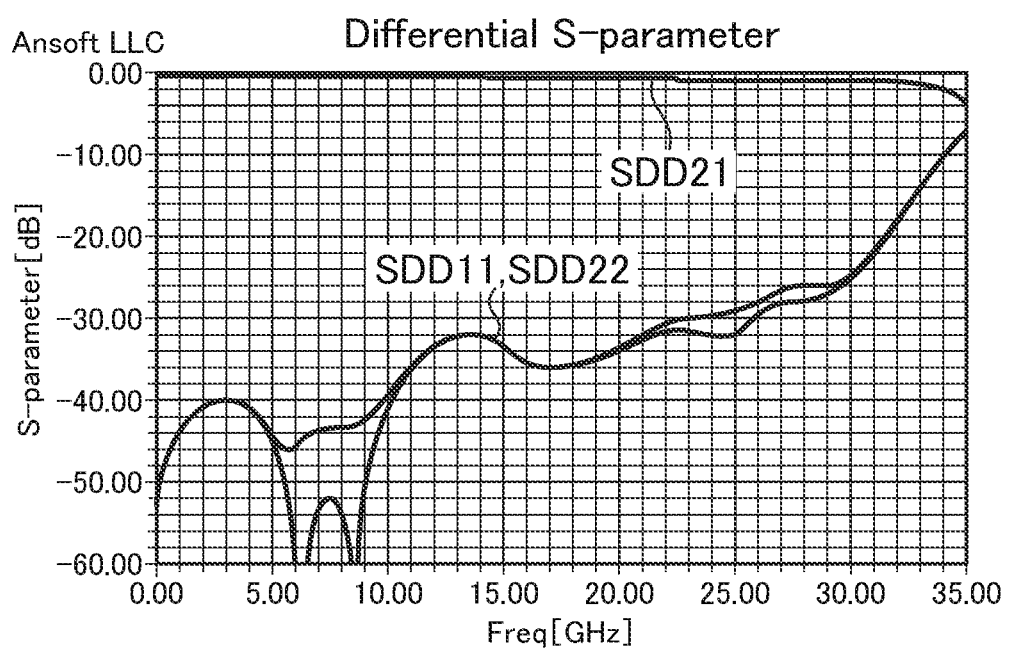
FIG. 13B is a graph for showing the characteristics of the differential transmission line included in the printed circuit board according to the fifth embodiment of the present invention.

FIG. 13A and FIG. 13B are graphs for showing the characteristics of a differential transmission line included in the printed circuit board 45 according to the fifth embodiment. FIG. 13A is a graph of an impedance profile in the differential mode that is obtained by TDR using three-dimensional electromagnetic field analysis. It is shown that, similarly to the third embodiment, while the differential impedance of each of the first differential transmission line 33 and the second differential transmission line 34 is 50Ω, the differential transmission line according to the fifth embodiment has, despite including the stacking-direction differential transmission line 32, almost no fluctuation in impedance due to the stacking-direction differential transmission line 32.

FIG. 13B is a graph for showing the frequency characteristics of differential reflection characteristics and differential transmission characteristics that are obtained by S-parameter analysis. In a wide frequency range of from 0 Hz to 31.4 GHz, the differential reflection coefficients SDD11 and SDD22 indicate values of −20 dB or less, and sufficient characteristics can be obtained. In addition, in a frequency range of from 0 Hz to 22.4 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. The printed circuit board 45 according to the fifth embodiment therefore provides a remarkable effect similarly to the third embodiment.

In the printed circuit board 45 according to the fifth embodiment, the diameter D of the first signal via 111A and the second signal via 111B from the second layer to the third layer is increased to 0.30 mm so that the self inductance L due to the differential signal via pair 101 may be reduced. Further, the gap Gap is narrowed to 0.14 mm, and hence the center of gravity $G_1$ of the first conductor plate and the center of gravity $G_1$ of the second conductor plate of each of the plurality of conductor plate pairs 102 are moved inward (toward the center of FIG. 12A) with respect to the center-line CL2, compared to the third embodiment. An amount of the mutual inductance M due to one conductor plate pair is increased. This contribution cancels increase in combined inductance out, which occurs due to reduction in number of the plurality of conductor plate pairs 102. Thus, the differential impedance can be set to 50Ω even with a small number of conductor plate pairs 102.

In the fifth embodiment, in which the number of the interlayer conductor plate pairs 117 can be one, the differential transmission line can be achieved in the printed circuit board having a multi-layer structure with five layers including the first layer to the fourth layer, and one layer in which the interlayer conductor plate pair 117 is arranged. Thus, reduction in complication, time, and cost of the production process is achieved. The number of the interlayer conductor plate pairs 117 is not limited to one or six. The number of the interlayer conductor plate pairs 117 can be changed at least within a range of from 1 to 6 by adjusting the value of the gap Gap within a range of from 0.12 mm to 0.22 mm, and the diameter D of the first signal via 111A and the second signal via 111B within a range of from 0.20 mm to 0.30 mm.

Sixth Embodiment

In the first differential transmission line 33 according to each of the first to fifth embodiments, the first ground conductor layer 126 has the first through hole 119 (opening portion), and the impedance rises in the connection portions with the stacking-direction differential transmission line 32 due to the first through hole 119. In order to suppress the impedance rise, the first strip conductor pair 104 includes the first open stub portions 124A and 124B. The same is true for the second differential transmission line 34, and the second strip conductor pair 105 includes the second open stub portions 134A and 134B. However, the technique for suppressing the impedance rise due to the first through hole 119 (second through hole 129) is not limited to an open stub (open stub circuit). A printed circuit board 46 according to a sixth embodiment of the present invention has a structure for suppressing unnecessary impedance rise with no open stub.

Figure 14A:
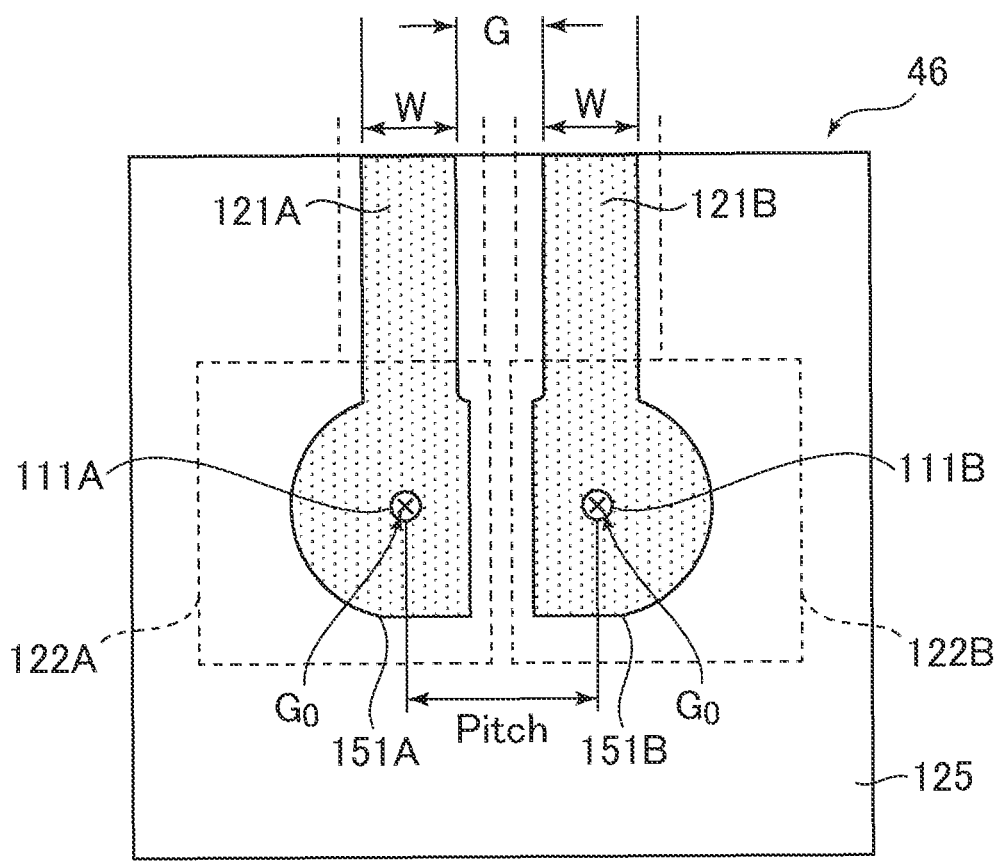
FIG. 14A is a schematic plan view for illustrating part of the structure of a printed circuit board according to a sixth embodiment of the present invention.
Figure 14B:
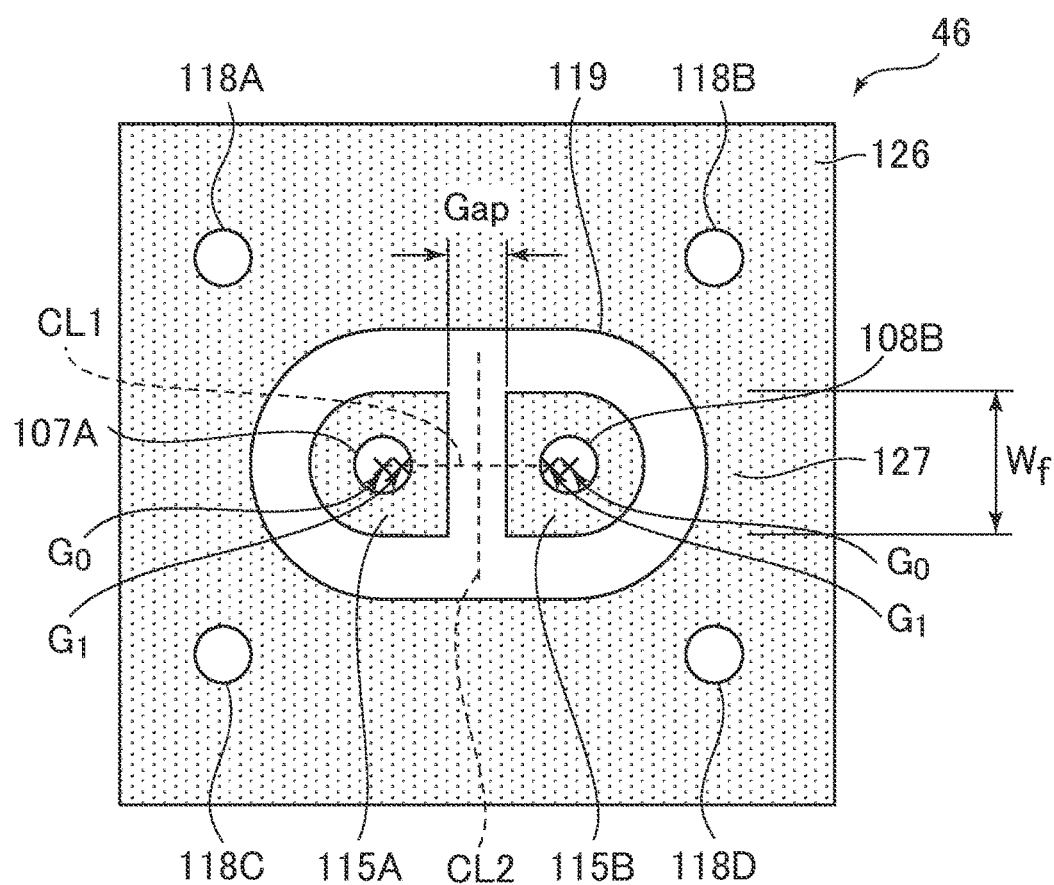
FIG. 14B is a schematic plan view for illustrating part of the structure of the printed circuit board according to the sixth embodiment of the present invention.

FIG. 14A and FIG. 14B are schematic plan views for illustrating part of the structure of the printed circuit board 46 according to the sixth embodiment. The printed circuit board 46 according to the sixth embodiment has the same structure as that of the printed circuit board 31 according to the first embodiment except that the dimensions of a differential transmission line included in the printed circuit board 46 according to the sixth embodiment differ from those of the first embodiment. The optical module 2 according to the sixth embodiment includes the printed circuit board 46 as the printed circuit board 21. The differential impedance of the differential transmission line according to the sixth embodiment is 50Ω.

The main feature of the printed circuit board 46 according to the sixth embodiment is the shapes of the connection portions 122A and 122B of the first strip conductor pair 104. In the first to fifth embodiments, the connection portions 122A and 122B include the land portions 123A and 123B, which are arranged only for electrical connection with the first signal via 111A and the second signal via 111B, respectively. In contrast to this, in the sixth embodiment, the connection portions 122A and 122B include, instead of the land portions 123A and 123B, conductor plate portions 151A and 151B, respectively. The conductor plate portions 151A and 151B establish electrical connection with the first signal via 111A and the second signal via 111B, respectively, and suppress impedance rise. The conductor plate portions 151A and 151B completely overlap the first conductor plate pair 115 (first conductor plate 115A and second conductor plate 115B) in plan view. The conductor plate portions 151A and 151B encompass the first conductor plate pair 115 in plan view. With this configuration, the first strip conductor pair 104 can suppress impedance rise without including the first open stub portions 124A and 124B. The same is true for the second strip conductor pair 105, and the connection portions 132A and 132B include, instead of the land portions 133A and 133B, conductor plate portions 152A and 152B (both not shown), respectively. The shapes of the conductor plate portions 152A and 152B are the same as those of the conductor plate portions 151A and 151B. The conductor plate portions 152A and 152B completely overlap the second conductor plate pair 116 (first conductor plate 116A and second conductor plate 116B) in plan view. The conductor plate portions 152A and 152B encompass the second conductor plate pair 116 in plan view.

FIG. 14A corresponds to FIG. 3A, and is an illustration of the wiring pattern of the first layer. FIG. 14B corresponds to FIG. 3B, and is an illustration of the wiring pattern of the second layer. Unlike the first embodiment, the center-to-center distance Pitch between the first signal via 111A and the second signal via 111B is set to 0.61 mm. Correspondingly, the shape of the first through hole 119 (and the second through hole 129) and the shape of each of the plurality of conductor plate pairs 102 differ from those of the first embodiment. The gap Gap illustrated in FIG. 14B is set to 0.14 mm.

The shape of the first conductor plate 115A and the shape of the second conductor plate 115B illustrated in FIG. 14B differ from those of the first embodiment in center-to-center distance Pitch and gap Gap. Specifically, the diameter of the semicircle of each of the first conductor plate 115A and the second conductor plate 115B is 0.45 mm, and the length $W_f$ of the straight portions of the first conductor plate 115A and the second conductor plate 115B that are opposed to each other is 0.45 mm. The contour of the first conductor plate 115A has a shape obtained by connecting a semicircle having a diameter of 0.45 mm and a rectangle having a length of 0.45 mm and a width of 0.235 mm to each other. The contour of the second conductor plate 115B has a shape that is line-symmetric to the contour of the first conductor plate 115A with respect to the centerline CL2. The diameter of the first signal via 111A and the second signal via 111B is the same as that of the first embodiment. The diameter D is 0.10 mm in the first layer (layer L1), and 0.20 mm in the second layer (layer L2).

The shape of the first through hole 119 differs from that of the first embodiment correspondingly to change of the center-to-center distance Pitch to 0.61 mm. The shape of the first through hole 119 is a shape obtained by connecting two semicircles having a diameter of 0.8 mm and a rectangle connecting the two semicircles to each other. The width of the rectangle is the center-to-center distance Pitch, and 0.61 mm here. A gap between the contour of the first through hole 119 and the contour of the first conductor plate pair 115 (conductor plates 115A and 115B) is set to 0.175 mm.

The conductor plate portions 151A and 151B illustrated in FIG. 14A have shapes corresponding to the shape of the first conductor plate pair 115 (first conductor plate 115A and second conductor plate 115B) illustrated in FIG. 14B that slightly expands outward in plan view. The shapes of the conductor plate portions 151A and 151B can be obtained by electromagnetic field analysis simulation, for example.

Here, a gap (corresponding to the gap Gap) between the straight portions of the conductor plate portions 151A and 151B that are opposed to each other is set to 0.14 mm as in the first conductor plate pair 115. That is, the opposed portions of the conductor plate portions 151A and 151B match those of the first conductor plate 115A and the second conductor plate 115B. In other words, the expression "the conductor plate portions 151A and 151B encompass the first conductor plate pair 115 in plan view" includes any case excluding a case where the first conductor plate pair 115 partly protrudes from the conductor plate portions 151A and 151B in plan view. The expression may include a case where part of the contours of the conductor plate portions 151A and 151B matches part of the contour of the first conductor plate pair 115. Further, portions other than the opposed portions have an increased width of 0.13 mm. That is, the contour of the conductor plate portion 151A has a shape obtained by connecting a semicircle having a diameter of 0.71 mm and a rectangle having a length of 0.71 mm and a width of 0.235 mm to each other. The shape of the conductor plate portion 151B is line-symmetric to the shape of the conductor plate portion 151A with respect to the centerline CL2.

Thus, in plan view, the first through hole 119 encompasses the conductor plate portions 151A and 151B (i.e., the conductor plate portions 151A and 151B do not overlap the first ground conductor layer 126), and the first conductor plate 115A and the second conductor plate 115B are included in the conductor plate portions 151A and 151B.

It is desired that the centers of gravity of the conductor plate portions 151A and 151B also be located on the inner sides of the centers of gravity of the signal vias of the differential signal via pair 101, respectively, in plan view in terms of impedance matching. The conductor plate portions 151A and 151B are arranged for suppression of impedance rise due to the first through hole 119 in the connection portions between the first differential transmission line 33 and the stacking-direction differential transmission line 32. For suppression of the impedance rise, the centers of gravity of the conductor plate portions 151A and 151B are not necessarily required to be located on the inner sides of the respective centers of gravity of the signal vias of the differential signal via pair 101 in plan view.

Figure 15A:
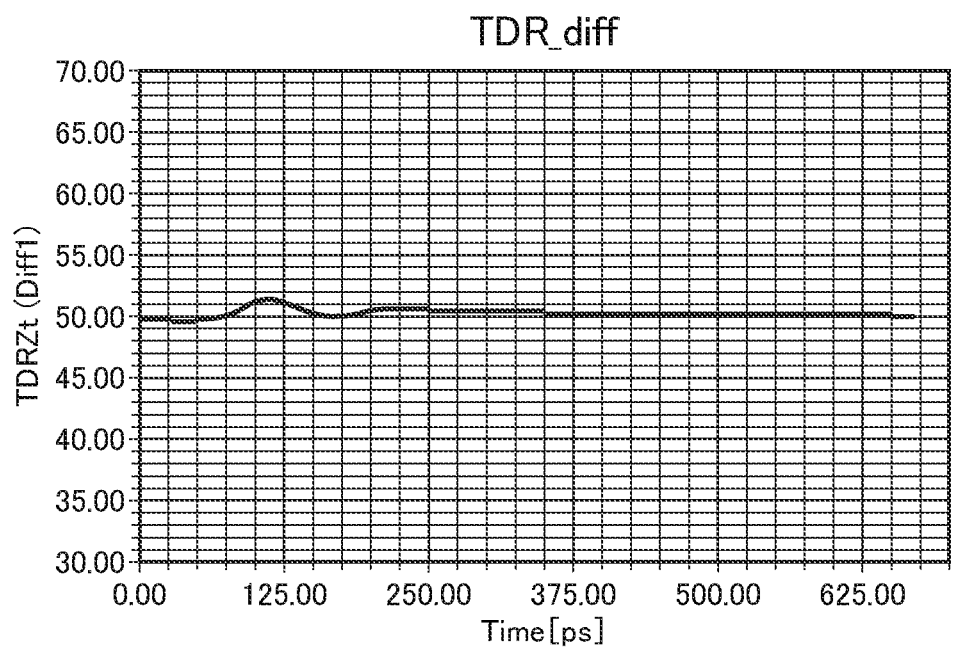
FIG. 15A is a graph for showing the characteristics of a differential transmission line included in the printed circuit board according to the sixth embodiment of the present invention.
Figure 15B:
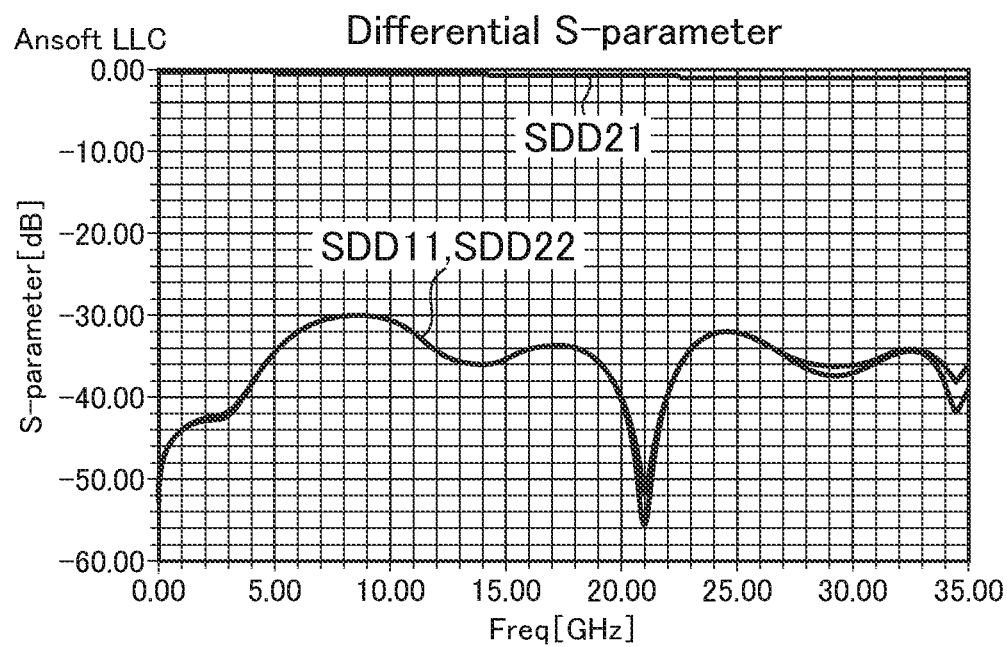
FIG. 15B is a graph for showing the characteristics of the differential transmission line included in the printed circuit board according to the sixth embodiment of the present invention.

FIG. 15A and FIG. 15B are graphs for showing the characteristics of the differential transmission line included in the printed circuit board 46 according to the sixth embodiment. FIG. 15A is a graph of an impedance profile in the differential mode that is obtained by TDR using three-dimensional electromagnetic field analysis. It is shown that, similarly to the first embodiment, while the differential impedance of each of the first differential transmission line 33 and the second differential transmission line 34 is 50Ω, fluctuations in impedance are suppressed to about +1Ω although the differential transmission line according to the sixth embodiment includes the stacking-direction differential transmission line 32, and fluctuations in impedance due to the stacking-direction differential transmission line 32 are relatively small.

FIG. 15B is a graph for showing the frequency characteristics of differential reflection characteristics and differential transmission characteristics that are obtained by S-parameter analysis. In a frequency range of from 0 Hz to 35 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. The printed circuit board 46 according to the sixth embodiment therefore provides a remarkable effect similarly to the first embodiment.

In the printed circuit board 46 according to the sixth embodiment, with no open stub, impedance rise in the connection portions between the first differential transmission line 33 (or the second differential transmission line 34) and the stacking-direction differential transmission line 32 can be suppressed. The degree of freedom in design of the first strip conductor pair 104 (or the second strip conductor pair 105) is increased, and hence higher density can be achieved.

Seventh Embodiment

In the first differential transmission line 33 according to each of the first to fifth embodiments, the extending directions of the first open stub portions 124A and 124B (second open stub portions 134A and 134B) are vertical to the extending directions of the strip conductors 121A and 121B (strip conductors 131A and 131B). However, the present invention is not limited to this. In a printed circuit board 47 according to a seventh embodiment of the present invention, the first open stub portions 124A and 124B (second open stub portions 134A and 134B) extend in directions forming an angle of 45° with the extending directions of the strip conductors 121A and 121B (strip conductors 131A and 131B).

Figure 16:
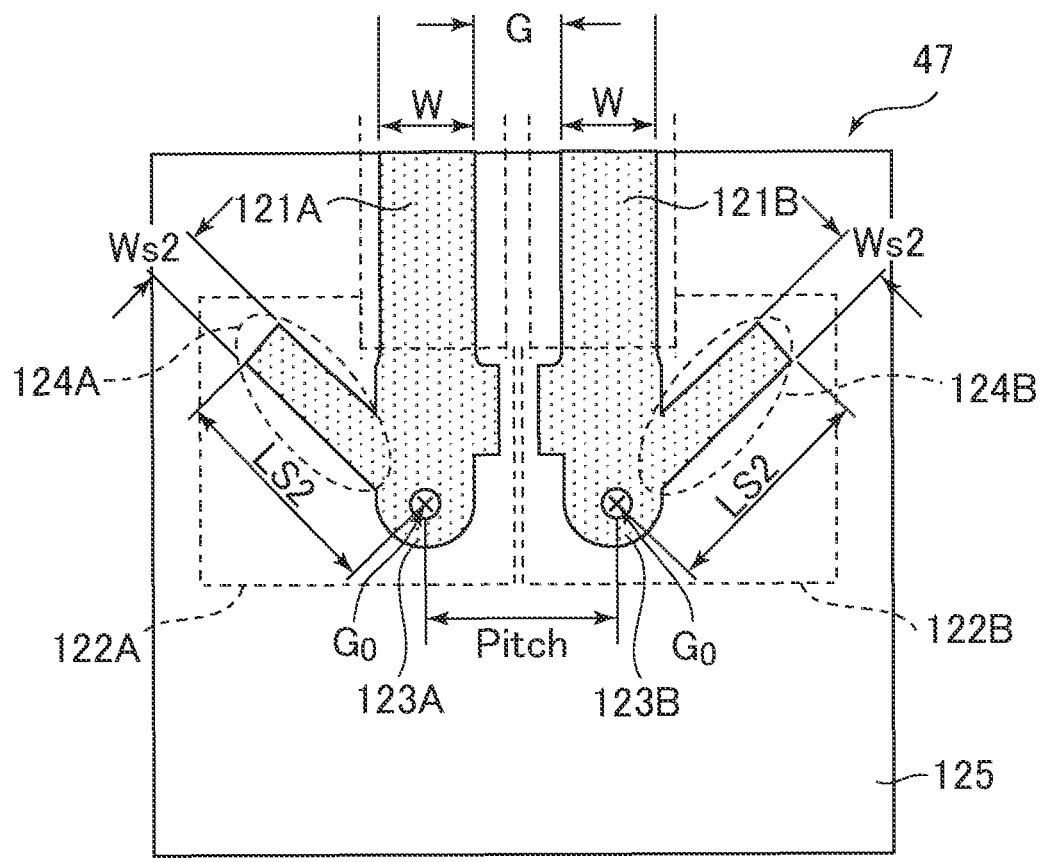
FIG. 16 is a schematic plan view for illustrating part of the structure of a printed circuit board according to a seventh embodiment of the present invention.

FIG. 16 is a schematic plan view for illustrating part of the structure of the printed circuit board 47 according to the seventh embodiment. The printed circuit board 47 according to the seventh embodiment has the same structure as the printed circuit board 31 according to the first embodiment except that the dimensions of a differential transmission line included in the printed circuit board 47 according to the seventh embodiment differ from those of the first embodiment. The optical module 2 according to the seventh embodiment includes the printed circuit board 47 as the printed circuit board 21. The differential impedance of the differential transmission line according to the seventh embodiment is 50Ω.

The main features of the printed circuit board 47 according to the seventh embodiment are the shapes of the first open stub portions 124A and 124B of the first strip conductor pair 104. The extending directions of the first open stub portions 124A and 124B form an angle of 45° with the extending directions of the strip conductors 121A and 121B, respectively. The same is true for the second strip conductor pair 105, and the extending directions of the second open stub portions 134A and 134B form an angle of 45° with the extending directions of the strip conductors 131A and 131B, respectively.

FIG. 16 corresponds to FIG. 3A, and is an illustration of the wiring pattern of the first layer. The wiring pattern of the second layer has a gap Gap of 0.10 mm, which differs from that of FIG. 14B. The remaining is identical to that of FIG. 14B, and thus omitted. Unlike the first embodiment and similarly to the sixth embodiment, the center-to-center distance Pitch is 0.61 mm, and correspondingly, the shape of the first through hole 119 (and the second through hole 129) is the same as that of the sixth embodiment. Further, in the wiring pattern of the second layer, the gap Gap is 0.10 mm. The contour of the first conductor plate 115A has a shape obtained by connecting a semicircle having a diameter of 0.45 mm and a rectangle having a length of 0.45 mm and a width of 0.255 mm to each other. The contour of the second conductor plate 115B is line-symmetric to the contour of the first conductor plate 115A with respect to the centerline CL2. The diameter of the first signal via 111A and the second signal via 111B is the same as that of the first embodiment. The diameter D is 0.10 mm in the first layer (layer L1), and 0.20 mm in the second layer (layer L2).

As illustrated in FIG. 16, the center-to-center distance Pitch differs from that of the first embodiment, and hence the arrangement of the land portions 123A and 123B differs from that of the first embodiment. Further, as described above, the extending directions of the first open stub portions 124A and 124B differ from those of the first embodiment. As illustrated in FIG. 16, an open stub conductor length LS2 of the first open stub portions 124A and 124B is defined as a distance from one end of the first open stub portion 124A or 124B to the center of the signal via of the differential signal via pair, and an open stub conductor width Ws2 is defined as a width of the extended portions of the first open stub portions 124A and 124B. The open stub conductor width Ws2 and the open stub conductor length LS2 of the first open stub portions 124A and 124B can be obtained by electromagnetic field analysis simulation, for example. Here, the open stub conductor width Ws2 is 0.15 mm, and the open stub conductor length LS2 is 0.65 mm.

Figure 17A:
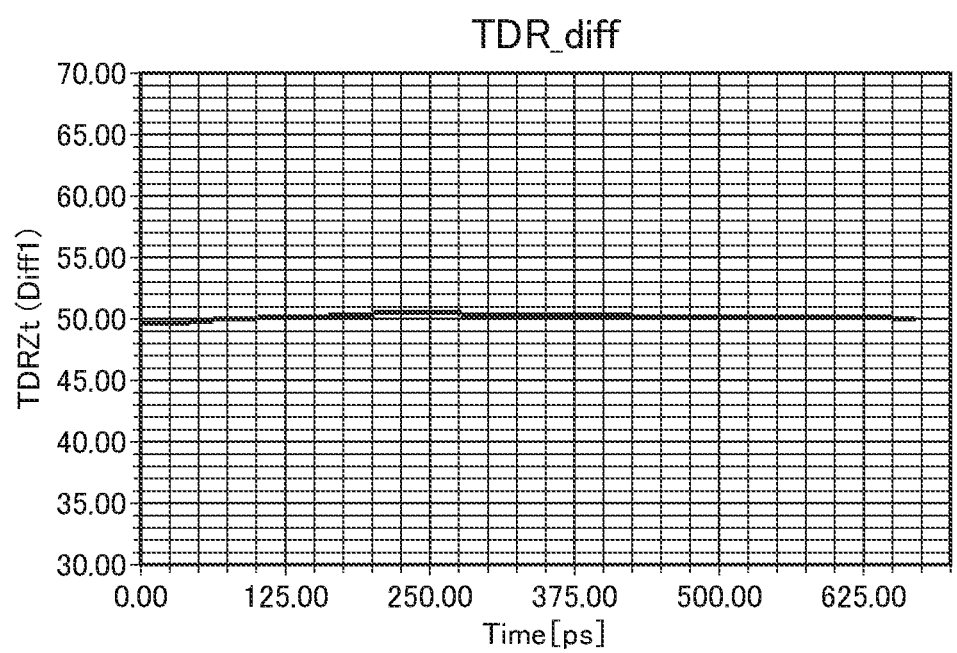
FIG. 17A is a graph for showing the characteristics of a differential transmission line included in the printed circuit board according to the seventh embodiment of the present invention.
Figure 17B:
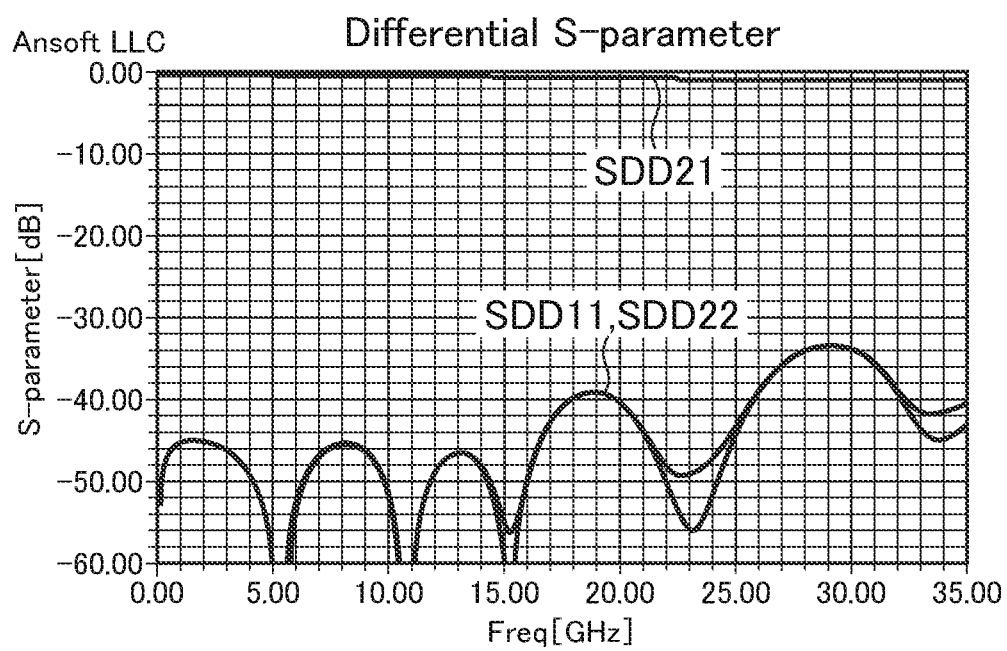
FIG. 17B is a graph for showing the characteristics of the differential transmission line included in the printed circuit board according to the seventh embodiment of the present invention.

FIG. 17A and FIG. 17B are graphs for showing the characteristics of a differential transmission line included in the printed circuit board 47 according to the seventh embodiment. FIG. 17A is a graph of an impedance profile in the differential mode that is obtained by TDR using three-dimensional electromagnetic field analysis. It is shown that, similarly to the first embodiment, while the differential impedance of each of the first differential transmission line 33 and the second differential transmission line 34 is 50Ω, the differential transmission line according to the seventh embodiment has, despite including the stacking-direction differential transmission line 32, almost no fluctuation in impedance due to the stacking-direction differential transmission line 32.

FIG. 17B is a graph for showing the frequency characteristics of differential reflection characteristics and differential transmission characteristics that are obtained by S-parameter analysis. In a frequency range of from 0 Hz to 35 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. The printed circuit board 47 according to the seventh embodiment therefore provides a remarkable effect similarly to the first embodiment.

In the printed circuit board 47 according to the seventh embodiment, the first open stub portions 124A and 124B (second open stub portions 134A and 134B) can be arranged at the positions closer to the centerlines of the strip conductors 121A and 121B (strip conductors 131A and 131B), respectively. Thus, the degree of freedom in design of the first strip conductor pair 104 (or the second strip conductor pair 105) is increased, and higher density can be achieved. In the seventh embodiment, the extending directions of the first open stub portions 124A and 124B (second open stub portions 134A and 134B) and the extending directions of the strip conductors 121A and 121B (strip conductors 131A and 131B) form the angle of 45°, but needless to say, the extending directions may form other angles.

Eighth Embodiment

In the stacking-direction differential transmission line 32 according to each of the first to seventh embodiments, the opposed portions of the contour of the first conductor plate and the contour of the second conductor plate of each of the plurality of conductor plate pairs 102 linearly extend along the centerline CL2. The contour of the first conductor plate and the contour of the second conductor plate are formed by sequentially patterning the wiring layers. The shape (contour) of the opposed portions may be formed by means of, for example, drilling or routing other than patterning. In a printed circuit board 48 according to an eighth embodiment of the present invention, in each of the plurality of conductor plate pairs 102, the portions of the first conductor plate and the second conductor plate that are opposed to each other are formed by drilling.

Figure 18:
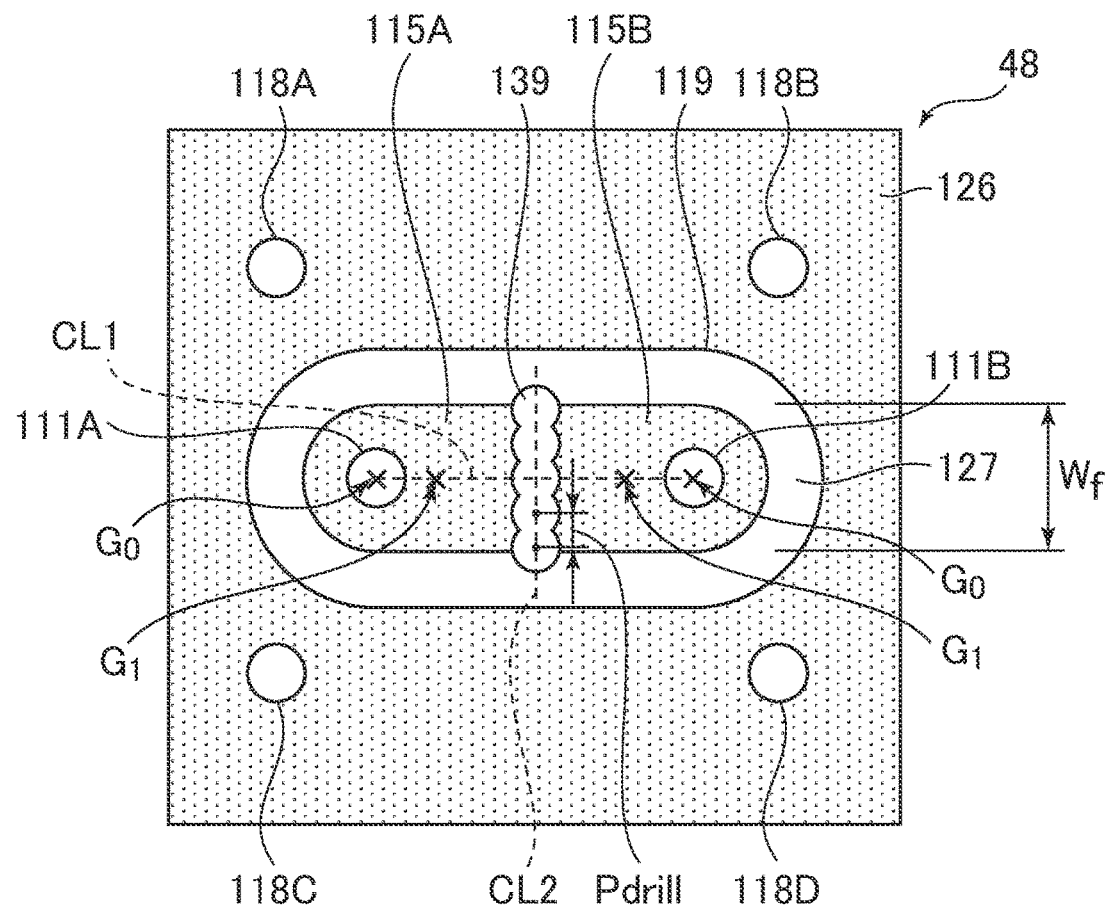
FIG. 18 is a schematic plan view for illustrating part of the structure of a printed circuit board according to an eighth embodiment of the present invention.

FIG. 18 is a schematic plan view for illustrating part of the structure of the printed circuit board 48 according to the eighth embodiment. The printed circuit board 48 according to the eighth embodiment has the same structure as that of the printed circuit board 31 according to the first embodiment except that the shapes of the plurality of conductor plate pairs 102 included in the printed circuit board 48 according to the eighth embodiment differ from those of the first embodiment. The optical module 2 according to the eighth embodiment includes the printed circuit board 48 as the printed circuit board 21. The differential impedance of the differential transmission line according to the eighth embodiment is 50Ω.

The main features of the printed circuit board 48 according to the eighth embodiment are the shapes of the first conductor plate and the second conductor plate of each of the plurality of conductor plate pairs 102. The wiring pattern of the first layer is identical to that of FIG. 3A, and thus omitted. That is, the shape of the first strip conductor pair 104 according to the eighth embodiment is the same as that of the first strip conductor pair 104 according to the first embodiment. The center-to-center distance Pitch between the first signal via 111A and the second signal via 111B is 1.0 mm.

FIG. 18 corresponds to FIG. 3B, and is an illustration of the wiring pattern of the second layer. The shape of the first through hole 119 is the same as the shape of the first through hole 119 illustrated in FIG. 3B. The contours of the first conductor plate 115A and the second conductor plate 115B differ from those of FIG. 3B. The contour of each of the first conductor plate 115A and the second conductor plate 115B has a shape obtained by dividing, by a plurality of drill holes with the centerline CL2 being a centerline, a shape obtained by connecting two semicircles and a rectangle connecting the two semicircles to each other. The two semicircles expand outward (both sides of the centerline CL1) with the center of the first signal via 111A and the center of the second signal via 111B being respective centers, and have a diameter of 0.45 mm. One drill hole is a hole formed by a drill having a diameter of 0.15 mm, and the plurality of drill holes are sequentially formed in a line with a drill gap Pdrill (drill center-to-center distance). Here, the drill gap Pdrill is 0.10 mm. The resin 139 is encapsulated in the plurality of drill holes.

The first conductor plate 115A and the second conductor plate 115B are opposed to each other across the centerline CL2. Thus, the opposed portions of the contour of the first conductor plate and the contour of the second conductor plate extend along the centerline CL2. The length $W_f$ of the portions of the first conductor plate 115A and the second conductor plate 115B that are opposed to each other is 0.45 mm. The serrated (jagged) opposed portions, which are formed by the plurality of drill holes, extend along the centerline CL2. Further, although the opposed portions do not extend technically linearly, the average value of gaps between the opposed portions (corresponding to the gap Gap of the first embodiment) is close to 0.15 mm, and hence the opposed portions can be regarded as extending approximately linearly.

A method of manufacturing the printed circuit board 48 according to the eighth embodiment differs from that of the first embodiment in the following points. However, except for that, the method of manufacturing the printed circuit board 48 according to the eighth embodiment is the same as the method of manufacturing the printed circuit board 31 according to the first embodiment. In a stage where the wiring layers from the second layer (layer L2) to the third layer (layer L9) are formed, the shape of the wiring layer for each of the plurality of conductor plate pairs 102 is a shape obtained by connecting two semicircles and a rectangle connecting the two semicircles to each other. Then, after vias for the differential signal via pair 101 and the plurality of ground vias 103 are formed, a plurality of drill holes are formed by the drill having a diameter of 0.15 mm with a drill gap Pdrill of 0.10 mm in the wiring layers for the plurality of conductor plate pairs 102 along the centerline CL2. Then, the resin 139 is encapsulated in the plurality of drill holes as well as the vias for the differential signal via pair 101 and the plurality of ground vias 103.

Figure 19A:
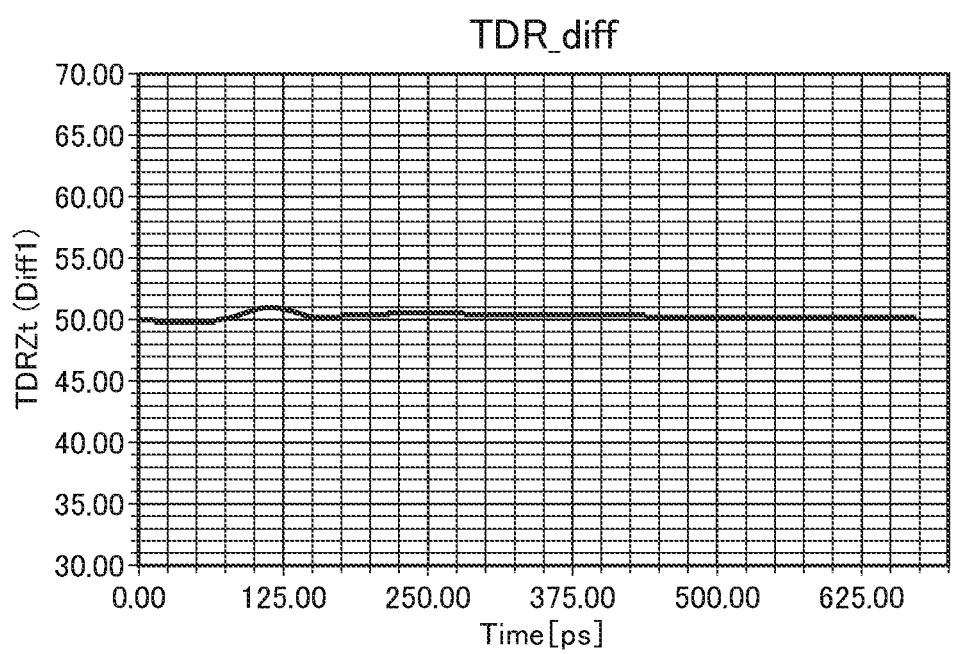
FIG. 19A is a graph for showing the characteristics of a differential transmission line included in the printed circuit board according to the eighth embodiment of the present invention.
Figure 19B:
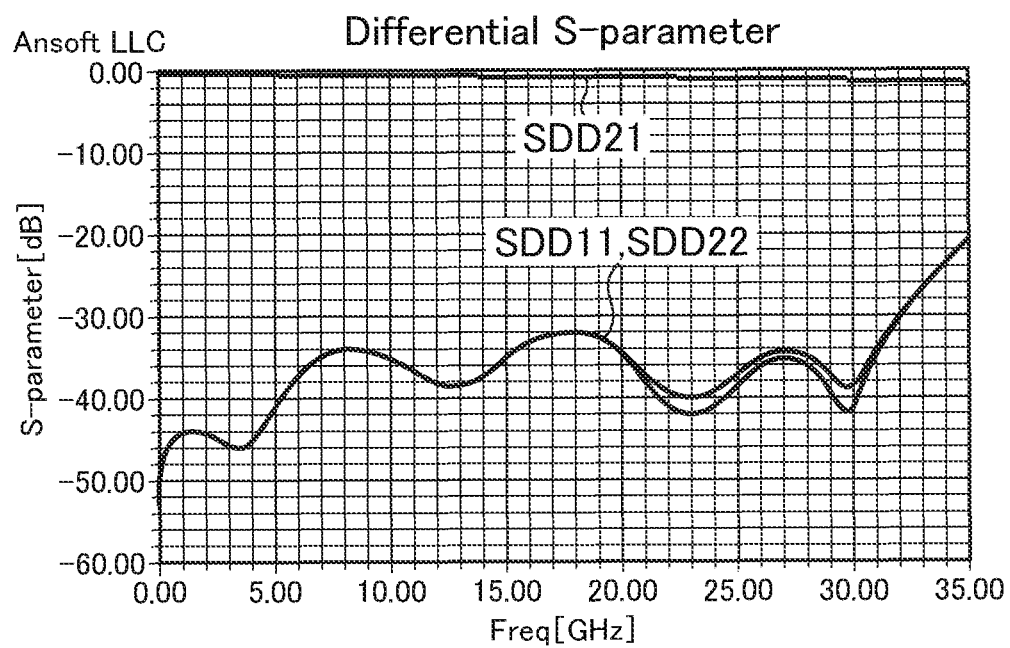
FIG. 19B is a graph for showing the characteristics of the differential transmission line included in the printed circuit board according to the eighth embodiment of the present invention.

FIG. 19A and FIG. 19B are graphs for showing the characteristics of a differential transmission line included in the printed circuit board 48 according to the eighth embodiment. FIG. 19A is a graph of an impedance profile in the differential mode that is obtained by TDR using three-dimensional electromagnetic field analysis. It is shown that, similarly to the first embodiment, while the differential impedance of each of the first differential transmission line 33 and the second differential transmission line 34 is 50Ω, fluctuations in impedance are suppressed to about +1Ω although the differential transmission line according to the eighth embodiment includes the stacking-direction differential transmission line 32, and fluctuations in impedance due to the stacking-direction differential transmission line 32 are relatively small.

FIG. 19B is a graph for showing the frequency characteristics of differential reflection characteristics and differential transmission characteristics that are obtained by S-parameter analysis. In a wide frequency range of from 0 Hz to 35 GHz, the differential reflection coefficients SDD11 and SDD22 indicate values of −20 dB or less, and sufficient characteristics can be obtained. In addition, in a frequency range of from 0 Hz to 32 GHz, the differential reflection coefficients SDD11 and SDD22 are maintained at values of −30 dB or less, and it is shown that a structure having a very low reflection amount is achieved. Further, it is also shown that change in differential transmission characteristic SDD21 is small. The printed circuit board 48 according to the eighth embodiment therefore provides a remarkable effect similarly to the first embodiment.

The opposed portions of the first conductor plate and the second conductor plate of each of the plurality of conductor plate pairs 102 are formed by drilling, and hence positional deviation of the opposed portions can be suppressed from the second layer (layer L2) to the third layer (layer L9) in plan view. Even when the patterns are deviated in the board plane direction in a board manufacturing process, degradation of characteristics due to the stacking-direction differential transmission line 32 can be suppressed. Needless to say, the opposed portions may be formed by routing.

In the printed circuit board 48 according to the eighth embodiment, the plurality of holes are formed by the drill having a diameter of 0.15 mm with the drill gap Pdrill of 0.10 mm, but the present invention is not limited thereto. For example, the differential impedance of the stacking-direction differential transmission line 32 can be adjusted within a range of from 47Ω to 53Ω by adjusting the drill gap Pdrill within a range of from 0.125 mm to 0.075 mm.

The printed circuit boards and the optical modules according to the embodiments of the present invention are described above. However, the present invention is not limited to the above-mentioned embodiments, and widely applicable to differential transmission line structures including a stacking-direction differential transmission line. The printed circuit board according to the present invention is not limited to a printed circuit board included in an optical module, and may be a printed circuit board included in a transmission device (the printed circuit board 11 illustrated in FIG. 1) or a printed circuit board included in other devices. Regardless of which type of devices a printed circuit board is included, the present invention is widely applicable to a differential transmission line including a differential transmission line (stacking-direction differential transmission line) passing through the board in a stacking direction.

Further, the printed circuit boards according to the embodiments of the present invention are suitable for a case where the bit rate of a digital electric signal that is transmitted through each of channels is any one of 25 Gbit/s to 28 Gbit/s, but the bit rate is not limited thereto. A digital electric signal whose bit rate is within a range different from the above-mentioned range may be transmitted. An electric signal that is transmitted through the channel (differential transmission line) of the printed circuit boards according to the embodiments of the present invention is a binary modulated digital signal, but the present invention is not limited thereto. A multi-level modulated digital signal may be transmitted. In this case, a bit rate may be replaced with a symbol rate (or a modulation rate), and a unit "bit/s" may be replaced with a unit "baud".

Further, in the printed circuit boards according to the embodiments of the present invention, the first differential transmission line 33 and the second differential transmission line 34 have the same configuration. This is desired in terms of reduction in design parameter, which facilitates designing, or improvement in characteristics of a differential transmission line, but the present invention is not limited thereto. The first differential transmission line 33 and the second differential transmission line 34 may have different configurations as long as the first differential transmission line 33 and the second differential transmission line 34 are micro strip lines and connectable to a stacking-direction differential transmission line.

In the printed circuit boards according to the embodiments of the present invention, in which the first differential transmission line 33 is arranged on the upper surface and the second differential transmission line 34 is arranged on the lower surface, the solder resist layer 125 is arranged so as to only cover the first strip conductor pair 104 and the second strip conductor pair 105. However, the present invention is not limited to this, and a layer (including a wiring layer) may further be arranged on the upper side of the first differential transmission line 33 or the lower side of the second differential transmission line 34.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A printed circuit board, comprising a stacking-direction differential transmission line extending in a stacking direction,
   the stacking-direction differential transmission line comprising:
      a differential signal via pair comprising a first signal via and a second signal via both extending in the stacking direction; and
      a plurality of conductor plate pairs each comprising a first conductor plate expanding outward from a rim of the first signal via in a board plane direction, and a second conductor plate expanding outward from a rim of the second signal via in the board plane direction, the second conductor plate being located in the same layer as the first conductor plate and separated from the first conductor plate,
   wherein the plurality of conductor plate pairs are arranged along the stacking direction and separated from each other,
   wherein with respect to a perpendicular bisector of a center-of-gravity line segment connecting a center of gravity of the first signal via and a center of gravity of the second signal via, in each of the plurality of conductor plate pairs, a center of gravity of a contour of the first conductor plate is located on an inner side of the center of gravity of the first signal via, and a center of gravity of a contour of the second conductor plate is located on an inner side of the center of gravity of the second signal via.

2. The printed circuit board according to claim 1, wherein in each of the plurality of conductor plate pairs, a width of the contour of the first conductor plate with respect to the center-of-gravity line segment is kept constant or increased along the center-of-gravity line segment from an outer side to an inner side, and a width of the contour of the second conductor plate with respect to the center-of-gravity line segment is kept constant or increased along the center-of-gravity line segment from an outer side to an inner side.

3. The printed circuit board according to claim 1, wherein in each of the plurality of conductor plate pairs, the first conductor plate and the second conductor plate are opposed to each other across the perpendicular bisector, and an opposed portion of the contour of the first conductor plate and an opposed portion of the contour of the second conductor plate extend along the perpendicular bisector.

4. The printed circuit board according to claim 1, wherein in each of the plurality of conductor plate pairs, the contour of the first conductor plate and the contour of the second conductor plate are line-symmetric with respect to the center-of-gravity line segment.

5. The printed circuit board according to claim 1, wherein in each of the plurality of conductor plate pairs, the contour of the first conductor plate and the contour of the second conductor plate are line-symmetric to each other with respect to the perpendicular bisector.

6. The printed circuit board according to claim 1, further comprising:
   a first differential transmission line, which is arranged on an upper surface side of the printed circuit board, and is electrically connected to the stacking-direction differential transmission line; and a second differential transmission line, which is arranged on a lower surface side of the printed circuit board, and is electrically connected to the stacking-direction differential transmission line, wherein the first differential transmission line comprises:
- a first strip conductor pair, which is arranged in a first layer, and is in contact with and connected to the differential signal via pair; and
- a first ground conductor layer, which is arranged in a second layer that is located under the first layer in the stacking direction, and has a first through hole surrounding the differential signal via pair, wherein the second differential transmission line comprises:
- a second ground conductor layer, which is arranged in a third layer that is located under the second layer in the stacking direction, and has a second through hole surrounding the differential signal via pair; and
- a second strip conductor pair, which is arranged in a fourth layer that is located under the third layer in the stacking direction, and is in contact with and connected to the differential signal via pair, wherein the plurality of conductor plate pairs comprise a first conductor plate pair and a second conductor plate pair, wherein the first conductor plate pair is arranged in the second layer and on an inner side of the first through hole, while being separated from the first ground conductor layer, and wherein the second conductor plate pair is arranged in the third layer and on an inner side of the second through hole, while being separated from the first ground conductor layer.

7. The printed circuit board according to claim 6, wherein the plurality of conductor plate pairs further comprise one or more interlayer conductor plate pairs arranged between the second layer and the third layer.

8. The printed circuit board according to claim 6, wherein each conductor of the first strip conductor pair includes an open stub portion.

9. The printed circuit board according to claim 6, wherein the first strip conductor pair encompasses the first conductor plate pair in plan view.

10. The printed circuit board according to claim 6, further comprising a plurality of ground vias, which are arranged so as to surround the differential signal via pair, and are electrically connected to the first ground conductor layer and the second ground conductor layer.

11. An optical module, comprising:
- the printed circuit board according to claim 6;
- a driver IC, which is arranged on an upper surface of the printed circuit board, and includes a driver differential terminal; and
- a light-emitting element, which is electrically connected to a differential terminal arranged on a lower surface of the printed circuit board, and is configured to convert an electric signal into an optical signal, wherein the first differential transmission line is electrically connected to the driver differential terminal of the driver IC, and wherein the second differential transmission line is electrically connected to the differential terminal.

12. The optical module according to claim 11, wherein the light-emitting element comprises a directly-modulated semiconductor laser.

* * * * *